(12) United States Patent
Arizumi et al.

(10) Patent No.: US 10,305,020 B2
(45) Date of Patent: May 28, 2019

(54) ELEMENT AND ELECTRIC GENERATOR

(71) Applicants: Yuko Arizumi, Kanagawa (JP);
Tsuneaki Kondoh, Kanagawa (JP);
Mizuki Otagiri, Kanagawa (JP);
Takahiro Imai, Tokyo (JP); Tomoaki Sugawara, Kanagawa (JP); Junichiro Natori, Kanagawa (JP)

(72) Inventors: Yuko Arizumi, Kanagawa (JP);
Tsuneaki Kondoh, Kanagawa (JP);
Mizuki Otagiri, Kanagawa (JP);
Takahiro Imai, Tokyo (JP); Tomoaki Sugawara, Kanagawa (JP); Junichiro Natori, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 316 days.

(21) Appl. No.: 15/148,273

(22) Filed: May 6, 2016

(65) Prior Publication Data
US 2016/0336505 A1 Nov. 17, 2016

(30) Foreign Application Priority Data

May 15, 2015 (JP) .................................. 2015-100345
Jan. 15, 2016 (JP) .................................. 2016-006570

(51) Int. Cl.
*H01L 41/113* (2006.01)
*H02N 2/18* (2006.01)
(Continued)

(52) U.S. Cl.
CPC ........ *H01L 41/113* (2013.01); *H01L 41/1138* (2013.01); *H01L 41/18* (2013.01);
(Continued)

(58) Field of Classification Search
CPC ............... H01L 41/113; H01L 41/1132; H01L 41/1134; H01L 41/1136; H01L 41/1138; H02N 2/18
(Continued)

(56) References Cited

U.S. PATENT DOCUMENTS

| 4,250,415 A * | 2/1981 | Lewiner .................. H02N 1/08 307/400 |
| 6,433,465 B1 * | 8/2002 | McKnight ............ A43B 3/0005 310/319 |

(Continued)

FOREIGN PATENT DOCUMENTS

| FR | 2 397 120 A1 | 2/1979 |
| JP | 2000-073656 | 3/2000 |

(Continued)

OTHER PUBLICATIONS

Extended European Search Report dated Sep. 30, 2016 in European Patent Application No. 16168996.3.
(Continued)

*Primary Examiner* — Derek J Rosenau
(74) *Attorney, Agent, or Firm* — Oblon, McClelland, Maier & Neustadt, L.L.P.

(57) ABSTRACT

An element including: electrodes; and intermediate layers, each being sandwiched between any pair of the electrodes, wherein the intermediate layers comprise at least two selected from the group consisting of: intermediate layer that can be elongated and deformed in direction that is not parallel to direction in which external force is applied, when the external force is applied to the intermediate layer; intermediate layer that can be compressed and deformed in direction that is parallel to direction in which external force is applied, when the external force is applied to the intermediate layer; and intermediate layer that can be elongated and deformed in direction that is not parallel to direction in (Continued)

which external force is applied, and can be compressed and deformed in direction that is parallel to the direction in which the external force is applied, when the external force is applied to the intermediate layer.

11 Claims, 33 Drawing Sheets

(51) Int. Cl.
  *H01L 41/18* (2006.01)
  *H02N 1/04* (2006.01)
  *H02N 1/08* (2006.01)
(52) U.S. Cl.
  CPC .............. *H02N 1/04* (2013.01); *H02N 1/08* (2013.01); *H02N 2/18* (2013.01)
(58) Field of Classification Search
  USPC ........................................................ 310/339
  See application file for complete search history.

(56) References Cited

U.S. PATENT DOCUMENTS

| 2007/0116858 A1 | 5/2007 | Benslimane et al. |
| 2015/0248083 A1 | 9/2015 | Kondoh et al. |
| 2015/0252821 A1 | 9/2015 | Sugawara et al. |

FOREIGN PATENT DOCUMENTS

| JP | 2008-053527 | 3/2008 |
| JP | 5563746 | 6/2014 |
| JP | 2014-239647 | 12/2014 |
| WO | WO 2014/105970 A1 | 7/2014 |

OTHER PUBLICATIONS

European Search Report dated Dec. 12, 2018, in European Patent Application No. 16 168 996.3, filed May 10, 2016.

* cited by examiner

External force

External force

External force

ELEMENT AND ELECTRIC GENERATOR

CROSS-REFERENCE TO RELATED APPLICATIONS

The present application claims priority under 35 U.S.C. § 119 to Japanese Patent Application No. 2015-100345, filed May 15, 2015, and Japanese Patent Application No. 2016-006570, filed Jan. 15, 2016. The contents of which are incorporated herein by reference in their entirety.

BACKGROUND OF THE INVENTION

Field of the Invention

The present disclosure relates to elements and electric generators.

Description of the Related Art

Hitherto, there have been attempts for effectively utilizing the energy generated by vibrations of structures such as roads, bridges, and architectures, vibrations of moving bodies such as cars and train carriages, and vibrations clue to human activities. Examples of a method for effectively utilizing the energy generated by vibrations include a method where vibration energy is converted into electric energy. Examples of such a method include a system utilizing a piezoelectric element, and a system utilizing electrostatic induction.

One example disclosed as the system utilizing electrostatic induction is a generator, in which electrodes are disposed to face an electret dielectric, a plurality of spaces are disposed to maintain an appropriate distance between the electret dielectric and each electrode, and both the electret dielectric and the electrode have flexibility (for example, see Japanese Unexamined Patent Application Publication No. 2014-239647).

SUMMARY OF THE INVENTION

An element of the present invention includes a plurality of electrodes, and a plurality of intermediate layers, each of the plurality of intermediate layers being sandwiched between any pair of the plurality of electrodes. The plurality of the intermediate layers include at least two selected from the group consisting of: an intermediate layer that can be elongated and deformed in a direction that is not parallel to a direction in which an external force is applied, when the external force is applied to the intermediate layer; an intermediate layer that can be compressed and deformed in a direction that is parallel to a direction in which an external force is applied, when the external force is applied to the intermediate layer; and an intermediate layer that can be elongated and deformed in a direction that is not parallel to a direction in which an external force is applied, and can be compressed and deformed in a direction that is parallel to the direction in which the external force is applied, when the external force is applied to the intermediate layer.

DESCRIPTION OF THE EMBODIMENTS (Element)

Figure 1A:
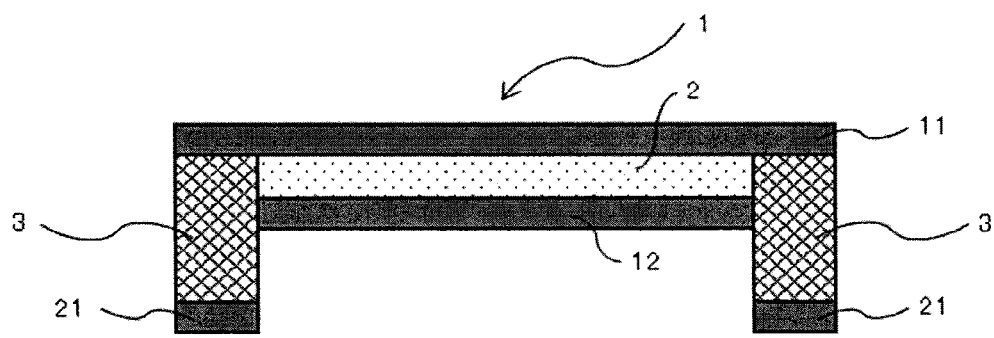
FIG. 1A is a schematic cross-sectional view illustrating one example of an element of the present invention in a steady state.

An element of the present invention includes a plurality of electrodes, and a plurality of intermediate layers, each of the plurality of intermediate layers being sandwiched between any pair of the plurality of electrodes. The plurality of the intermediate layers include at least two selected from the group consisting of; an intermediate layer that can be elongated and deformed in a direction that is not parallel to a direction in which an external force is applied, when the external force is applied to the intermediate layer; an intermediate layer that can be compressed and deformed in a direction that is parallel to a direction in which an external force is applied, when the external force is applied to the intermediate layer; and an intermediate layer that can be elongated and deformed in a direction that is not parallel to a direction in which an external force is applied, and can be compressed and deformed in a direction that is parallel to the direction in which the external force is applied, when the external force is applied to the intermediate layer. The element may further include other members, if necessary.

The element of the present invention is based on the findings in the related art that a region where a plurality of spacers are disposed hardly contributes to power generation to thereby decrease power generation efficiency, and a large quantity of electricity is required for a charging process, when an electret dielectric is produced.

The present invention has an object to provide an element, which has a high power-generating performance, and excellent stability to repetitive use.

The present invention can provide a high power-generating performance, and excellent stability to repetitive use.

<Electrode>

The number, materials, shapes, sizes, and structures of the electrodes are appropriately selected depending on the intended purpose without any limitation, as long as each electrode has conduction.

The number of the electrodes is a plural number, preferably 3 or greater, and more preferably 3 or greater but 150 or less.

Examples of a material of the electrode include metals, carbon-based conductive materials, and conductive rubber compositions. Examples of the metals among the above examples include gold, silver, copper, iron, aluminium, stainless steel, tantalum, nickel, and phosphor bronze.

Examples of the carbon-based conductive materials include graphite, carbon fibers, and carbon nanotubes.

Examples of the conductive rubber compositions include compositions containing conductive filler and rubber.

Examples of the conductive filler include carbon materials (e.g., Ketjenblack, acetylene black, graphite, carbon fibers (CF), carbon nanofibers (CNF), carbon nanotubes (CNT), and graphene), metal filler (e.g., gold, silver, platinum, copper, iron, aluminium, and nickel), conductive polymer materials (e.g., derivatives of any of polythiophene, polyacetylene, polyaniline, polypyrrole, poly(para-phenylene), and poly(para-phenylene)vinylene, or the derivatives doped with a dopant such as anions and cations), and ionic liquids. The above-listed examples of the conductive filler may be used alone or in combination.

Examples of the rubber include silicone rubber, fluorosilicone rubber, fluororubber, urethane rubber, acrylic rubber, chloroprene rubber, butyl rubber, ethylene propylene rubber, nitrile rubber, polysulfide rubber, and natural rubber (latex). The above-listed examples of the rubber may be used alone or in combination.

Examples of the form of each electrode include a sheet, a film, a thin film, fabric, nonwoven fabric, knitted fabric, a mesh, and a sponge. The form of each electrode may be nonwoven fabric formed by overlapping fibers of the carbon material.

The shape of the electrode is not particularly limited, and is appropriately selected depending on a shape of the element.

The size of the electrode is not particularly limited, and is appropriately selected depending on a size of the element.

Among the aforementioned electrodes, an electrode where a metal is turned into a form of fabric, nonwoven fabric, knitted fabric, or a mesh, an electrode where a metal plated material is turned into a form of fabric, nonwoven fabric, knitted fabric, or a mesh, and an electrode where a conductive rubber composition is turned into a form of a sheet, a film, or a thin film are preferable because these electrodes have flexibility (elasticity) and can correspond to elongation and deformation of the intermediate layers.

An average thickness of the electrode can be appropriately selected depending on a structure of an element. In view of conduction and flexibility, the average thickness of the electrode is preferably in a range of from 0.01 µm through 1 mm, and more preferably from 0.1 µm through 500 µm. When the average thickness of the electrode is 0.01 µm or greater, an adequate mechanical strength of the electrode is obtained, and conduction is improved. When the average thickness of the electrode is 1 mm or less, moreover, a resultant element is deformable, and an excellent power-generating performance is obtained.

<Intermediate Layer>

The number, materials, shapes, sizes, and structures of the intermediate layers are appropriately selected depending on the intended purpose without any limitation, as long as each intermediate layer is deformable by an external force.

The number of the intermediate layers is a plural number, preferably 2 or greater, and more preferably 2 or greater but 100 or less.

Examples of the material of the intermediate layer include barium titanate, lead zirconate titanate (PZT), polyvinylidene fluoride (PVDF), fluororesins, rubber, and rubber compositions. Among the above-listed examples, the rubber and rubber compositions are preferable because the rubber and the rubber compositions can be easily deformed with a small external force.

Examples of the rubber include silicone rubber, fluorosilicone rubber, fluororubber, urethane rubber, acrylic rubber, chloroprene rubber, butyl rubber, ethylene propylene rubber, nitrile rubber, polysulfide rubber, and natural rubber (latex). Among the above-listed examples of the rubber, silicone rubber is preferable because a high power-generating performance is obtained.

The silicone rubber is appropriately selected depending on the intended purpose without any limitation, as long as the silicone rubber is rubber containing organopolysiloxane bonds.

Examples of the silicone rubber include dimethyl silicone rubber, methylphenyl silicone rubber, and modified silicone rubber (e.g., acryl-modified silicone rubber, alkyd-modified silicone rubber, ester-modified silicone rubber, and epoxy-modified silicone rubber). The above-listed examples of the silicone rubber may be used alone or in combination.

Examples of the rubber compositions include compositions containing filler and the rubber. Among the above examples, a silicone rubber composition containing the silicone rubber is preferable because a high power-generating performance is obtained.

Examples of the filler include organic filler, inorganic filler, and organic-inorganic-composite filler.

The organic filler is appropriately selected depending on the intended purpose without any limitation, as long as the organic filler is an organic compound.

Examples of the organic filler include acryl particles, polystyrene particles, melamine particles, fluororesin particles (e.g., polytetrafluoroethylene), silicone powder (e.g., silicone resin powder, silicone rubber powder, and silicone composite powder), rubber powder, wood flour, pulps, and starch.

The inorganic filler is appropriately selected depending on the intended purpose without any limitation, as long as the inorganic filler is an inorganic compound.

Examples of the inorganic filler include oxides, hydroxides, carbonates, sulfates, silicates, nitrides, carbons, metals, and other compounds.

Examples of the oxides include silica, diatomaceous earth, alumina, zinc oxide, titanium oxide, iron oxide, and magnesium oxide.

Examples of the hydroxides include aluminium hydroxide, calcium hydroxide, and magnesium hydroxide.

Examples of the carbonates include calcium carbonate, magnesium carbonate, barium carbonate, and hydrotalcite.

Examples of the sulfates include aluminium sulfate, calcium sulfate, and barium sulfate.

Examples of the silicates include calcium silicate (e.g., wollastonite and xonotlite), zirconium silicate, kaolin, talc, mica, zeolite, perlite, bentonite, montmorillonite, sericite, activated clay, glass, and hollow glass beads.

Examples of the nitrides include aluminium nitride, silicon nitride, and boron nitride.

Examples of the carbons include Ketjenblack, acetylene black, graphite, carbon fibers, carbon fiber composite materials, carbon nanofibers, carbon nanotubes, fullerene (including derivatives thereof), and graphene.

Examples of the metals include gold, silver, platinum, copper, iron, aluminium, and nickel.

Examples of the other compounds include calcium titanate, barium titanate, strontium titanate, lead zirconate titanate, silicon carbide, and molybdenum sulfide.

The inorganic filler may be inorganic filler that has been subjected to a surface treatment.

The organic-inorganic composite filler is not particularly limited, and is used, as long as the organic-inorganic composite filler is a compound in which an organic compound and an inorganic compound are combined at a molecular level.

Examples of the organic-inorganic composite filler include silica-acryl composite particles, and silsesquioxane.

The average particle diameter of the filler is appropriately selected depending on the intended purpose without any limitation. The average particle diameter of the filler is preferably in a range of from 0.01 μm through 30 μm, and more preferably from 0.1 μm through 10 μm. When the average particle diameter of the filler is 0.01 μm or greater, a power-generating performance is improved. When the average particle diameter of the filler is 30 μm or smaller, an intermediate layer is deformable, and a power-generating performance can be enhanced.

The average particle diameter can be measured by means of a particle size distribution analyzer known in the art, such as Microtrac HRA (available from NIKKISO CO., LTD.), according to a method known in the art.

An amount of the filler is preferably in a range of from 0.1 parts by mass through 100 parts by mass, and more preferably from 1 part by mass to 50 parts by mass, relative to 100 parts by mass of the rubber. When the amount of the filler is 0.1 parts by mass or greater, a power-generating performance of an element may be improved. When the amount of the filler is 100 parts by mass or less, moreover, an intermediate layer is deformable, and a power-generating performance can be enhanced.

The other ingredients are appropriately selected depending on the intended purpose without any limitation. Examples of the other ingredients include additives. An amount of the other ingredients can be appropriately selected within a range that does not adversely affect the object of the present invention.

Examples of the additives include cross-linking agents, degradation inhibitors, heat-proof agents, and colorants.

—Preparation Method of Material for Forming Intermediate Layer—

A preparation method of a material for forming an intermediate layer is appropriately selected depending on the intended purpose without any limitation. For example, a preparation method of the rubber composition is a method where the rubber and the filler, and optionally the aforementioned other ingredients are mixed, and a resultant mixture is kneaded and dispersed to prepare a rubber composition.

—Formation Method of Intermediate Layer—

A formation method of the intermediate layer is appropriately selected depending on the intended purpose without any limitation. Examples of a formation method of a thin film of the rubber composition include a method where the rubber composition is applied onto a base by blade coating, die coating, or dip coating, followed by curing the rubber composition with heat or electron beams.

Each intermediate layer may be a single layer or a multiple layer.

An average thickness of the intermediate layer is appropriately selected depending on the intended purpose without any limitation, and the average thickness is preferably in a range of from 1 μm through 10 mm, and more preferably from 20 μm through 1 mm. When the average thickness of the intermediate layer is 1 μm or greater, an adequate mechanical strength of the intermediate layer is obtained, and a power-generating performance of the element is improved. When the average thickness of the intermediate layer is 10 mm or less, moreover, the intermediate layer is deformable, and a power-generating performance is improved.

Electrical properties of the intermediate layer are preferably insulation properties. As for the insulation properties, the intermediate layer preferably has volume resistivity of $10^8$ Ωcm or greater, and more preferably $10^{10}$ Ωcm or greater. When the volume resistivity of the intermediate layer is within the aforementioned preferable numerical range, an excellent power-generating performance can be obtained.

—Surface Modification Treatment and Deactivation Treatment of Intermediate Layer—

A surface modification treatment or a deactivation treatment may be performed on the intermediate layer. Both of the aforementioned treatments may be performed, or either of the treatments may be performed. It is assumed that, as a result of the aforementioned treatments, an electrostatic capacity of the intermediate layer changes upon application of only a small external force, to thereby increase power generation.

The surface modification treatment is appropriately selected depending on the intended purpose without any limitation, as long as the surface modification treatment is a treatment to apply a certain degree of irradiation energy to modify a material. Examples of the surface modification treatment include a plasma treatment, a corona discharge treatment, an electron beam irradiation treatment, a UV-ray irradiation treatment, an ozone treatment, and a radiation (e.g., X-ray, α rays, β rays, γ rays, and neutrons) irradiation treatment. Among the above-listed surface modification treatments, the plasma treatment, the corona discharge treatment, and the electron beam irradiation treatment are preferable in view of processing speed thereof.

—Plasma Treatment—

A plasma generating device for use in the plasma treatment is, for example, an atmospheric pressure plasma device, a parallel-plate plasma device, a capacity-coupled plasma device, or an inductively-coupled plasma device. In view of durability of a treated intermediate layer, the plasma treatment is preferably a low-pressure plasma treatment.

Reaction pressure of the plasma treatment is appropriately selected depending on the intended purpose without any limitation. The reaction pressure is preferably in a range of from 0.05 Pa through 100 Pa, and more preferably from 1 Pa through 20 Pa.

A reaction atmosphere of the plasma treatment is appropriately selected depending on the intended purpose without any limitation. For example, gas, such as inert gas, noble gas, and oxygen, is effective as the reaction atmosphere. The reaction atmosphere is preferably argon in view of continuity of an effect. Moreover, oxygen partial pressure of the reaction atmosphere is preferably 5,000 ppm or less. When the oxygen partial pressure of the reaction atmosphere is 5,000 ppm or less, generation of ozone can be suppressed, and use of an ozone processing device can be avoided.

An electricity radiation dose in the plasma treatment is defined by (output×irradiation duration). The electricity radiation dose is preferably in a range of from 5 Wh through 200 Wh, more preferably from 10 Wh through 50 Wh. When the electricity radiation dose is within the aforementioned preferable range, an ability to generate electricity can be imparted to the intermediate layer, and durability of the intermediate layer can be ensured because an excessive amount of the energy is not applied.

—Corona Discharge Treatment—

Applied energy (cumulative energy) in the corona discharge treatment is preferably in a range of from 6 J/cm$^2$ through 300 J/cm$^2$, more preferably from 12 J/cm$^2$ through 60 J/cm$^2$. When the applied energy is within the aforementioned preferable range, an excellent power-generating performance and durability can be obtained.

Applied voltage in the corona discharge treatment is preferably in a range of from 50 V through 150 V, and more preferably 100 V. A reaction atmosphere of the corona discharge treatment is preferably air.

—Electron Beam Irradiation Treatment—

A radiation dose of the electron beam irradiation treatment is preferably 1 kGy or greater, and more preferably in a range of from 300 kGy through 10 MGy. When the radiation dose is within the aforementioned preferable range, an ability to generate electricity can be imparted to the intermediate layer, and durability of the intermediate layer can be ensured because an excessive amount of the energy is not applied.

A reaction atmosphere of the electron beam irradiation treatment is appropriately selected depending on the intended purpose without any limitation. The reaction atmosphere is preferably an atmosphere whose oxygen partial pressure is adjusted to 5,000 ppm or less by filling with inert gas, such as argon, neon, helium, and nitrogen. When the oxygen partial pressure of the reaction atmosphere is 5,000 ppm or less, generation of ozone can be suppressed, and use of an ozone processing device can be avoided.

—UV-Ray Irradiation Treatment—

UV rays used in the UV-ray irradiation treatment preferably have wavelengths of 200 nm or longer but 365 nm or shorter, and more preferably 240 nm or longer but 320 nm or shorter.

Cumulative radiation in the UV-ray irradiation treatment is preferably in a range of from 5 J/cm$^2$ through 500 J/cm$^2$, and more preferably in a range of from 50 J/cm$^2$ through 400 J/cm$^2$. When the cumulative radiation in the UV-ray irradiation treatment is within the aforementioned preferable range, an ability to generate electricity can be imparted to the intermediate layer, and durability of the intermediate layer can be ensured because an excessive amount of the energy is not applied.

A reaction atmosphere of the UV-ray irradiation treatment is appropriately selected depending on the intended purpose without any limitation. The reaction atmosphere is preferably an atmosphere whose oxygen partial pressure is adjusted to 5,000 ppm or less by filling with inert gas, such as argon, neon, helium, and nitrogen. When the oxygen partial pressure of the reaction atmosphere is 5,000 ppm or less, generation of ozone can be suppressed, and use of an ozone processing device can be avoided.

It is proposed in the related art that an interlayer adhesion is enhanced by exciting or oxidizing a material through a plasma treatment, a corona discharge treatment, a UV-ray irradiation treatment, or an electron beam irradiation treatment to thereby generate active groups. The proposed techniques are however limited to the application between layers, and are not suitable an outermost surface because lubricity is decreased. Moreover, a reaction of any of the aforementioned treatments is performed in an oxygen-rich state, to effectively introduce reaction active groups (hydroxyl groups). Accordingly, the aforementioned related art is fundamentally different from the surface modification treatment performed in the present invention. The surface modification treatment is a treatment (e.g., a plasma treatment) that is performed in a reaction environment of a low oxygen content with reduced pressure. Therefore, the surface modification treatment accelerates re-cross-linking and bonding of the surface to improve durability, for example, owing to "an increase of Si—O bonds having high bonding energy." In addition, lubricity is increased owing to "densification by improved cross-link density."

—Deactivation Treatment—

A deactivation treatment may be optionally performed on a surface of the intermediate layer using various materials.

The deactivation treatment is appropriately selected depending on the intended purpose without any limitation, as long as the deactivation treatment is a treatment for deactivating a surface of the intermediate layer. Examples of the deactivation treatment include a treatment, in which a deactivator is applied onto a surface of the intermediate layer. The deactivation means that active groups (e.g., —OH) generated by excitation or oxidation caused by a plasma treatment, a corona discharge treatment, a UV-ray irradiation treatment, or an electron beam irradiation treatment are allowed to react with a deactivator to decrease an activation degree of a surface of the intermediate layer, to thereby change the properties of the surface of the intermediate layer to properties that are unlikely to cause chemical reactions.

Examples of the deactivator include amorphous resins and coupling agents.

Examples of the amorphous resins include resins containing perfluoropolyether in main chains thereof.

Examples of the coupling agents include metal alkoxides, and solutions containing metal alkoxides.

Examples of the metal alkoxides include compounds represented by the following general formula (1), partial hydrolysis polycondensation products thereof having a degree of polymerization of from about 2 through about 10, and mixtures thereof.

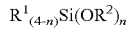

$$R^1{}_{(4-n)}Si(OR^2)_n \qquad \text{General formula (1)}$$

In the general formula (1), $R^1$ and $R^2$ are each independently a straight-chain or branched alkyl group having from 1 through 10 carbon atoms, an alkyl polyether chain, and an aryl group, and n is an integer of from 2 through 4.

Examples of the compound represented by the general formula (1) include dimethyldimethoxysilane, diethyldiethoxysilane, diethyldimethoxysilane, diethyldiethoxysilane, diphenyldimethoxysilane, diphenyldiethoxysilane, methyltrimethoxysilane, methyltriethoxysilane, tetramethoxysilane, tetraethoxysilane, and tetrapropoxysilane. Among the above-listed compounds, tetraethoxysilane is preferable in view of durability.

In the general formula (1), $R^1$ may be a fluoroalkyl group, or fluoroalkyl acrylate or perfluoropolyether bonded via oxygen. Among the above-listed examples, $R^1$ is preferably a perfluoropolyether group in view of flexibility and durability.

Examples of the metal alkoxides include vinyl silanes [e.g., vinyltris(β-methoxyethoxy)silane, vinyl triethoxy silane, and vinyltrimethoxysilane], acrylic silanes [e.g., γ-methacryloxypropyltrimethoxysilane], epoxy silanes [e.g., β-(3,4-epoxycyclohexyl)ethyltrimethoxysilane, γ-glycidoxypropyltrimethoxysilane, and γ-glycidoxypropylmethyldiethoxysilane], and aminosilanes [e.g., N-β(aminoethyl)γ-aminopropyltrimethoxysilane, N-β(aminoethyl)γ-aminopropylmethyldimethoxysilane, γ-aminopropyltriethoxysilane, and N-phenyl-γ-aminopropyltrimethoxysilane].

As a metal atom in the metal alkoxide, other than Si, one or two or more selected from the group consisting of Ti, Sn, Al, and Zr may be used alone or in combination.

For example, the deactivation treatment can be performed by, after performing the surface modification treatment on an intermediate precursor, applying the deactivator onto a surface of the intermediate precursor through coating or dipping to penetrate the deactivator. In the case where silicone rubber is used as the intermediate precursor, the surface may be deactivated by leaving the intermediate precursor to stand in air for air drying, after performing the surface modification treatment.

When an external force is applied to a plurality of the intermediate layers, a region that is elongated and deformed in a direction that is not parallel to the direction in which the external force is applied, a region that is compressed and deformed in a direction that is parallel to the direction in which the external force is applied, or a region that is elongated and deformed as well as compressed and deformed, or any combination thereof are created by arranging the intermediate layer having different materials, shapes, sizes, or thicknesses in combination. A combination of the intermediate layers is appropriately selected depending on the intended purpose without any limitation.

The plurality of the intermediate layers include at least two selected from the group consisting of: an intermediate layer that can be elongated and deformed in a direction that is not parallel to a direction in which an external force is applied, when the external force is applied to the intermediate layer; an intermediate layer that can be compressed and deformed in a direction that is parallel to a direction in which an external force is applied, when the external force is applied to the intermediate layer; and an intermediate layer that can be elongated and deformed in a direction that is not parallel to a direction in which an external force is applied, and can be compressed and deformed in a direction that is parallel to the direction in which the external force is applied, when the external force is applied to the intermediate layer.

The direction that is not parallel to the direction in which the external force is applied means an oblique direction or a vertical direction relative to the direction in which the external force is applied.

The oblique direction relative to the direction in which the external force is applied is preferably a direction forming an angle of 2 degrees or greater but smaller than 88 degrees, or 92 degrees or greater but 178 degrees or smaller, with the direction in which the external force is applied. The oblique direction is more preferably a direction forming an angle of 5 degrees or greater but 85 or smaller, or 95 degrees or greater but 175 or smaller, with the direction in which the external force is applied. The vertical direction to the direction in which the external force is applied is preferably a direction forming an angle of 88 degrees or greater but smaller than 92 degrees with the direction in which the external force is applied. The vertical direction is more preferably a direction forming an angle of 90 degrees with the direction in which the external force is applied.

The direction that is parallel to the direction in which the external force is applied is preferably a direction forming an angle of 0 degrees or greater but smaller than 2 degrees with the direction in which the external force is applied. The parallel direction is preferably a direction forming an angle of 0 degrees with the direction in which the external force is applied.

The direction in which the external force is applied to the intermediate layer is preferably a vertical direction relative to a surface of the intermediate layer.

The plurality of the intermediate layers preferably have elasticity. In the present specification, the term "elasticity" means a characteristic that it deforms (generates distortion) when pressure is applied, but it returns back to the original shape when the pressure is removed. For example, a degree of the elasticity can be judged with Young's modulus (elastic modulus). The Young's modulus of the intermediate layers is preferably 1 GPa or less, because such intermediate layers can be easily deformed with a small external force. Examples of a material of the intermediate layer achieving the Young's modulus of 1 GPa or less include rubber and rubber compositions.

The intermediate layers preferably do not have initial surface potential in a stationary state.

Note that, the initial surface potential of the intermediate layers in the stationary state can be measured under the following measuring conditions. In the present specification, the phrase "not having initial surface potential" means that surface potential as measured under the following conditions is ±10 V or less.

[Measuring Conditions]
Pretreatment: After leaving to stand in an atmosphere having a temperature of 30° C. and relative humidity of 40% for 24 hours, charge neutralization is performed for 60 seconds (by means of SJ-F300 available from Keyence Corporation).
Device: Treck Model 344
Measuring probe: 6000B-7C
Measuring distance: 2 mm
Measuring spot diameter: 10 mm in diameter The element of the present invention has a different principle of power generation from those of related art disclosed in Japanese Unexamined Patent Application Publication Nos. 2009-253050, 2014-027756, and 54-14696, because the intermediate layers of the element of the present invention do not have initial surface potential.

The element of the present invention deforms upon application of a load, such as an external force or vibration, to thereby generate electricity. A power generation mechanism of the element of the present invention has not been clearly known yet, but it is assumed as follows. An intermediate layer adjacent to an electrode is charged in a mechanism similar to friction charging, or charges are generated inside the intermediate layer, when a load is applied. When the element is deformed in this state, an electrostatic capacity changes to generate a surface potential difference. The charge is moved to make the surface potential difference zero to thereby generate electricity.

<Supporting Member>

The element preferably includes a supporting member. Use of the supporting member in the element can increase a mechanical strength of the element, and can enhance stability to repetitive use. Moreover, use of the supporting member realizes a structure, in which a space is disposed between the intermediate layer and the electrode, and such a structure can improve a power-generating performance. Even in the case where there is a possibility that a timing (phase) of power generation is deviated between a plurality of the intermediate layers to cancel out power outputs thereof, the supporting member separates the power outputs. Accordingly, the power outputs are not canceled out with each other, and a power generation efficiency of the element can be improved.

A material, form, shape, and size of the supporting member are appropriately selected depending on the intended purpose without any limitation.

Examples of the material of the supporting member include polymer materials, rubber, and metals.

Examples of the polymer materials include polyethylene, polypropylene, polyethylene terephthalate, polyvinyl chloride, polyimide resins, fluororesins, and acrylic resins.

Examples of the rubber include silicone rubber, fluorosilicone rubber, fluororubber, urethane rubber, acrylic rubber, chloroprene rubber, butyl rubber, ethylene propylene rubber, nitrile rubber, polysulfide rubber, and natural rubber (latex).

Examples of the metals include gold, silver, copper, aluminium, stainless steel, tantalum, nickel, and phosphor bronze. The metal is preferably coated with the polymer material or the rubber to achieve electric insulation.

Examples of the form of the supporting member include a sheet, a film, a thin film, fabric, nonwoven fabric, knitted fabric, a mesh, and a sponge.

The shape of the supporting member is not particularly limited, and is appropriately selected depending on a shape of the element.

The size of the supporting member is not particularly limited, and is appropriately selected depending on a size of the element.

Among the aforementioned supporting members, a supporting member where a polymer material is turned into a form of fabric, nonwoven fabric, knitted fabric, or a mesh, and a supporting member where rubber is turned into a sheet, a film, or a thin film are preferable because these supporting members have flexibility (elasticity), and can correspond to elongation and deformation of the intermediate layers.

An average thickness of the supporting member is appropriately selected depending on a structure of the element. In view of flexibility, the average thickness of the supporting member is preferably in a range of from 0.01 µm through 1 mm, and more preferably from 0.1 µm through 500 µm. When the average thickness of the supporting member is 0.01 µm or greater, an adequate mechanical strength is obtained. When the average thickness of the supporting member is 1 mm or less, the element is deformable, and an excellent power-generating performance is obtained.

<Space>

The element preferably includes a space disposed between the intermediate layer and at least one of the electrodes. Owing to the space disposed, a distance between the electrodes changes upon application of even a small external force, to thereby change an electrostatic capacity of the element. Therefore, a high power-generating performance of the element is obtained.

The element of the present invention is described with reference to drawings.

FIG. 1A is a schematic cross-sectional view illustrating one example of the element of the present invention. The element 1 illustrated in FIG. 1A includes an element 11, an element 12, an element 21, an intermediate layer 2 disposed between the electrode 11 and the electrode 12, and an intermediate layer 3 disposed between the electrode 11 and the electrode 21.

A total thickness of the intermediate layer 2 and the electrode 12 is smaller than a total thickness of the intermediate layer 3 and the electrode 21. The element 1 has a structure where a space is disposed in an inner area of the electrode 1.

Shapes of the intermediate layer 2 and the intermediate layer 3 are appropriately selected depending on the intended purpose without any limitation. Examples of the shape of each intermediate layer in a planar view include a circle, an oval, a square, a rectangle, and a triangle.

A layout pattern of the intermediate layer 2 and intermediate layer 3 is appropriately selected depending on the intended purpose without any limitation. Examples of the layout pattern thereof in a planar view include layouts where the intermediate layer 3 is disposed to surround a periphery of the intermediate layer 2, and layouts where the intermediate layer 3 is disposed to be adjacent to part of the periphery of the intermediate layer 2, as illustrated in FIGS. 2A to 2I.

Figure 1B:
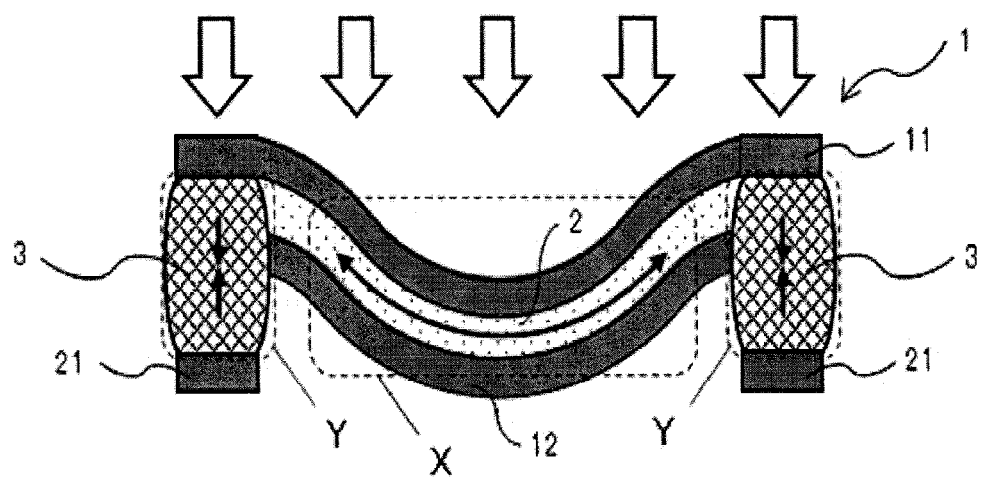
FIG. 1B is a schematic cross-sectional view illustrating one example of an element of the present invention in a state where an external force is applied to the element.

When an external force is applied to the element 1, as illustrated in FIG. 1B, a center part of the intermediate layer 2 is dented with a gentle shape to decrease a thickness of the intermediate layer 3. As a result, the intermediate layer 2 is relatively elongated and deformed in an oblique direction relative to a direction in which the external force is applied, to thereby generate electricity. Moreover, the intermediate layer 3 is relatively compressed and deformed in a parallel direction relative to the direction in which the external force is applied, to thereby generate electricity. When the external force is eliminated, the intermediate layer 2 and the intermediate layer 3 return back to the original shapes, because the intermediate layer 2 and the intermediate layer 3 have elasticity. Electricity is also generated when the intermediate layer 2 and the intermediate layer 3 return back to the original shapes.

The electrode 11 and the electrode 12 are preferably composed of a material having flexibility (elasticity) to correspond to elongation and deformation of the intermediate layer 2.

When there is a possibility that an electric contact between the electrodes and the intermediate layer is not ensured because of the deformed intermediate layer, the electrodes are preferably bonded to part or an entire surface of the intermediate layer. Examples of a bonding method include methods using conductive bonding agents or adhesives.

The element illustrated in FIG. 1A has a high power-generating performance because the element is formed of only members contributing to power generation, and the intermediate layers therein are easily deformed with a small external force. Moreover, the element has a high restoring force and excellent stability to repetitive use, because an elastic deformation of the intermediate layer caused by application of an external force includes different types of elastic deformations where the deformation states (e.g., elongation and compression) and deformation directions (e.g., an oblique direction and a parallel direction), compared to a case where, for example, the intermediate layer is relatively compressed and deformed to a direction that is parallel to a direction in which an external force is applied. A timing (phase) of power generation is deviated to prolong a duration of power generation, because elastic deformations having different deformation states (e.g., elongation and compression) and deformation directions (e.g., an oblique direction and a parallel direction) coexist. Accordingly, a power generation efficiency can be improved.

Figure 3A:
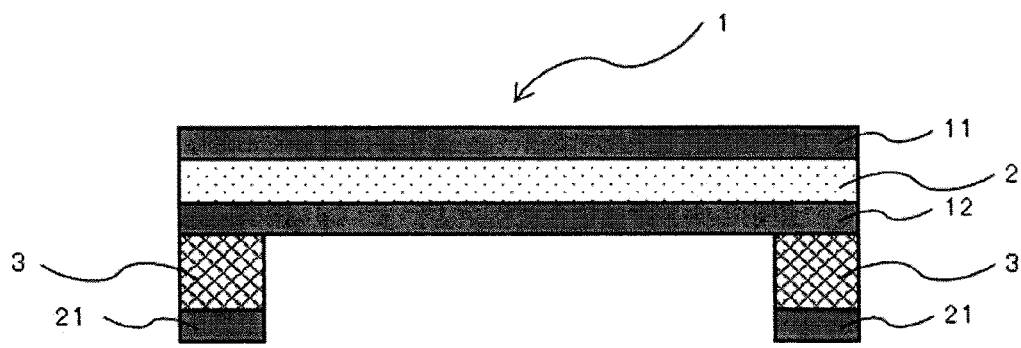
FIG. 3A is a schematic cross-sectional view illustrating another example of an element of the present invention in a steady state.

FIG. 3A is a schematic cross-sectional view illustrating another example of the element of the present invention. The element illustrated in FIG. 3A has a different layout of the intermediate layers to the layout of the element illustrated in FIG. 1A. In the element illustrated in FIG. 3A, part of the intermediate layer 2 and the intermediate layer 3 are laminated via the electrode 12.

A total area of the intermediate layer 2 is larger than a total area of the intermediate layer 3, and the element 1 has a structure where a space is disposed in an inner area of the electrode 1.

Shapes of the intermediate layer 2 and the intermediate layer 3 are appropriately selected depending on the intended purpose without any limitation. Examples of the shape of each intermediate layer in a planar view include a circle, an oval, a square, a rectangle, and a triangle.

A layout pattern of the intermediate layer 2 and intermediate layer 3 is appropriately selected depending on the intended purpose without any limitation. Examples of the layout pattern thereof in a planar view include layouts where the intermediate layer 3 is disposed to overlap with an entire perimeter of an edge of the intermediate layer 2, and layouts where the intermediate layer 3 is disposed to overlap with part of the edge of the intermediate layer 2, as illustrated in FIGS. 4A to 4J.

Figure 3B:
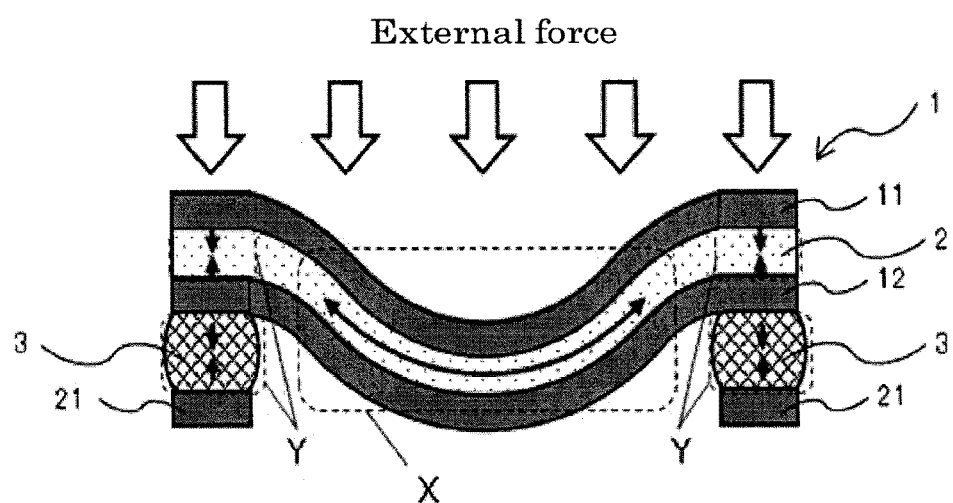
FIG. 3B is a schematic cross-sectional view illustrating another example of an element of the present invention in a state where an external force is applied to the element.

When an external force is applied to the element 1, as illustrated in FIG. 3B, a center part of the intermediate layer 2 is dented with a gentle shape to decrease a thickness of the entire perimeter or part of the intermediate layer 2, and a thickness of the intermediate layer 3. As a result, the center part of the intermediate layer 2 is relatively elongated and deformed in an oblique direction relative to a direction in which the external force is applied, to thereby generate electricity. Moreover, the entire perimeter or part of the intermediate layer 2 is relatively compressed and deformed in a parallel direction relative to the direction in which the external force is applied, to thereby generate electricity. Furthermore, the intermediate layer 3 is relatively compressed and deformed in a parallel direction relative to the direction in which the external force is applied, to thereby generate electricity. When the external force is eliminated, the intermediate layer 2 and the intermediate layer 3 return back to the original shapes, because the intermediate layer 2 and the intermediate layer 3 have elasticity. Electricity is also generated when the intermediate layer 2 and the intermediate layer 3 return back to the original shapes.

The electrode 11 and the electrode 12 are preferably composed of a material having flexibility (elasticity) to correspond to elongation and deformation of the intermediate layer 2.

When there is a possibility that an electric contact between the electrodes and the intermediate layer is not ensured because of the deformed intermediate layer, the electrodes are preferably bonded to part or an entire surface of the intermediate layer. Examples of a bonding method include methods using conductive bonding agents or adhesives.

The element illustrated in FIG. 3A has a high power-generating performance because the element is formed of only members contributing to power generation, and the intermediate layers therein are easily deformed with a small external force. Moreover, the element has a high restoring force and excellent stability to repetitive use, because an elastic deformation of the intermediate layer caused by application of an external force includes different types of elastic deformations where the deformation states (e.g., elongation and compression) and deformation directions (e.g., an oblique direction and a parallel direction), compared to a case where, for example, the intermediate layer is relatively compressed and deformed to a direction that is parallel to a direction in which an external force is applied. Moreover, the constitutional members are unlikely to be displaced even when the element is repeatedly deformed, because all of the constitutional members are directly laminated to each other. Accordingly, the element has excellent stability to repetitive use. A timing (phase) of power generation is deviated to prolong a duration of power generation, because elastic deformations having different deformation states (e.g., elongation and compression) and deformation directions (e.g., an oblique direction and a parallel direction) coexist. Accordingly, a power generation efficiency can be improved.

Figure 5:
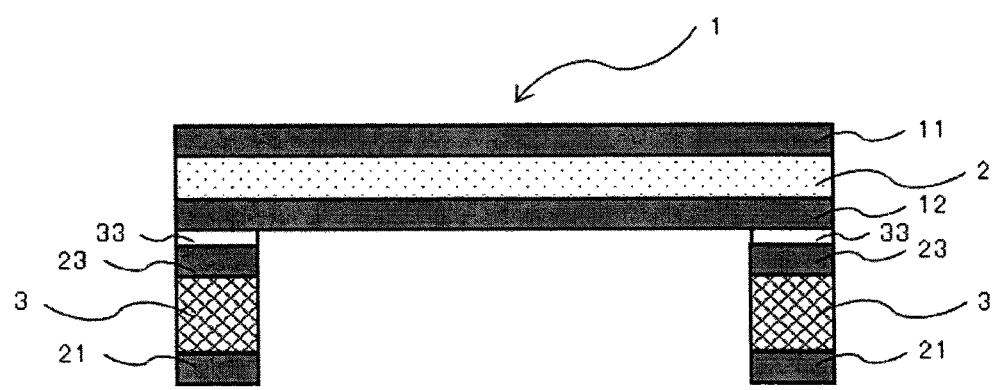
FIG. 5 is a schematic cross-sectional view illustrating another example of an element of the present invention.

FIG. 5 is a schematic cross-sectional view illustrating another example of the element of the present invention. The element 1 illustrated in FIG. 5 includes an electrode 11, an electrode 12, an electrode 21, an electrode 23, an intermediate layer 2 disposed between the electrode 11 and the electrode 12, an intermediate layer 3 disposed between the electrode 23 and the electrode 21, and a supporting member 33 disposed between the electrode 12 and the electrode 23.

A total area of the intermediate layer 2 is larger than a total area of the intermediate layer 3, and the element 1 has a structure where a space is disposed in an inner area of the element.

Shapes of the intermediate layer 2 and the intermediate layer 3 are appropriately selected depending on the intended purpose without any limitation. Examples of the shape thereof in a planar view include a circle, an oval, a square, a rectangle, and a triangle.

A layout pattern of the intermediate layer 2 and the intermediate layer 3 is appropriately selected depending on the intended purpose without any limitation. Examples of the layout pattern thereof in a planar view include layout patterns illustrated in FIGS. 4A to 4J.

The electrode 11 and the electrode 12 are preferably composed of a material having flexibility (elasticity) to correspond to elongation and deformation of the intermediate layer 2.

When there is a possibility that an electric contact between the electrodes and the intermediate layer is not ensured because of the deformed intermediate layer, the electrodes are preferably bonded to part or an entire surface of the intermediate layer. Examples of a bonding method include methods using conductive bonding agents or adhesives.

The element illustrated in FIG. 5 has a high power-generating performance because the element is formed of only members contributing to power generation, and the intermediate layers therein are easily deformed with a small external force. Moreover, the element has a high restoring force and excellent stability to repetitive use, because an elastic deformation of the intermediate layer caused by application of an external force includes different types of elastic deformations where the deformation states (e.g., elongation and compression) and deformation directions (e.g., an oblique direction and a parallel direction), compared to a case where, for example, the intermediate layer is relatively compressed and deformed to a direction that is parallel to a direction in which an external force is applied. A timing (phase) of power generation is deviated to prolong a duration of power generation, because elastic deformations having different deformation states (e.g., elongation and compression) and deformation directions (e.g., an oblique direction and a parallel direction) coexist. Accordingly, a power generation efficiency can be improved. Even in the case where a timing (phase) of power generation is deviated between the intermediate layer 2 and the intermediate layer 3, power outputs do not cancel each other out because the power output of the intermediate layer 2 and the power output of the intermediate layer 3 are separated with the supporting member 33. Accordingly, a power generation efficiency can be improved.

Figure 6A:
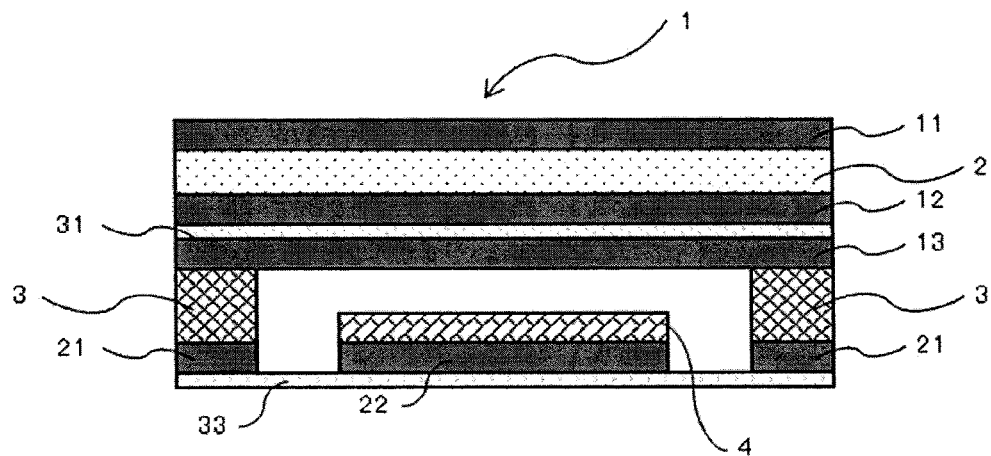
FIG. 6A is a schematic cross-sectional view illustrating another example of an element of the present invention in a steady state.

FIG. 6A is a schematic cross-sectional view illustrating another example of the element of the present invention. The element 1 illustrated in FIG. 6A includes an electrode 11, an electrode 12, an electrode 13, an electrode 21, an electrode 22, an intermediate layer 2 disposed between the electrode 11 and the electrode 12, an intermediate layer 3 disposed between the electrode 13 and the electrode 21, an intermediate layer 4, a supporting member 31 disposed between the electrode 12 and the electrode 13, and a supporting member 33 disposed under the electrode 21 and the electrode 22.

A total thickness of the intermediate layer 4 and the electrode 22 is smaller than a total thickness of the intermediate layer 3 and the electrode 21, and the element 1 has a structure where a space is disposed between the electrode 13 and the intermediate layer 4.

Shapes of the intermediate layer 2, the intermediate layer 3, and the intermediate layer 4 are appropriately selected depending on the intended purpose without any limitation. Examples of the shape thereof in a planar view include a circle, an oval, a square, a rectangle, and a triangle.

A layout pattern of the intermediate layer 2, the intermediate layer 3, and the intermediate layer 4 is appropriately selected depending on the intended purpose without any limitation. Examples of the layout pattern thereof in a planar view include layouts where the intermediate layer 3 is disposed to overlap with an entire perimeter of an edge of the intermediate layer 2, and the intermediate layer 4 is further disposed to overlap with a center part of the intermediate layer 2, and layouts where the intermediate layer 3 is disposed to overlap with part of the edge of the intermediate layer 2, and the intermediate layer 4 is further disposed to overlap with the center part of the intermediate layer 2, as illustrated in FIGS. 7A to 7K.

Figure 6B:
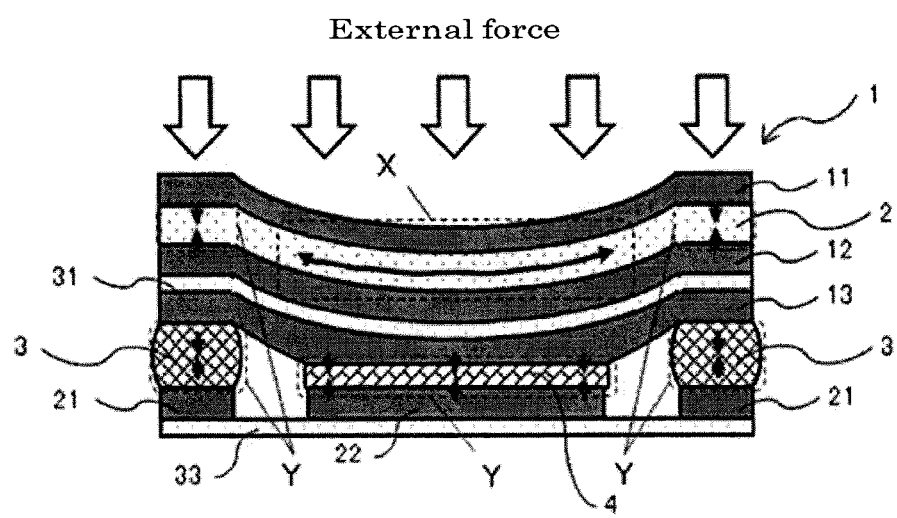
FIG. 6B is a schematic cross-sectional view illustrating another example of an element of the present invention in a state where an external force is applied to the element.

When an external force is applied to the element 1, as illustrated in FIG. 6B, a center part of the intermediate layer 2 is dented with a gentle shape to decrease a thickness of the entire perimeter or part of the edge of the intermediate layer 2, a thickness of the intermediate layer 3, and a thickness of the intermediate layer 4. As a result, the intermediate layer 2 is relatively elongated and deformed in an oblique direction relative to a direction in which the external force is applied, to thereby generate electricity. Moreover, the entire perimeter or part of the edge of the intermediate layer 2 is relatively compressed and deformed in a parallel direction relative to the direction in which the external force is applied, to thereby generate electricity. Furthermore, the intermediate layer 3 is relatively compressed and deformed in a parallel direction relative to the direction in which the external force is applied, to thereby generate electricity. Furthermore, the intermediate layer 4 is relatively compressed and deformed in a parallel direction relative to the direction in which the external force is applied, to thereby generate electricity. When the external force is eliminated, the intermediate layer 2, the intermediate layer 3, and the intermediate layer 4 return back to the original shapes, because the intermediate layer 2, the intermediate layer 3, and the intermediate layer 4 have elasticity. Electricity is also generated when the intermediate layer 2, the intermediate layer 3, and the intermediate layer 4 return back to the original shapes.

The electrode 11, the electrode 12, and the electrode 13 are preferably composed of a material having flexibility (elasticity) to correspond to elongation and deformation of the intermediate layer 2.

The supporting member 31 is preferably composed of a material having flexibility (elasticity) to correspond to elongation and deformation of the intermediate layer 2.

When there is a possibility that an electric contact between the electrodes and the intermediate layer is not ensured because of the deformed intermediate layer, the electrodes are preferably bonded to part or an entire surface of the intermediate layer. Examples of a bonding method include methods using conductive bonding agents or adhesives.

The element illustrated in FIG. 6A has a high power-generating performance because the intermediate layers therein are easily deformed with a small external force. Moreover, the element has a high restoring force and excellent stability to repetitive use, because an elastic deformation of the intermediate layer caused by application of an external force includes different types of elastic deformations where the deformation states (e.g., elongation and compression) and deformation directions (e.g., an oblique direction and a parallel direction), compared to a case where, for example, the intermediate layer is relatively compressed and deformed to a direction that is parallel to a direction in which an external force is applied. A timing (phase) of power generation is deviated to prolong a duration of power generation, because elastic deformations having different deformation states (e.g., elongation and compression) and deformation directions (e.g., an oblique direction and a parallel direction) coexist. Accordingly, a power generation efficiency can be improved. Moreover, a power-generating performance of the element can be improved, because of an increase in a total area of the intermediate layers that are compressed and deformed to generate electricity. Furthermore, a space can be maintained between the electrode 13 and the intermediate layer 4 because the supporting member 33 is disposed. As a result, a distance between the electrode 13 and the electrode 22 changes with a small external force to change an electrostatic capacity of the element. Accordingly, a power-generating performance of the element can be improved. Even in the case where a timing (phase) of power generation is deviated between the intermediate layer 2, the intermediate layer 3, and the intermediate layer 4, power outputs do not cancel each other out because the power output of the intermediate layer 2, the power output of the intermediate layer 3, and the power output of the intermediate layer 4 are separated with the supporting member 31. Accordingly, a power generation efficiency can be improved. Moreover, a mechanical strength of the element is enhanced, because the number of constitutional members is increased within a range that does not adversely affect deformation of the element. Accordingly, stability of the element to repetitive use can be improved.

Figure 8:
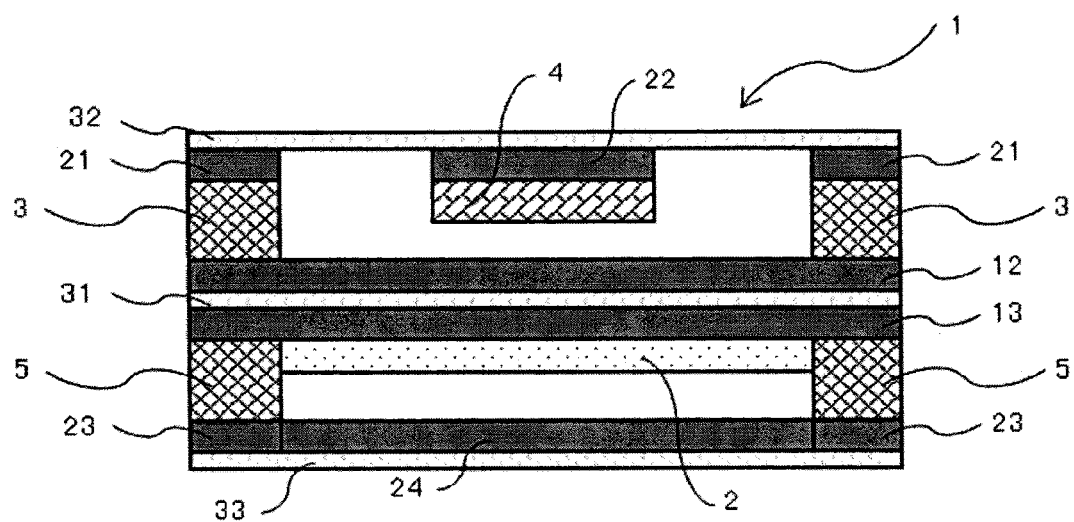
FIG. 8 is a schematic cross-sectional view illustrating another example of an element of the present invention.

FIG. 8 is a schematic cross-sectional view illustrating another example of the element of the present invention. The element 1 illustrated in FIG. 8 includes an electrode 12, an electrode 13, an electrode 21, an electrode 22, an electrode 23, an electrode 24, an intermediate layer 3 disposed between the electrode 21 and the electrode 12, an intermediate layer 5 disposed between the electrode 13 and the electrode 23, an intermediate layer 2, an intermediate layer 4, a supporting member 32 disposed above the electrode 21 and the electrode 22, a supporting member 31 disposed between the electrode 12 and the electrode 13, and a supporting member 33 disposed under the electrode 23 and the electrode 24.

A total thickness of the electrode 22 and the intermediate layer 4 is smaller than a total thickness of the electrode 21 and the intermediate layer 3, and the element 1 has a structure where a space is disposed between the intermediate layer 4 and the electrode 12. Moreover, a thickness of the intermediate layer 2 is smaller than a thickness of the intermediate layer 5, and the element 1 has a structure where a space is disposed between the intermediate layer 2 and the electrode 24.

Shapes of the intermediate layer 2, the intermediate layer 3, the intermediate layer 4, and the intermediate layer 5 are appropriately selected depending on the intended purpose without any limitation. Examples of the shape of each intermediate layer in a planar view include a circle, an oval, a square, a rectangle, and a triangle.

A layout pattern of the intermediate layer 2, the intermediate layer 3, the intermediate layer 4, and the intermediate layer 5 is appropriately selected depending on the intended purpose without any limitation. Examples of the layout pattern thereof in a planar view include layouts where the intermediate layer 3 and the intermediate layer 5 are disposed to surround a periphery of the intermediate layer 2, and the intermediate layer 4 is further disposed to overlap with the center part of the intermediate layer 2, and layouts where the intermediate layer 3 and the intermediate layer 5 are disposed to be adjacent to part of the periphery of the intermediate layer 2, and the intermediate layer 4 is further disposed to overlap with the center part of the intermediate layer 2, as illustrated in FIGS. 9A to 9I.

The electrode 12 and the electrode 13 are preferably composed of a material having flexibility (elasticity) to correspond to elongation and deformation of the intermediate layer 2.

The supporting member 31 and the supporting member 32 are preferably composed of a material having flexibility (elasticity) to correspond to elongation and deformation of the intermediate layer 2.

When there is a possibility that an electric contact between the electrodes and the intermediate layer is not ensured because of the deformed intermediate layer, the electrodes are preferably bonded to part or an entire surface of the intermediate layer. Examples of a bonding method include methods using conductive bonding agents or adhesives.

The element illustrated in FIG. 8 has a high power-generating performance because the intermediate layers therein are easily deformed with a small external force. Moreover, the element has a high restoring force and excellent stability to repetitive use, because an elastic deformation of the intermediate layer caused by application of an external force includes different types of elastic deformations where the deformation states (e.g., elongation and compression) and deformation directions (e.g., an oblique direction and a parallel direction), compared to a case where, for example, the intermediate layer is relatively compressed and deformed to a direction that is parallel to a direction in which an external force is applied. A timing (phase) of power generation is deviated to prolong a duration of power generation, because elastic deformations having different deformation states (e.g., elongation and compression) and deformation directions (e.g., an oblique direction and a parallel direction) coexist. Accordingly, a power generation efficiency can be improved. Moreover, a space can be maintained between the intermediate layer 4 and the electrode 12 because the supporting member 32 is disposed. Furthermore, a space can be maintained between the intermediate layer 2 and the electrode 24 because the supporting member 33 is disposed. As a result, a distance between the electrode 22 and the electrode 12, and also a distance between the electrode 13 and the electrode 24 change with a small external force to largely change an electrostatic capacity of the element. Accordingly, a power-generating performance of the element can be improved. Even in the case where a timing (phase) of power generation is deviated between the intermediate layer 2, the intermediate layer 3, the intermediate layer 4, and the intermediate layer 5, power outputs do not cancel each other out because the power output of the intermediate layer 2, the power output of the intermediate layer 3, the power output of the intermediate layer 4, and the power output of the intermediate layer 5 are separated with the supporting member 31. Accordingly, a power generation efficiency can be improved. Moreover, a mechanical strength of the element is enhanced, because the number of constitutional members is increased within a range that does not adversely affect deformation of the element. Accordingly, stability of the element to repetitive use can be improved.

Figure 10:
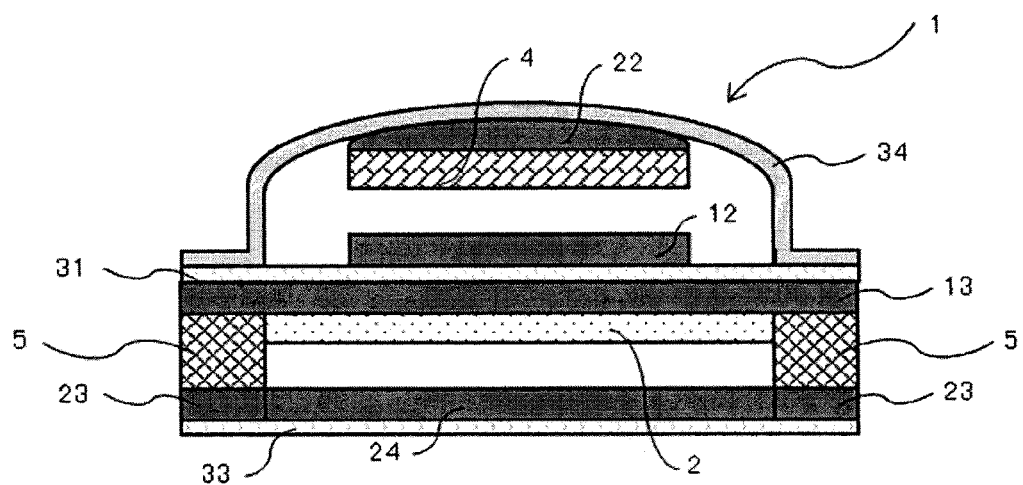
FIG. 10 is a schematic cross-sectional view illustrating another example of an element of the present invention.

FIG. 10 is a schematic cross-sectional view illustrating another example of the element of the present invention. The element 1 illustrated in FIG. 10 has a structure where part of constitutional members of the element illustrated in FIG. 8 is replaced with a flat spring 34.

A material, a shape, and a size of the flat spring are appropriately selected depending on the intended purpose without any limitation.

Examples of the material of the flat spring include polymer materials and metals. Examples of the polymer materials include polyethylene, polypropylene, polyethylene terephthalate, polyvinyl chloride, polyimide resins, fluororesins, and acrylic resins. Examples of the metals include iron, copper, aluminium, stainless steel, and phosphor bronze. The metal may be coated with the polymer material to achieve electric insulation.

The element illustrated in FIG. 10 has an extremely high restoring force owing to springiness of the flat spring, because the flat spring 34 is used as one of the constitutional members of the element. Accordingly, stability of the element to repetitive use can be further enhanced. In the case where the flat spring 34 has a convex shape, moreover, the element is easily deformed compared to an element having a flat surface, when an external force is applied by bringing a smooth surface having a high rigidity into contact with the element. Accordingly, electricity can be generated regardless of an embodiment of an external force to be in contact with the element.

Figure 11:
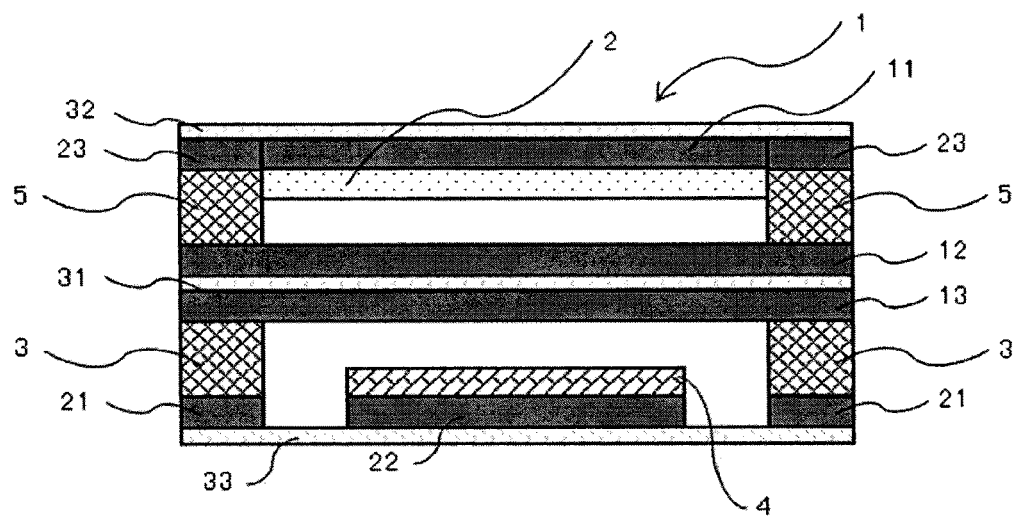
FIG. 11 is a schematic cross-sectional view illustrating another example of an element of the present invention.

FIG. 11 is a schematic cross-sectional view illustrating another example of the element of the present invention. The element 1 illustrated in FIG. 11 includes an electrode 11, an electrode 12, an electrode 13, an electrode 21, an electrode 22, an electrode 23, an intermediate layer 5 disposed between the electrode 23 and the electrode 12, an intermediate layer 3 disposed between the electrode 13 and the electrode 21, an intermediate layer 2, an intermediate layer 4, a supporting member 32 disposed above the electrode 11 and the electrode 23, a supporting member 31 disposed between the electrode 12 and the electrode 13, and a supporting member 33 disposed under the electrode 21 and the electrode 22.

A thickness of the intermediate layer 2 is smaller than a thickness of the intermediate layer 5, and the element 1 has a structure where a space is disposed between the intermediate layer 2 and the electrode 12. Moreover, a total thickness of the intermediate layer 4 and the electrode 22 is smaller than a total thickness of the intermediate layer 3 and the electrode 21, and the element 1 has a structure where a space is disposed between the electrode 13 and the intermediate layer 4.

Shapes of the intermediate layer 2, the intermediate layer 3, the intermediate layer 4, and the intermediate layer 5 are appropriately selected depending on the intended purpose without any limitation. Examples of the shape of each intermediate layer in a planar view include a circle, an oval, a square, a rectangle, and a triangle.

A layout pattern of the intermediate layer 2, the intermediate layer 3, the intermediate layer 4, and the intermediate layer 5 is appropriately selected depending on the intended purpose without any limitation. Examples of the layout pattern in a planar view include layout patterns illustrated in FIGS. 9A to 9I.

The electrode 11, the electrode 12, and the electrode 13 are preferably composed of a material having flexibility (elasticity) to correspond to elongation and deformation of the intermediate layer 2.

The supporting member 31 and the supporting member 32 are preferably composed of a material having flexibility (elasticity) to correspond to elongation and deformation of the intermediate layer 2.

When there is a possibility that an electric contact between the electrodes and the intermediate layer is not ensured because of the deformed intermediate layer, the electrodes are preferably bonded to part or an entire surface of the intermediate layer. Examples of a bonding method include methods using conductive bonding agents or adhesives.

The element illustrated in FIG. 11 has a high power-generating performance because the intermediate layers therein are easily deformed with a small external force. Moreover, the element has a high restoring force and excellent stability to repetitive use, because an elastic deformation of the intermediate layer caused by application of an external force includes different types of elastic deformations where the deformation states (e.g., elongation and compression) and deformation directions (e.g., an oblique direction and a parallel direction), compared to a case where, for example, the intermediate layer is relatively compressed and deformed to a direction that is parallel to a direction in which an external force is applied. A timing (phase) of power generation is deviated to prolong a duration of power generation, because elastic deformations having different deformation states (e.g., elongation and compression) and deformation directions (e.g., an oblique direction and a parallel direction) coexist. Accordingly, a power generation efficiency can be improved. Moreover, a space can be maintained between the intermediate layer 2 and the electrode 12 because the supporting member 32 is disposed. Furthermore, a space can be maintained between the electrode 13 and the intermediate layer 4 because the supporting member 33 is disposed. As a result, a distance between the electrode 11 and the electrode 12, and also a distance between the electrode 13 and the electrode 22 change with a small external force to largely change an electrostatic capacity of the element. Accordingly, a power-generating performance of the element can be improved. Even in the case where a timing (phase) of power generation is deviated between the intermediate layer 2, the intermediate layer 3, the intermediate layer 4, and the intermediate layer 5, power outputs do not cancel each other out because the power output of the intermediate layer 2, the power output of the intermediate layer 3, the power output of the intermediate layer 4, and the power output of the intermediate layer 5 are separated with the supporting member 31. Accordingly, a power generation efficiency can be improved. Moreover, a mechanical strength of the element is enhanced, because the number of constitutional members is increased within a range that does not adversely affect deformation of the element. Accordingly, stability of the element to repetitive use can be improved. Moreover, a deformation amount of the intermediate layer 2 can be made large, because the intermediate layer 2 is disposed at the upper layer side, and the intermediate layer 4 is disposed at the lower layer side. Accordingly, the element has a high power-generating performance.

Figure 12:
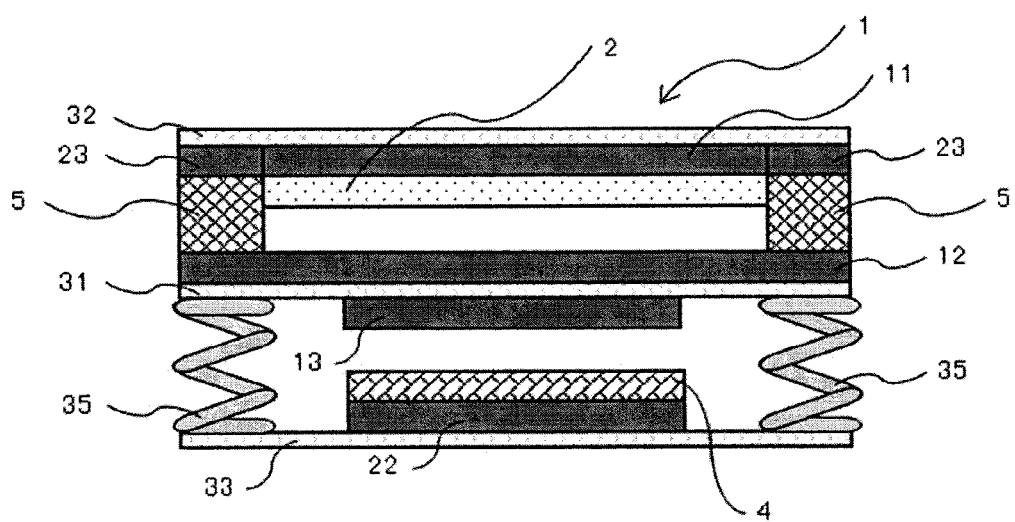
FIG. 12 is a schematic cross-sectional view illustrating another example of an element of the present invention.

FIG. 12 is a schematic cross-sectional view illustrating another example of the element of the present invention. The element illustrated in FIG. 12 has a structure where part of the constitutional members of the element illustrated in FIG. 11 is replaced with coil springs 35.

A material, a shape, and a size of the coil spring are appropriately selected depending on the intended purpose without any limitation.

Examples of the material of the coil spring include polymer materials, metals, and piano wire. Examples of the polymer materials include polyethylene, polypropylene, polyethylene terephthalate, polyvinyl chloride, polyimide resins, fluororesins, and acrylic resins. Examples of the metals include iron, copper, aluminium, stainless steel, and phosphor bronze. The metal may be coated with the polymer material to achieve electric insulation.

The element illustrated in FIG. 12 has an extremely high restoring force owing to springiness of the coil springs, because the coil springs 35 are used as part of the constitutional members of the element. Accordingly, stability of the element to repetitive use can be further enhanced.

Figure 13A:
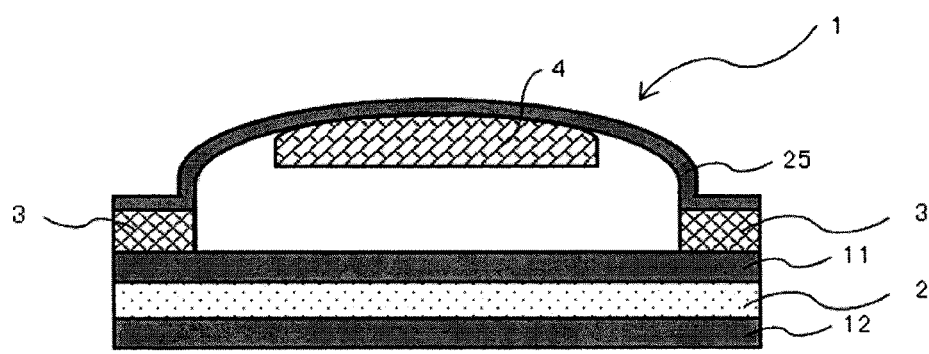
FIG. 13A is a schematic cross-sectional view illustrating another example of an element of the present invention in a steady state.

FIG. 13A is a schematic cross-sectional view illustrating another example of the element of the present invention. The element 1 illustrated in FIG. 13A includes an electrode 11, an electrode 12, an electrode 25, an intermediate layer 2 disposed between the electrode 11 and the electrode 12, an intermediate layer 3 disposed between the electrode 25 and the electrode 11, and an intermediate layer 4.

The electrode 25 has a convex shape, and the element 1 has a structure where a space is disposed between the intermediate layer 4 and the electrode 11.

Shapes of the intermediate layer 2, the intermediate layer 3, and the intermediate layer 4 are appropriately selected depending on the intended purpose without any limitation. Examples of the shape thereof in a planar view include a circle, an oval, a square, a rectangle, and a triangle.

Figure 14A:
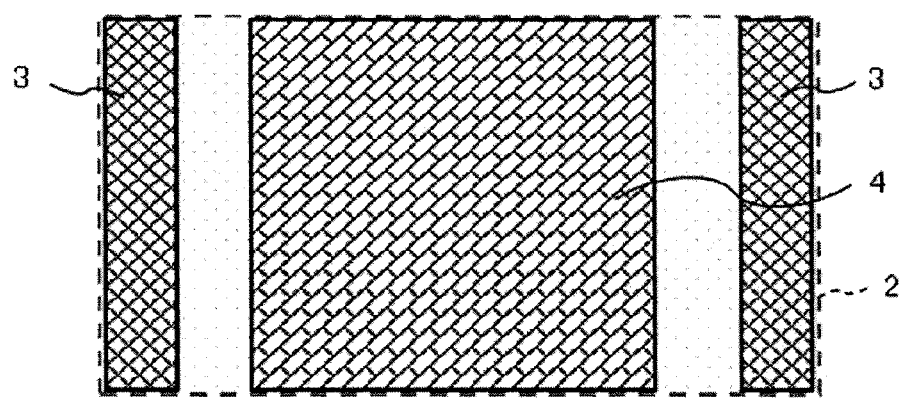
FIG. 14A is a perspective plan view illustrating one example of a layout pattern of the intermediate layers in the element illustrated in FIG. 13A.
Figure 14B:
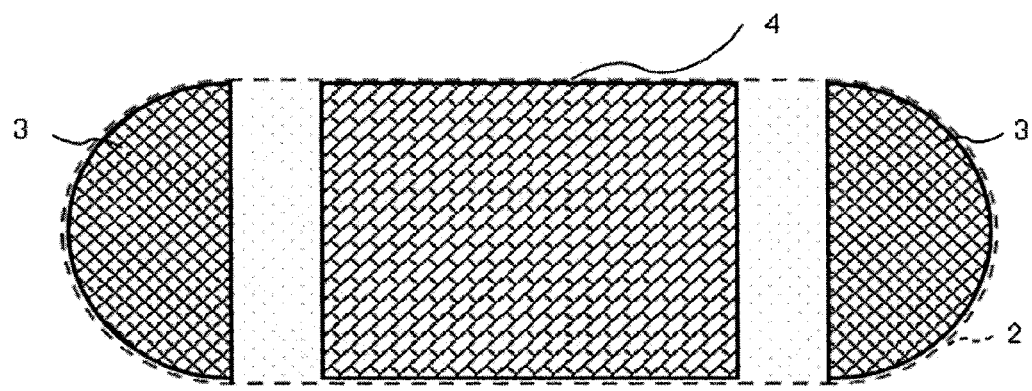
FIG. 14B is a perspective plan view illustrating another example of a layout pattern of the intermediate layers in the element illustrated in FIG. 13A.

A layout pattern of the intermediate layer 2, the intermediate layer 3, and the intermediate layer 4 is appropriately selected depending on the intended purpose without any limitation. Examples of the layout pattern thereof in a planar view include layouts where the intermediate layer 3 is disposed to overlap with part of an edge of the intermediate layer 2, and the intermediate layer 4 is further disposed to overlap with a center part of the intermediate layer 2, as illustrated in FIGS. 14A to 14B.

Figure 13B:
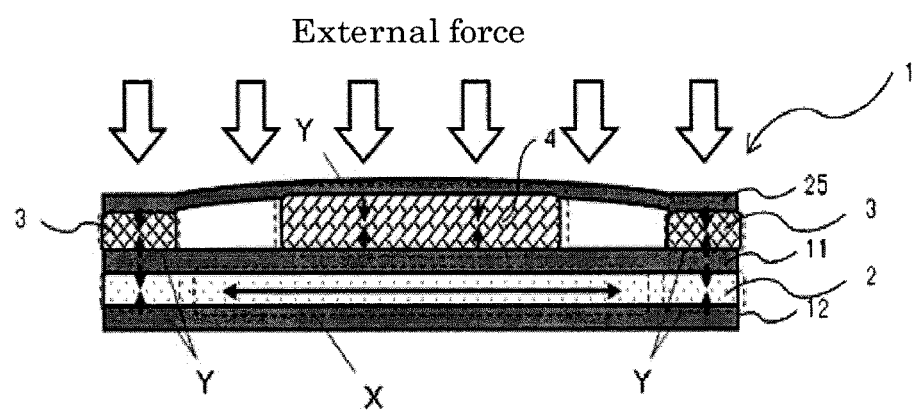
FIG. 13B is a schematic cross-sectional view illustrating another example of an element of the present invention in a state where an external force is applied to the element.

When an external force is applied to the element 1, as illustrated in FIG. 13B, the convex part of the electrode 25 is spread to both sides to be squeezed approximately flat. Along with the aforementioned spread, the intermediate layer 3 and the intermediate layer 4 are compressed to decrease thicknesses thereof, and the intermediate layer 2 is pulled and stretched. As a result, the intermediate layer 2 is relatively elongated and deformed in a vertical direction relative to a direction in which the external force is applied, to thereby generate electricity. Moreover, the intermediate layer 3 and the intermediate layer 4 are relatively compressed and deformed in a parallel direction relative to the direction in which the external force is applied, to thereby generate electricity. When the external force is eliminated, the intermediate layer 2, the intermediate layer 3, and the intermediate layer 4 return back to the original shapes, because the intermediate layer 2, the intermediate layer 3, and the intermediate layer 4 have elasticity. Electricity is also generated when the intermediate layer 2, the intermediate layer 3, and the intermediate layer 4 return back to the original shapes.

The electrode 11 and the electrode 12 are preferably composed of a material having flexibility (elasticity) to correspond to elongation and deformation of the intermediate layer 2.

When there is a possibility that an electric contact between the electrodes and the intermediate layer is not ensured because of the deformed intermediate layer, the electrodes are preferably bonded to part or an entire surface of the intermediate layer. Examples of a bonding method include methods using conductive bonding agents or adhesives.

The element illustrated in FIG. 13A has a high power-generating performance because the element is formed of only members contributing to power generation, and the intermediate layers therein are easily deformed with a small external force. Moreover, the element has a high restoring force and excellent stability to repetitive use, because an elastic deformation of the intermediate layer caused by application of an external force includes different types of elastic deformations where the deformation states (e.g., elongation and compression) and deformation directions (e.g., an oblique direction and a parallel direction), compared to a case where, for example, the intermediate layer is relatively compressed and deformed to a direction that is parallel to a direction in which an external force is applied. A timing (phase) of power generation is deviated to prolong a duration of power generation, because elastic deformations having different deformation states (e.g., elongation and compression) and deformation directions (e.g., an oblique direction and a parallel direction) coexist. Accordingly, a power generation efficiency can be improved. Moreover, a space can be maintained between the intermediate layer 4 and the electrode 11 because the electrode 25 has a convex shape. As a result, a distance between the electrode 25 and the electrode 11 changes to largely change an electrostatic capacity of the element. Accordingly, a power-generating performance of the element can be improved. The element is easily deformed compared to an element having a flat surface because the electrode 25 of the element has the convex shape, when an external force is applied by bringing a smooth surface having a high rigidity into contact with the element. Accordingly, electricity can be generated regardless of an embodiment of an external force to be in contact with the element.

Figure 15:
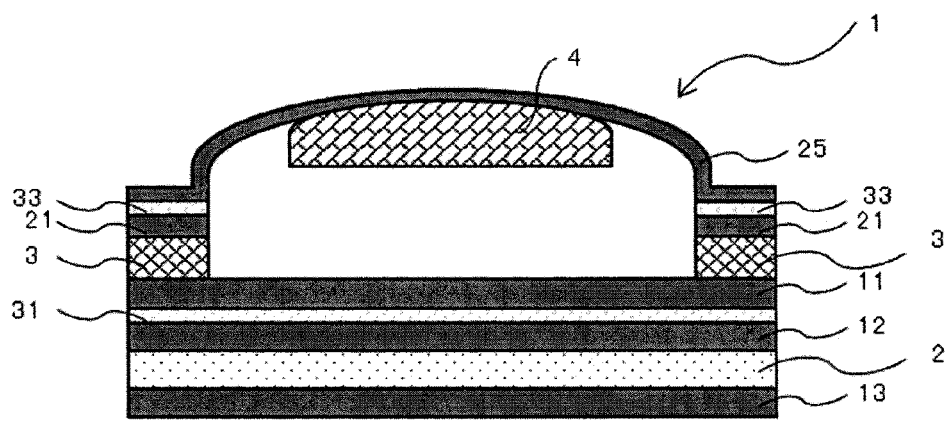
FIG. 15 is a schematic cross-sectional view illustrating another example of an element of the present invention.

FIG. 15 is a schematic cross-sectional view illustrating another example of the element of the present invention. The element 1 illustrated in FIG. 15 includes an electrode 11, an electrode 12, an electrode 13, an electrode 21, an electrode 25, an intermediate layer 2 disposed between the electrode 12 and the electrode 13, an intermediate layer 3 disposed between the electrode 21 and the electrode 11, an intermediate layer 4, a supporting member 31 disposed between the electrode 11 and the electrode 12, and a supporting member 33 disposed between the electrode 25 and the electrode 21.

The electrode 25 has a convex shape, and the element 1 has a structure where a space is disposed between the intermediate layer 4 and the electrode 11.

Shapes of the intermediate layer 2, the intermediate layer 3, and the intermediate layer 4 are appropriately selected depending on the intended purpose without any limitation. Examples of the shape thereof in a planar view include a circle, an oval, a square, a rectangle, and a triangle.

A layout pattern of the intermediate layer 2, the intermediate layer 3, and the intermediate layer 4 is appropriately selected depending on the intended purpose without any limitation. Examples of the layout pattern thereof in a planar view include layout patterns illustrated in FIGS. 14A to 14B.

The electrode 11, the electrode 12, and the electrode 13 are preferably composed of a material having flexibility (elasticity) to correspond to elongation and deformation of the intermediate layer 2.

The supporting member 31 is preferably composed of a material having flexibility (elasticity) to correspond to elongation and deformation of the intermediate layer 2.

When there is a possibility that an electric contact between the electrodes and the intermediate layer is not ensured because of the deformed intermediate layer, the electrodes are preferably bonded to part or an entire surface of the intermediate layer. Examples of a bonding method include methods using conductive bonding agents or adhesives.

The element illustrated in FIG. 15 has a high power-generating performance because the intermediate layers therein are easily deformed with a small external force. Moreover, the element has a high restoring force and excellent stability to repetitive use, because an elastic deformation of the intermediate layer caused by application of an external force includes different types of elastic deformations where the deformation states (e.g., elongation and compression) and deformation directions (e.g., an oblique direction and a parallel direction), compared to a case where, for example, the intermediate layer is relatively compressed and deformed to a direction that is parallel to a direction in which an external force is applied. A timing (phase) of power generation is deviated to prolong a duration of power generation, because elastic deformations having different deformation states (e.g., elongation and compression) and deformation directions (e.g., an oblique direction and a parallel direction) coexist. Accordingly, a power generation efficiency can be improved. Moreover, a space can be maintained between the intermediate layer 4 and the electrode 11 because the electrode 25 has a convex shape. As a result, a distance between the electrode 25 and the electrode 11 changes to largely change an electrostatic capacity of the element. Accordingly, a power-generating performance of the element can be improved. The element is easily deformed compared to an element having a flat surface because the electrode 25 of the element has the convex shape, when an external force is applied by bringing a smooth surface having a high rigidity into contact with the element. Accordingly, electricity can be generated regardless of an embodiment of an external force to be in contact with the element. Even in the case where a timing (phase) of power generation is deviated between the intermediate layer 2, the intermediate layer 3, and the intermediate layer 4, moreover, power outputs do not cancel each other out because the power output of the intermediate layer 2, the power output of the intermediate layer 3, and the power output of the intermediate layer 4 are separated with the supporting member 31 and the supporting member 33. Accordingly, a power generation efficiency can be improved. Moreover, a mechanical strength of the element is enhanced, because the number of constitutional members is increased within a range that does not adversely affect deformation of the element. Accordingly, stability of the element to repetitive use can be improved.

Figure 16:
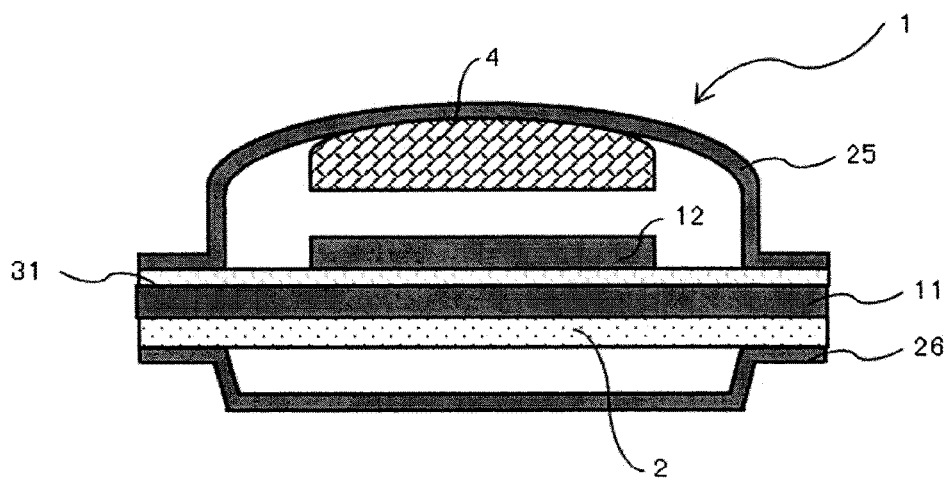
FIG. 16 is a schematic cross-sectional view illustrating another example of an element of the present invention.

FIG. 16 is a schematic cross-sectional view illustrating another example of the element of the present invention. The element 1 illustrated in FIG. 16 includes an electrode 11, an electrode 12, an electrode 25, an electrode 26, an intermediate layer 2 disposed between the electrode 11 and the electrode 26, an intermediate layer 4 disposed between the electrode 25 and the electrode 12, and a supporting member 31 disposed between the electrode 11 and the electrode 12.

Each of the electrode 25 and the electrode 26 has a convex shape, and the element 1 has a structure where a space is disposed between the intermediate layer 4 and the electrode 12, and another space is disposed between the intermediate layer 2 and the electrode 26.

Shapes of the intermediate layer 2 and the intermediate layer 4 are appropriately selected depending on the intended purpose without any limitation. Examples of the shape of each intermediate layer in a planar view include a circle, an oval, a square, a rectangle, and a triangle.

A layout pattern of the intermediate layer 2 and the intermediate layer 4 is appropriately selected depending on the intended purpose without any limitation. Examples of the layout pattern thereof in a planar view include layout patterns illustrated in FIGS. 17A to 17B.

The electrode 11 and the electrode 12 are preferably composed of a material having flexibility (elasticity) to correspond to elongation and deformation of the intermediate layer 2.

The supporting member 31 is preferably composed of a material having flexibility (elasticity) to correspond to elongation and deformation of the intermediate layer 2.

When there is a possibility that an electric contact between the electrodes and the intermediate layer is not ensured because of the deformed intermediate layer, the electrodes are preferably bonded to part or an entire surface of the intermediate layer. Examples of a bonding method include methods using conductive bonding agents or adhesives.

The element illustrated in FIG. 16 has a high power-generating performance because the intermediate layers therein are easily deformed with a small external force. Moreover, the element has a high restoring force and excellent stability to repetitive use, because an elastic deformation of the intermediate layer caused by application of an external force includes different types of elastic deformations where the deformation states (e.g., elongation and compression) and deformation directions (e.g., an oblique direction and a parallel direction), compared to a case where, for example, the intermediate layer is relatively compressed and deformed to a direction that is parallel to a direction in which an external force is applied. A timing (phase) of power generation is deviated to prolong a duration of power generation, because elastic deformations having different deformation states (e.g., elongation and compression) and deformation directions (e.g., an oblique direction and a parallel direction) coexist. Accordingly, a power generation efficiency can be improved. Moreover, a space is maintained between the intermediate layer 4 and the electrode 12, and a space is maintained between the intermediate layer 2 and the electrode 26 because the electrodes 25 and 26 have convex shapes. As a result, distances between the electrodes change to largely change an electrostatic capacity of the element. Accordingly, a power-generating performance of the element can be improved. The element is easily deformed compared to an element having a flat surface because the electrodes 25 and 26 of the element have the convex shapes, when an external force is applied by bringing a smooth surface having a high rigidity into contact with the element. Accordingly, electricity can be generated regardless of an embodiment of an external force to be in contact with the element. Moreover, the element has an extremely high restoring force, and stability of the element to repetitive use can be further enhanced, because the electrodes 25 and 26 have the convex shapes. Even in the case where a timing (phase) of power generation is deviated between the intermediate layer 2 and the intermediate layer 4, moreover, power outputs do not cancel each other out because the power output of the intermediate layer 2 and the power output of the intermediate layer 4 are separated with the supporting member 31. Accordingly, a power generation efficiency can be improved.

(Electric Generator)

An electric generator of the present invention includes the element of the present invention. The electric generator may further include other members, if necessary.

The electric generator has a high power-generating performance and excellent stability to repetitive use, because the element of the present invention is used in the electric generator.

The element in the electric generator of the present invention deforms to generate electricity, when a load, such as an external force or vibration, is applied. A power generation mechanism of the electric generator of the present invention has not been clearly known yet, but it is assumed as follows. An intermediate layer adjacent to an electrode is charged in a mechanism similar to friction charging, or a charge is generated inside the intermediate layer, when a load is applied. When the element is deformed in this state, an electrostatic capacity changes to generate a surface potential difference. The charge is moved to make the surface potential difference zero to thereby generate electricity.

<Other Members>

Examples of the other members include electric wires, electric circuits, rectifier circuits, and cover materials.

—Electric Wires—

The electric wires are appropriately selected depending on the intended purpose without any limitation.

Examples of a material of the electric wires include metals and alloys. Examples of the metals include gold, silver, copper, aluminium, and nickel.

A structure, shape, and thickness of each electric wire are not particularly limited, and are appropriately selected depending on the electric generator.

The electric wires are preferably covered with an electric insulating material, other than connection areas of the electric wires.

—Electric Circuits—

The electric circuits are appropriately selected depending on the intended purpose without any limitation, as long as the electric circuits are circuits for drawing electricity generated by the element.

Examples of the electric circuits include oscilloscopes, voltmeters, ammeters, storage circuits, LEDs, and various sensors (e.g., ultrasonic sensors, pressure sensors, tactile sensors, distortion sensors, acceleration sensors, shock sensors, vibration sensors, pressure-sensitive sensors, electric field sensors, and sound pressure sensors).

—Rectifier Circuits—

The rectifier circuits are appropriately selected depending on the intended purpose without any limitation. Examples of the rectifier circuits include half-wave rectifier circuits and diode bridges.

—Cover Materials—

The cover materials are appropriately selected depending on the intended purpose without any limitation.

Examples of a material of the cover materials include polymer materials and rubber.

Examples of the polymer materials include polyethylene, polypropylene, polyethylene terephthalate, polyvinyl chloride, polyimide resins, fluororesins, and acrylic resins.

Examples of the rubber include silicone rubber, fluoro silicone rubber, fluororubber, urethane rubber, acrylic rubber, chloroprene rubber, butyl rubber, ethylene propylene rubber, nitrile rubber, polysulfide rubber, and natural rubber (latex).

Examples of a foam of the cover material include sheets and sponges.

A structure, a shape, a size, and a thickness of the cover material are not particularly limited, and are appropriately selected depending on an electric generator to be produced.

The electric generator of the present invention is described with reference to drawings.

Figure 18:
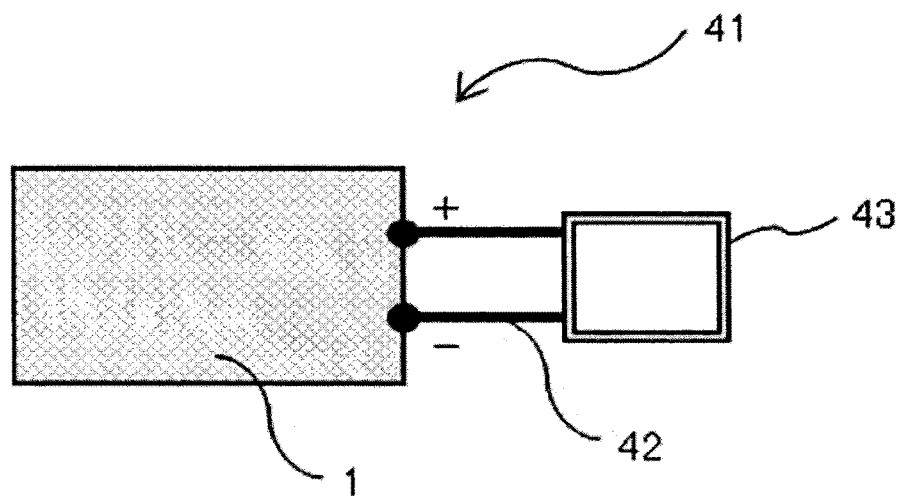
FIG. 18 is a schematic cross-sectional view illustrating one example of a structure of an electric generator of the present invention.

FIG. 18 is a cross-sectional view illustrating one example of a structure of the electric generator of the present invention. The electric generator 41 illustrated in FIG. 18 contains an element 1, electric wires 42 and an electric circuit 43. The electric generator illustrated in FIG. 18 has a high power-generating performance.

Figure 19:
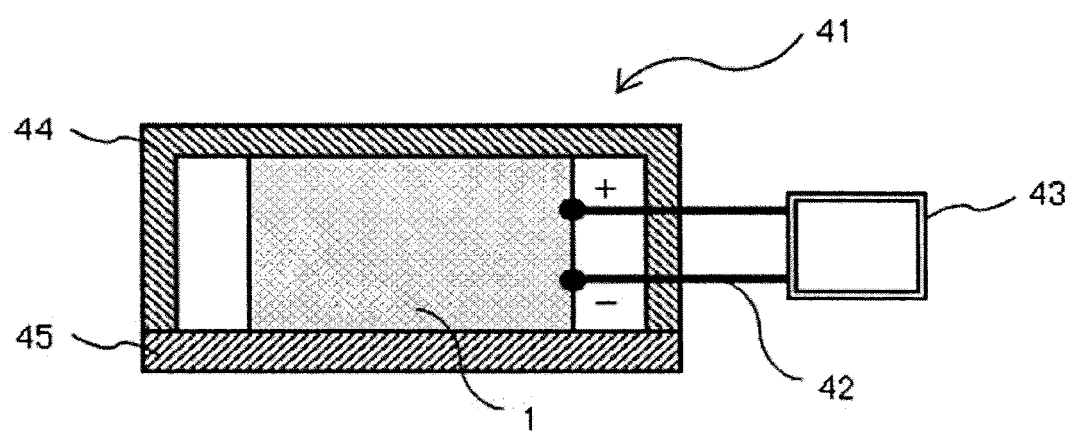
FIG. 19 is a schematic cross-sectional view illustrating another example of a structure of an electric generator of the present invention.

FIG. 19 is a cross-sectional view illustrating another example of a structure of the electric generator of the present invention. The electric generator 41 illustrated in FIG. 19 contains an element 1, electric wires 42, an electric circuit 43, a cover material 44, and a cover material 45. Note that, the electric generator may use only the cover material 44 or the cover material 45 as a cover material.

The electric generator illustrated in FIG. 19 can be prevented from being damaged because the cover materials are disposed.

Figure 20:
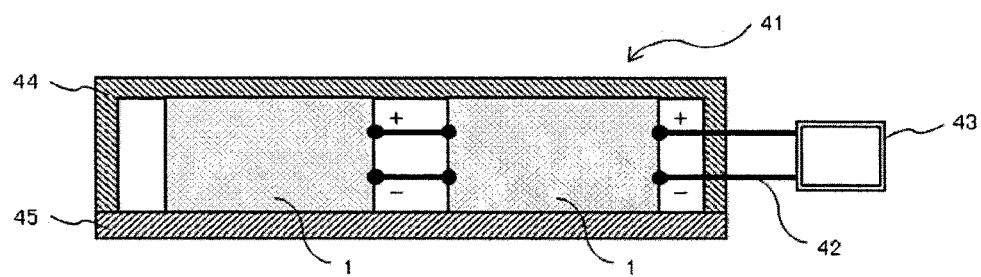
FIG. 20 is a schematic cross-sectional view illustrating another example of a structure of an electric generator of the present invention.

FIG. 20 is a cross-sectional view illustrating another example of a structure of the electric generator of the present invention. The electric generator 41 illustrated in FIG. 20 contains two elements 1, where the elements are connected in series. Note that, the number of the elements disposed may be 2 or greater.

The electric generator illustrated in FIG. 20 can obtain large output current, because the elements are connected in series.

Figure 21:
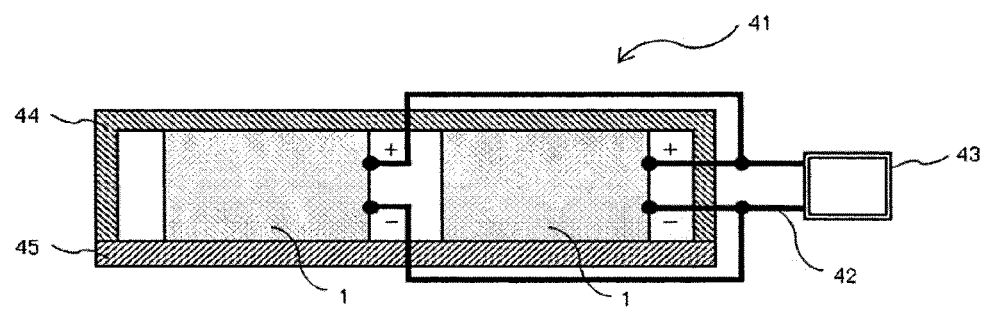
FIG. 21 is a schematic cross-sectional view illustrating another example of a structure of an electric generator of the present invention.

FIG. 21 is a cross-sectional view illustrating another example of a structure of the electric generator of the present invention. The electric generator 41 illustrated in FIG. 21 contains two elements 1, where the elements are connected in parallel. Note that, the number of the elements disposed may be 2 or greater.

The electric generator illustrated in FIG. 21 can obtain large output current, because the elements are connected in parallel.

FIGS. 22A to 22D are views illustrating examples of connection wiring of the element of the present invention. In the aforementioned views, an example of the connection wiring of the element illustrated in FIG. 1A is described, but the element is not limited to the one illustrated in FIG. 1A. The element illustrated in FIG. 1A contains an electrode 11 as a positive electrode, and an electrode 12 and an electrode 21 as negative electrodes. Note that, the positive electrode and the negative electrodes may be reversed.

Figure 22A:
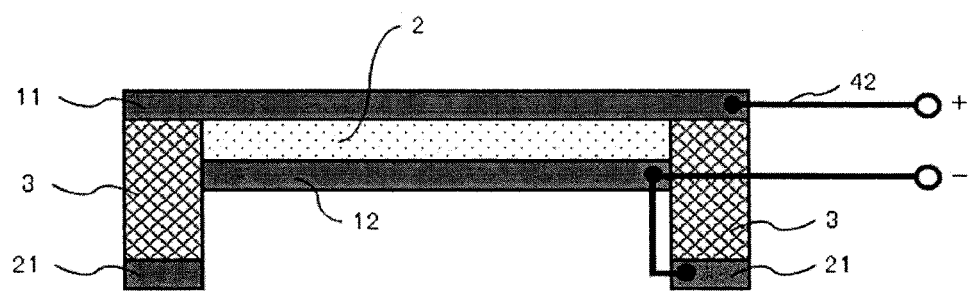
FIG. 22A is a view illustrating one example of connection wiring for an element of the present invention.

In FIG. 22A, a pair of the electrodes sandwiching the intermediate layer 2 and a pair of the electrodes sandwiching the intermediate layer 3 are connected in series, and the positive electrodes correspond to each other and the negative electrodes correspond to each other.

Figure 22B:
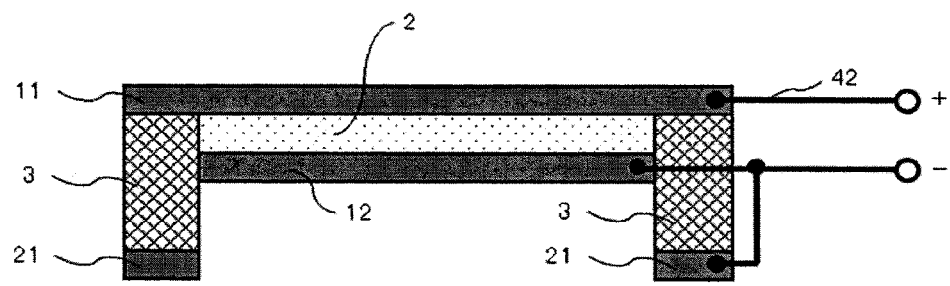
FIG. 22B is a view illustrating another example of connection wiring for an element of the present invention.

In FIG. 22B, a pair of the electrodes sandwiching the intermediate layer 2 and a pair of the electrodes sandwiching the intermediate layer 3 are connected in parallel, and the positive electrodes correspond to each other and the negative electrodes correspond to each other.

Figure 22C:
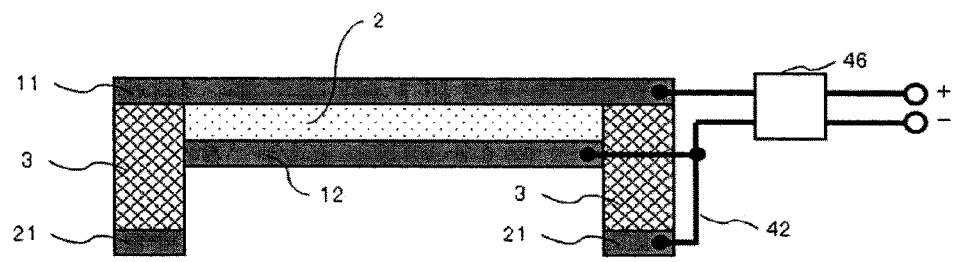
FIG. 22C is a view illustrating another example of connection wiring for an element of the present invention.

In FIG. 22C, a pair of the electrodes sandwiching the intermediate layer 2 and a pair of the electrodes sandwiching the intermediate layer 3 are connected in parallel, and the positive electrodes correspond to each other and the negative electrodes correspond to each other; and are further connected to a rectifier circuit 46.

Figure 22D:
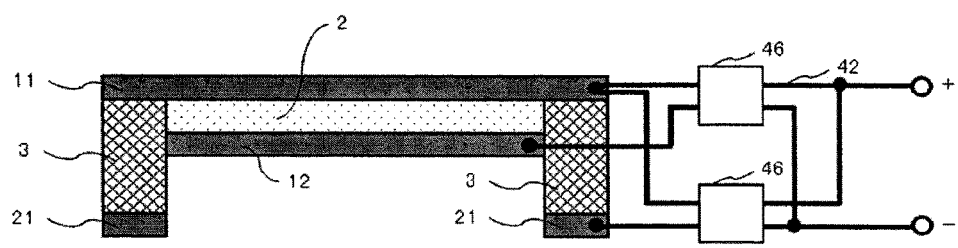
FIG. 22D is a view illustrating another example of connection wiring for an element of the present invention.

In FIG. 22D, a pair of the electrodes sandwiching the intermediate layer 2 and a pair of the electrodes sandwiching the intermediate layer 3 are each connected to the rectifier circuits 46, and the positive electrodes of the rectifier circuits are connected to each other in parallel and the negative electrodes of the rectifier circuits are connected to each other in parallel.

<Use>

The electric generator is suitably used for various sensors, such as ultrasonic sensors, pressure sensors, tactile sensors, distortion sensors, acceleration sensors, shock sensors, vibration sensors, pressure-sensitive sensors, electric field sensors, and sound pressure sensors, and is particularly suitably used for wearable sensors, because application of high voltage is not required. Moreover, the electric generator is suitably used as a piezoelectric film having excellent processability in head phones, speakers, microphones, hydrophones, displays, fans, pumps, variable focal lenses, ultrasonic transducers, piezoelectric transformers, sound insulators, soundproofing materials, actuators, or keyboards. Moreover, the electric generator can be used for audio systems, information processing devices, measuring devices, medical devices, vehicles, buildings, damping materials used for sports equipment, such as ski, and rackets, and other fields.

Furthermore, the electric generator is suitably used for the following applications.

Generation of electricity using natural energy, such as wave power, water power, and wind power.

Generation of electricity by walking by humans, when the electric generator is embedded in shoes, clothes, floors, or accessories.

Generation of electricity using vibrations caused by traveling, when the electric generator is embedded in tires of automobiles.

Moreover, the electric generator is expected to be applied as a plate electric generator prepared by forming the electric generator on a flexible substrate, a secondary battery that is charged by applying voltage, or a novel actuator (e.g., artificial muscles).

Examples (footwear, flooring materials, and wearing products) where the electric generator of the present invention is utilized for power generation by walking by human are described below.

—Footwear—

The electric generator of the present invention is attached to footwear, and electricity can be generated when the footwear is worn, followed by walking.

Types of the footwear and installation positions of the electric generator are not particularly limited, as long as the footwear includes at least the electric generator of the present invention.

Examples of the types of the footwear includes sneakers, leather shoes, pumps, high heels, slip-on shoes, sandals, slippers, boots, climbing shoes, sports shores, walking shoes, running shoes, room shoes, geta clogs, flip flaps, and tabi.

The installation positions of the electric generator are not limited as long as the installation positions are positions where load are applied during walking. For example, the installation positions are preferably inner areas of insoles, mid soles, and outer soles, or whole surfaces or part (a toe area or a heel area) of underneath areas of insoles.

Figure 23:
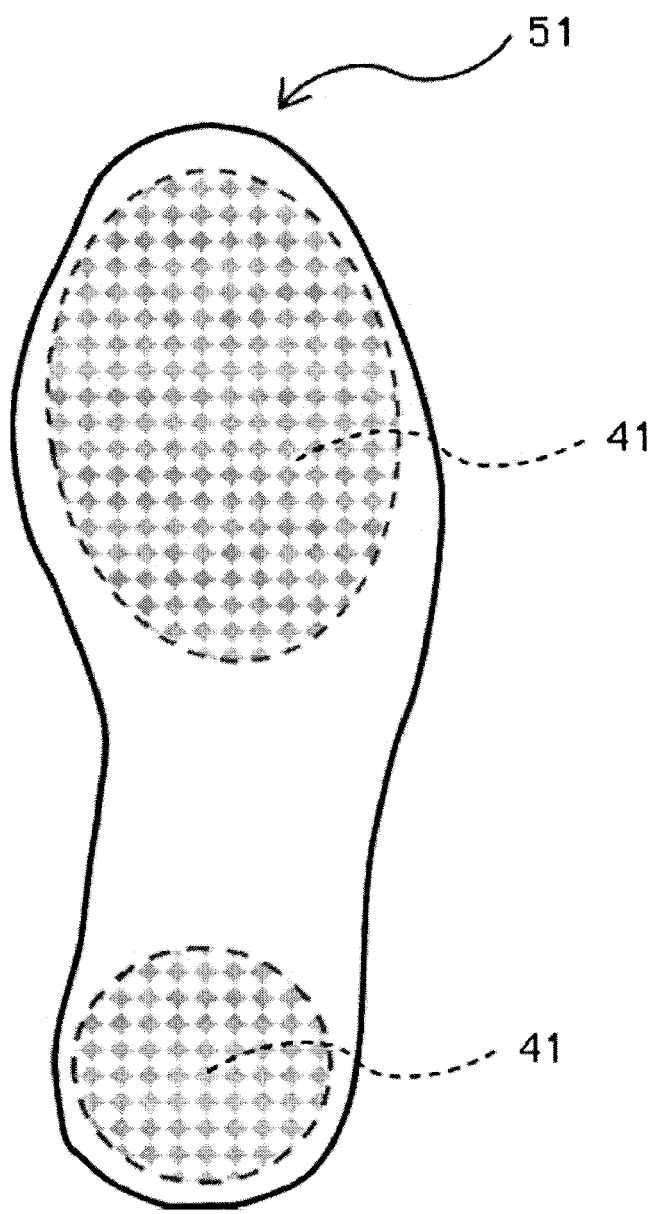
FIG. 23 is a perspective plan view illustrating an example where electric generators of the present invention are attached to an insole.

FIG. 23 is a perspective plan view illustrating an example where the electric generator of the present invention is attached to an insole. The insole 51 illustrated in FIG. 23 has a structure where the electric generators 41 of the present invention are attached to a toe area and a heel area.

—Flooring Material—

The electric generator of the present invention is attached to a flooring material, and electricity can be generated when people walk on the floor.

Types of the flooring material, and installation positions of the electric generators are not particularly limited, as long as the flooring material includes at least the electric generator of the present invention.

Examples of the types of the flooring material include wooden flooring materials, cushioning vinyl flooring materials, floor tiles, carpets, and rugs.

The installation positions of the electric generators are not limited as long as the installation positions are positions where loads are applied when people walk. For example, the installation positions are preferably a whole surface or part of a plane between a base and a flooring material constituting a floor surface, or an inner side of a flooring material.

Figure 24:
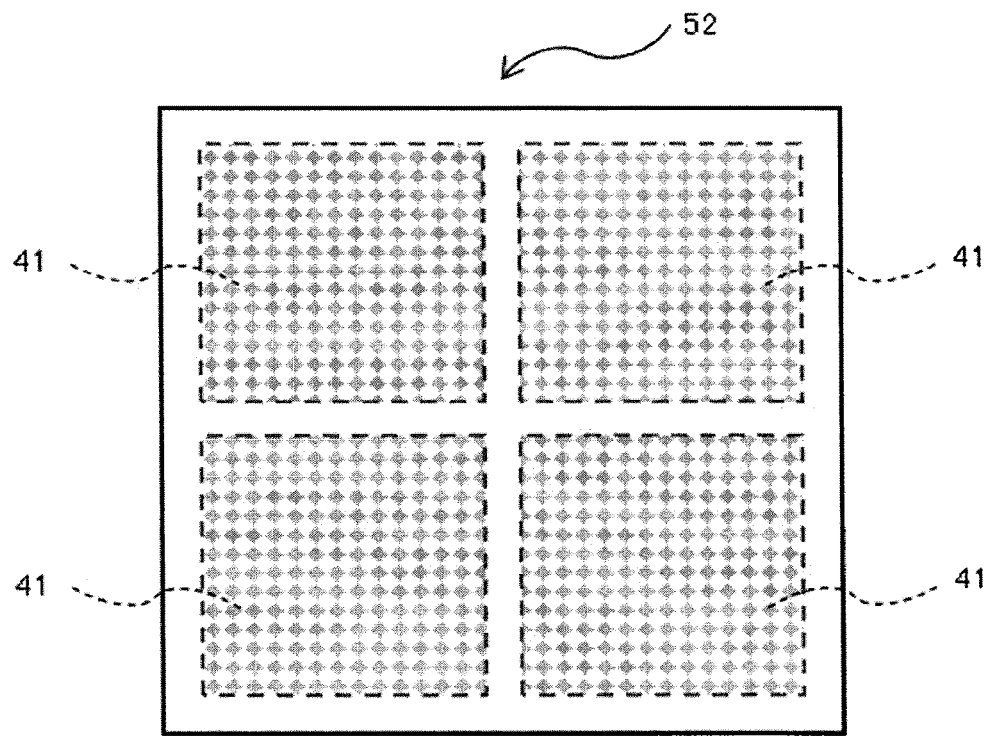
FIG. 24 is a perspective plan view illustrating an example where electric generators of the present invention are attached to a flooring tile.

FIG. 24 is a perspective plan view illustrating an example where the electric generators of the present invention are attached to a floor tile. The floor tile 52 illustrated in FIG. 24 has a structure where a plurality of the electric generators 41 of the present invention are attached.

—Wearing Product—

The electric generator of the present invention is attached to a wearing product, and electricity can be generated when the wearing product is worn, followed by moving (e.g., walking, exercising, and working).

Types of the wearing product, and installation positions of the electric generators are not particularly limited, as long as the wearing product includes at least the electric generator of the present invention.

Examples of the types of the wearing product include knee supporters, elbow supporters, back supporters, supporters for sports, medical supporters, and clothes. Among the above-listed examples, knee supporters are preferable in view of a scale of power generation.

The installation positions of the electric generators in the knee supporter are not limited as long as the installation positions are positions where loads are applied during walking. For example, the installation positions are preferably whole surfaces or part (a front knee area or a back knee area) of inner sides of the supporters.

Figure 25:
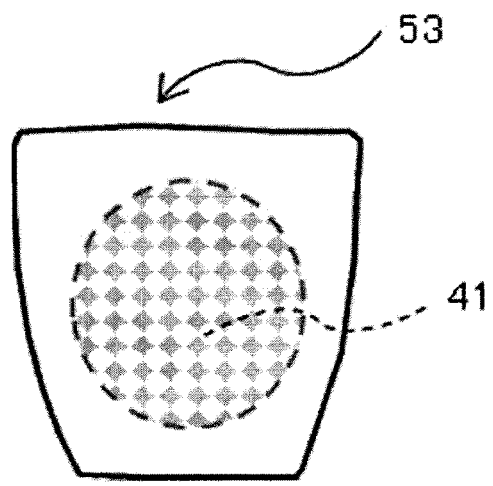
FIG. 25 is a perspective plan view illustrating an example where electric generator of the present invention is attached to a knee supporter.

FIG. 25 is a perspective plan view illustrating an example where the electric generator of the present invention is attached to a knee supporter. The knee supporter 53 illustrated in FIG. 25 has a structure where the electric generator 41 of the present invention is attached to a front knee area.

EXAMPLES

The present invention will next be described by way of Examples, but the present invention is not limited to these Examples.

Example 1

Production of Element and Electric Generator

—Production of Element—

Figure 2A:
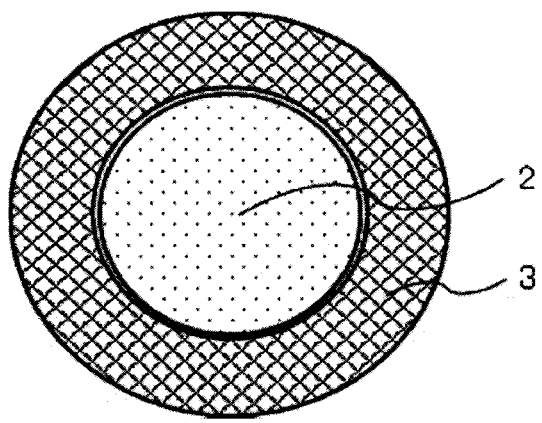
FIG. 2A is a plan view illustrating one example of a layout pattern of the intermediate layers in the element illustrated in FIG. 1A.
Figure 2B:
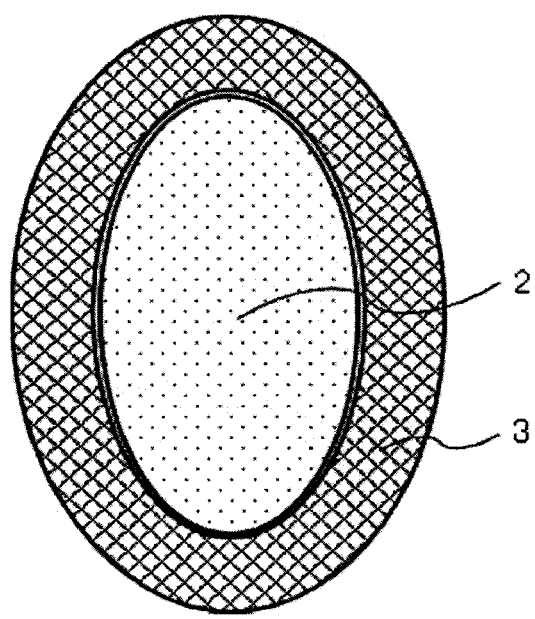
FIG. 2B is a plan view illustrating another example of a layout pattern of the intermediate layers in the element illustrated in FIG. 1A.
Figure 2C:
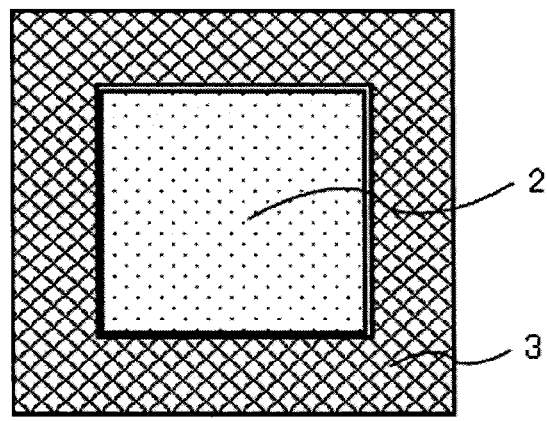
FIG. 2C is a plan view illustrating another example of a layout pattern of the intermediate layers in the element illustrated in FIG. 1A.
Figure 2D:
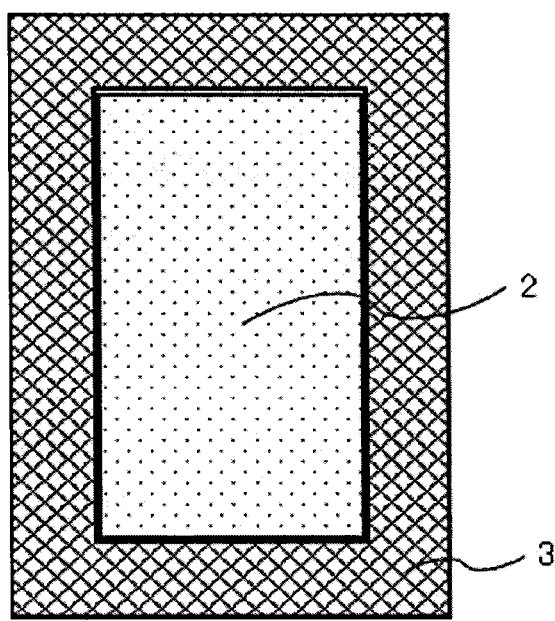
FIG. 2D is a plan view illustrating another example of a layout pattern of the intermediate layers in the element illustrated in FIG. 1A.
Figure 2E:
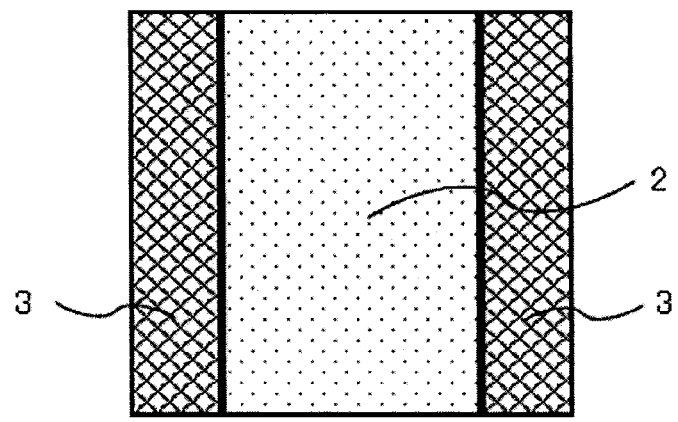
FIG. 2E is a plan view illustrating another example of a layout pattern of the intermediate layers in the element illustrated in FIG. 1A.
Figure 2F:
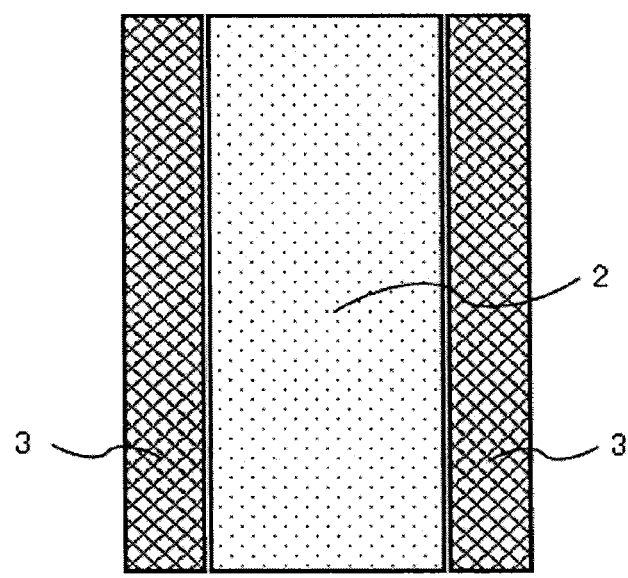
FIG. 2F is a plan view illustrating another example of a layout pattern of the intermediate layers in the element illustrated in FIG. 1A.
Figure 2G:
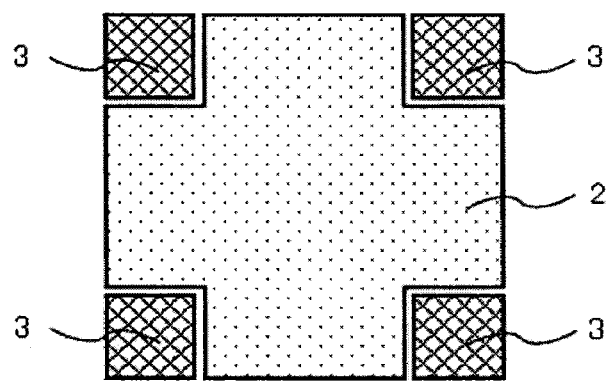
FIG. 2G is a plan view illustrating another example of a layout pattern of the intermediate layers in the element illustrated in FIG. 1A.
Figure 2H:
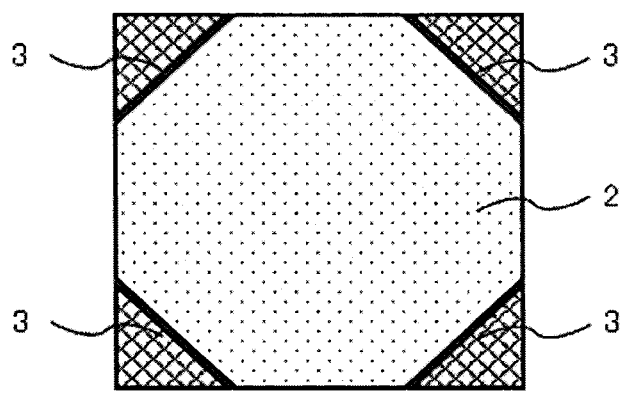
FIG. 2H is a plan view illustrating another example of a layout pattern of the intermediate layers in the element illustrated in FIG. 1A.
Figure 2I:
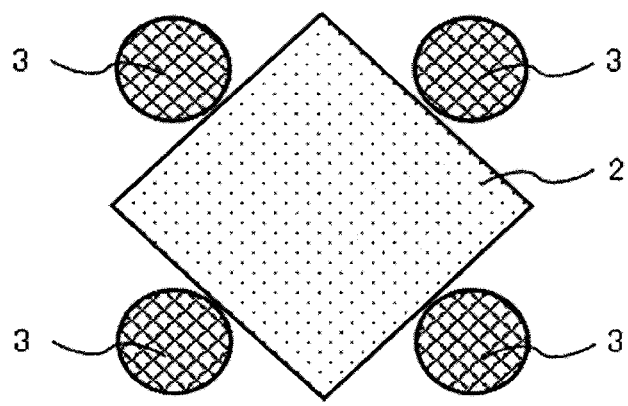
FIG. 2I is a plan view illustrating another example of a layout pattern of the intermediate layers in the element illustrated in FIG. 1A.

An element illustrated in FIG. 1A was produced in the following manner. A layout pattern of intermediate layers in the element was as illustrated in FIG. 2A.

Electrode 11: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto a fluororesin sheet (Skived tape, available from CHUOH CHEMICAL INDUSTRIES, LTD., thickness: 100 μm), followed by heating for 10 minutes at 100° C. to cure the silicone rubber composition, to thereby form a circular electrode 11 having a diameter of 80 mm, and a thickness of 100 μm.

Intermediate layer 2: Silicone rubber (KE-1603, available from Shin-Etsu Chemical Co., Ltd.) was applied onto the electrode 11, followed by heating for 10 minutes at 100° C. to cure the silicone rubber, to thereby form a circular intermediate layer 2 having a diameter of 60 mm, and a thickness of 100 μm. Moreover, a corona discharge treatment (applied voltage: 100 V, cumulative energy: 60 J/cm$^2$, reaction atmosphere: air) was performed on the intermediate layer.

Intermediate layer 3: Silicone rubber (KE-1935, available from Shin-Etsu Chemical Co., Ltd.) was applied onto the electrode 11, followed by heating for 10 minutes at 100° C. to cure the silicone rubber, to thereby form a donut-shaped intermediate layer 3 having an outer diameter of 80 mm, an inner diameter of 60 mm, and a thickness of 200 μm. Moreover, a corona discharge treatment (applied voltage: 100 V, cumulative energy: 60 J/cm$^2$, reaction atmosphere: air) was performed on the intermediate layer.

Electrode 12: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto the intermediate layer 2, followed by heating for 10 minutes at 100° C. to cure the silicone rubber composition, to thereby form a circular electrode 12 having a diameter of 60 mm, and a thickness of 50 μm.

Electrode 21: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto the intermediate layer 3, followed by heating for 30 minutes at 120° C. to cure the silicone rubber composition, to thereby form a donut-shaped electrode 21 having an outer diameter of 80 mm, an inner diameter of 60 mm, and a thickness of 100 μm. Thereafter, the fluororesin sheet was peeled.

As described above, an element of Example 1 composed of an integrated body of from the electrode 11 through the electrode 21 was produced.

—Production of Electric Generator—

Lead wires (C3/RV-90 0.75SQ, available from Taiyo Cabletec Corporation) were attached to the obtained element, and the resultant was packed with cover materials (urethane foam, PORON H-48, available from ROGERS CORPORATION, thickness: 1 mm). Moreover, the resultant was connected to an oscilloscope (WaveAce1001, available from Teledyne LeCroy Japan Corporation, resistance: 1 MΩ), to thereby produce an electric generator of Example 1, illustrated in FIG. 19. Note that, connection wiring of the element was as illustrated in FIG. 22B.

<Evaluation of Power-Generating Performance>

A load (force: 600 N, acceleration: 0.3 G) was applied 500 times onto the element part of the produced electric generator of Example 1 by a vibration tester. A peak voltage generated by the load applied for the first time, and a peak voltage generated by the load applied at the $500^{th}$ time were measured by the oscilloscope. A magnification factor of each measured value to the measured value of Comparative Example 1 described below was obtained and evaluated based on the following evaluation criteria. A result is presented in Tables 1-1-1 and 1-1-2.

[Evaluation Criteria]

Rank A: The voltages of the 1st time and the $500^{th}$ time were both 15 times or greater the voltage of the 1st time of Comparative Example 1.
Rank B: The voltages of the 1st time and the $500^{th}$ time were both 10 times or greater the voltage of the 1st time of Comparative Example 1.
Rank C: The voltages of the 1st time and the $500^{th}$ time were both 5 times or greater the voltage of the 1st time of Comparative Example 1.
Rank D: The voltages of the 1st time and the $500^{th}$ time were both 2 times or greater the voltage of the 1st time of Comparative Example 1.
Rank E: The voltages of the 1st time and the $500^{th}$ time were both greater than 1 time but less than 2 times the voltage of the 1st time of Comparative Example 1.

Example 2

Production of Element and Electric Generator

—Production of Element—

Figure 4A:
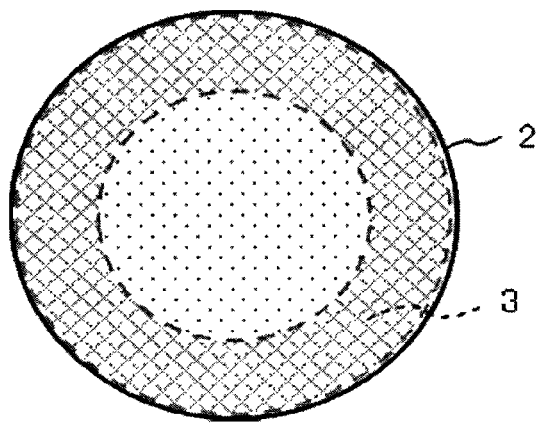
FIG. 4A is a perspective plan view illustrating one example of a layout pattern of the intermediate layers in the element illustrated in FIG. 3A.
Figure 4B:
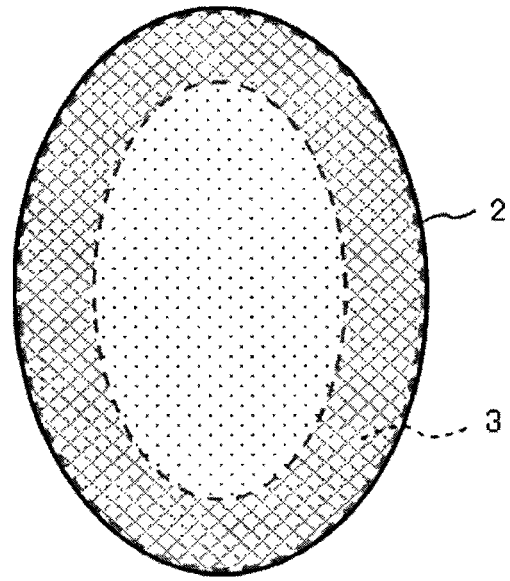
FIG. 4B is a perspective plan view illustrating another example of a layout pattern of the intermediate layers in the element illustrated in FIG. 3A.
Figure 4C:
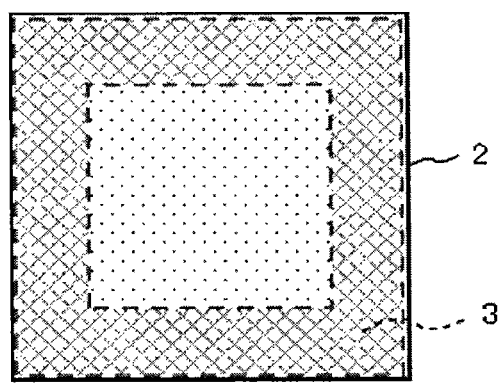
FIG. 4C is a perspective plan view illustrating another example of a layout pattern of the intermediate layers in the element illustrated in FIG. 3A.
Figure 4D:
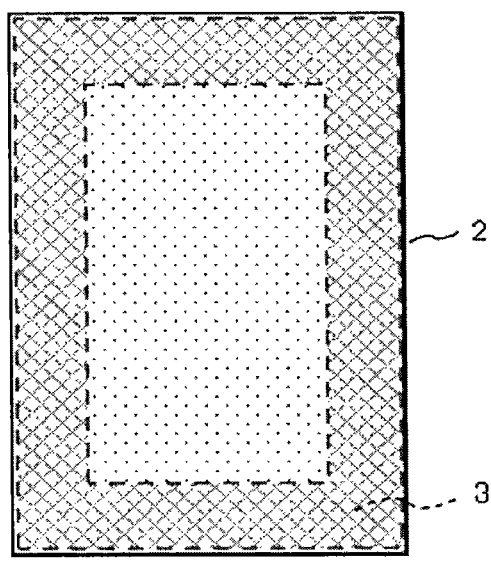
FIG. 4D is a perspective plan view illustrating another example of a layout pattern of the intermediate layers in the element illustrated in FIG. 3A.
Figure 4E:
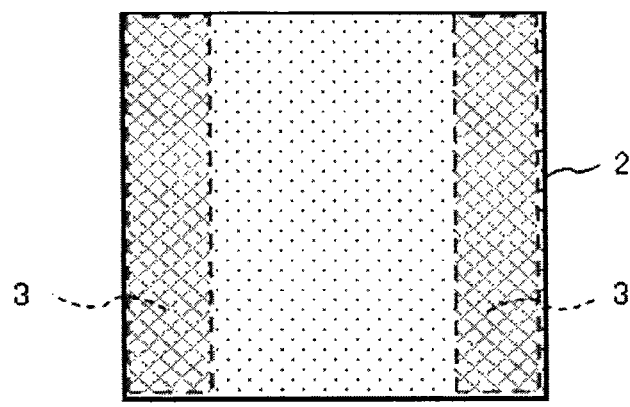
FIG. 4E is a perspective plan view illustrating another example of a layout pattern of the intermediate layers in the element illustrated in FIG. 3A.
Figure 4F:
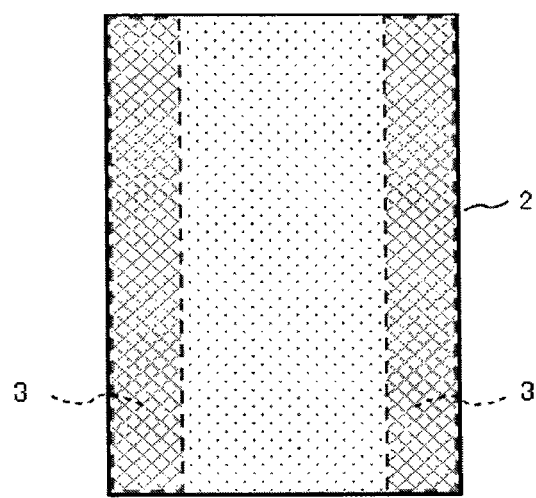
FIG. 4F is a perspective plan view illustrating another example of a layout pattern of the intermediate layers in the element illustrated in FIG. 3A.
Figure 4G:
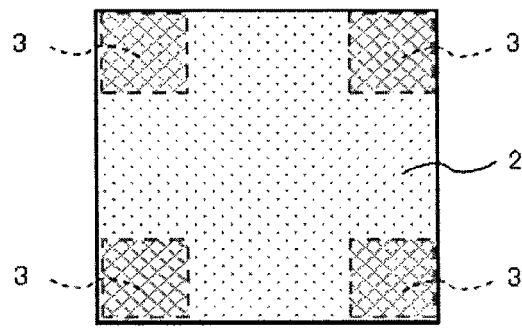
FIG. 4G is a perspective plan view illustrating another example of a layout pattern of the intermediate layers in the element illustrated in FIG. 3A.
Figure 4H:
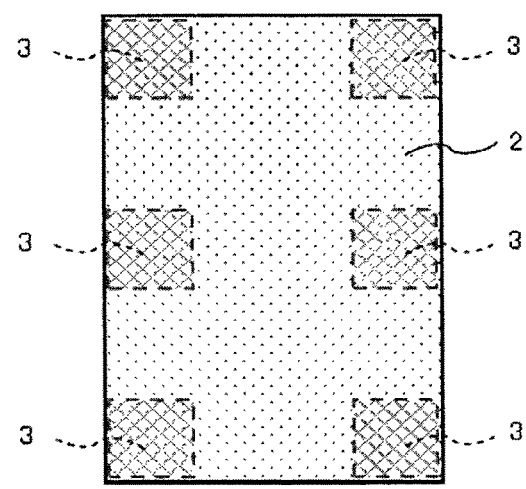
FIG. 4H is a perspective plan view illustrating another example of a layout pattern of the intermediate layers in the element illustrated in FIG. 3A.
Figure 4I:
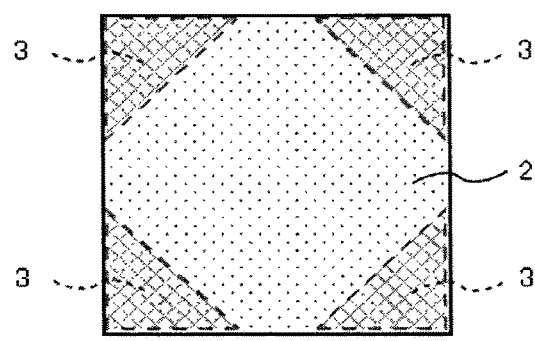
FIG. 4I is a perspective plan view illustrating another example of a layout pattern of the intermediate layers in the element illustrated in FIG. 3A.
Figure 4J:
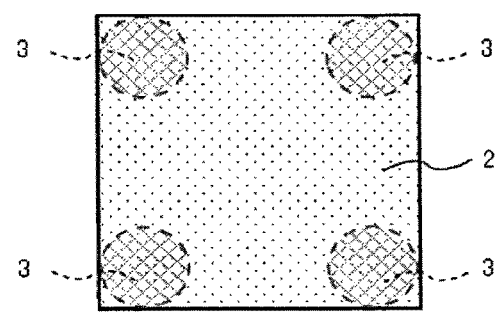
FIG. 4J is a perspective plan view illustrating another example of a layout pattern of the intermediate layers in the element illustrated in FIG. 3A.

An element illustrated in FIG. 3A was produced in the following manner. A layout pattern of intermediate layers in the element was as illustrated in FIG. 4A.

Electrode 11: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto a fluororesin sheet (Skived tape, available from CHUOH CHEMICAL INDUSTRIES, LTD., thickness: 100 μm), followed by heating for 10 minutes at 100° C. to cure the silicone rubber composition, to thereby form a circular electrode 11 having a diameter of 80 mm, and a thickness of 100 μm.

Intermediate layer 2: Silicone rubber (KE-1603, available from Shin-Etsu Chemical Co., Ltd.) was applied onto the electrode 11, followed by heating for 10 minutes at 100° C. to cure the silicone rubber, to thereby form a circular intermediate layer 2 having a diameter of 80 mm, and a thickness of 100 μm. Moreover, a corona discharge treatment (applied voltage: 100 V, cumulative energy: 60 J/cm², reaction atmosphere: air) was performed on the intermediate layer.

Electrode 12: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto the intermediate layer 2, followed by heating for 10 minutes at 100° C. to cure the silicone rubber composition, to thereby form a circular electrode 12 having a diameter of 80 mm, and a thickness of 100 μm.

Intermediate layer 3: Silicone rubber (KE-1935, available from Shin-Etsu Chemical Co., Ltd.) was applied onto the electrode 12, followed by heating for 10 minutes at 100° C. to cure the silicone rubber, to thereby form a donut-shaped intermediate layer 3 having an outer diameter of 80 mm, an inner diameter of 60 mm, and a thickness of 100 μm. Moreover, a corona discharge treatment (applied voltage: 100 V, cumulative energy: 60 J/cm², reaction atmosphere: air) was performed on the intermediate layer.

Electrode 21: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto the intermediate layer 3, followed by heating for 30 minutes at 120° C. to cure the silicone rubber composition, to thereby form a donut-shaped electrode 21 having an outer diameter of 80 mm, an inner diameter of 60 mm, and a thickness of 100 μm. Thereafter, the fluororesin sheet was peeled.

As described above, an element of Example 2 composed of an integrated body of from the electrode 11 through the electrode 21 was produced.

—Production of Electric Generator—

Lead wires, cover materials, and an oscilloscope were attached to the obtained element in the same manner as in Example 1, to thereby produce an electric generator of Example 2.

<Evaluation of Power-Generating Performance>

A power-generating performance of the produced electric generator of Example 2 was evaluated in the same manner as in Example 1. A result is presented in Tables 1-2-1 and 1-2-2.

Example 3

Production of Element and Electric Generator

—Production of Element—

Figure 7A:
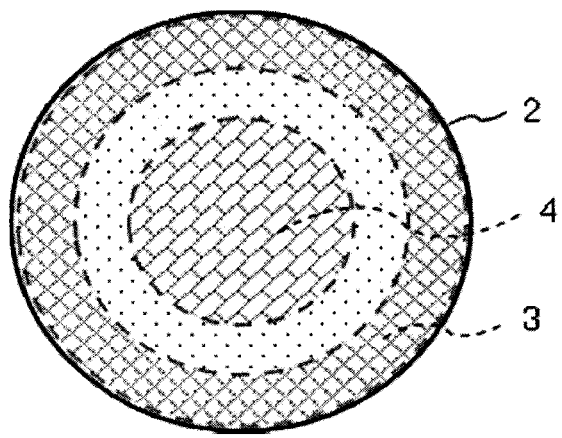
FIG. 7A is a perspective plan view illustrating one example of a layout pattern of the intermediate layers in the element illustrated in FIG. 6A.
Figure 7B:
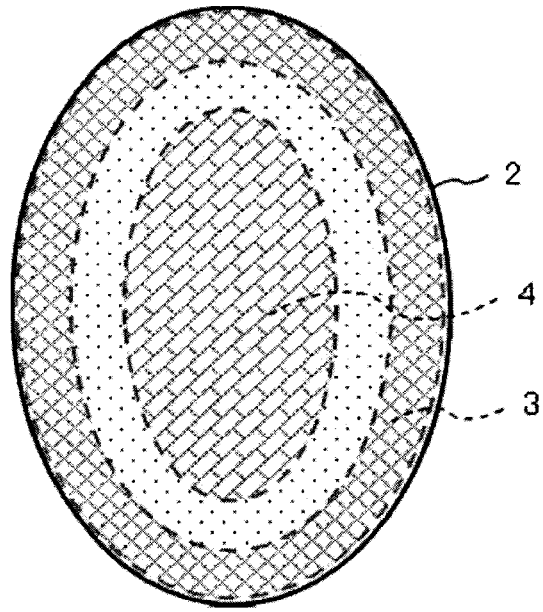
FIG. 7B is a perspective plan view illustrating another example of a layout pattern of the intermediate layers in the element illustrated in FIG. 6A.
Figure 7C:
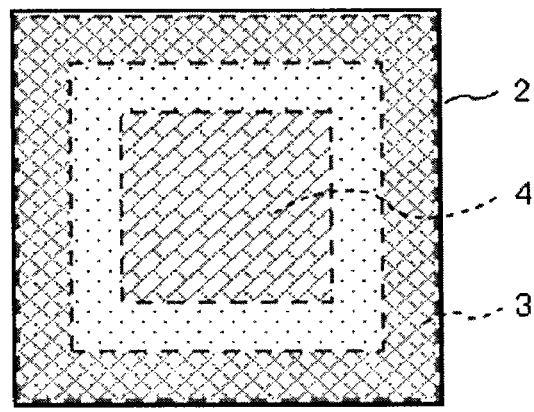
FIG. 7C is a perspective plan view illustrating another example of a layout pattern of the intermediate layers in the element illustrated in FIG. 6A.
Figure 7D:
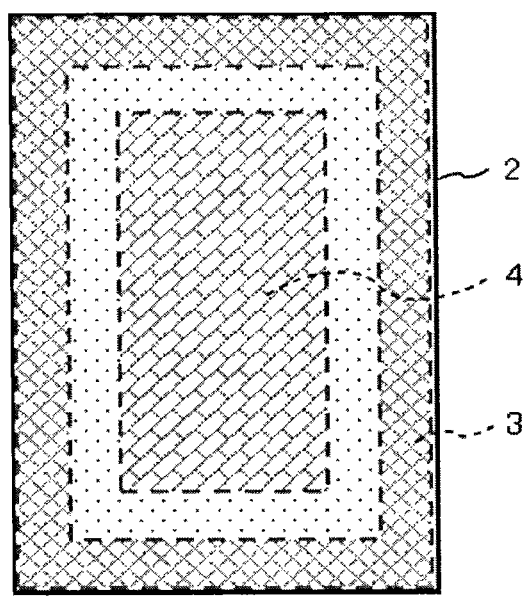
FIG. 7D is a perspective plan view illustrating another example of a layout pattern of the intermediate layers in the element illustrated in FIG. 6A.
Figure 7E:
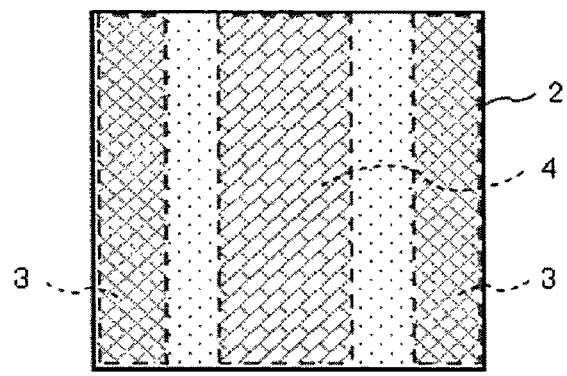
FIG. 7E is a perspective plan view illustrating another example of a layout pattern of the intermediate layers in the element illustrated in FIG. 6A.
Figure 7F:
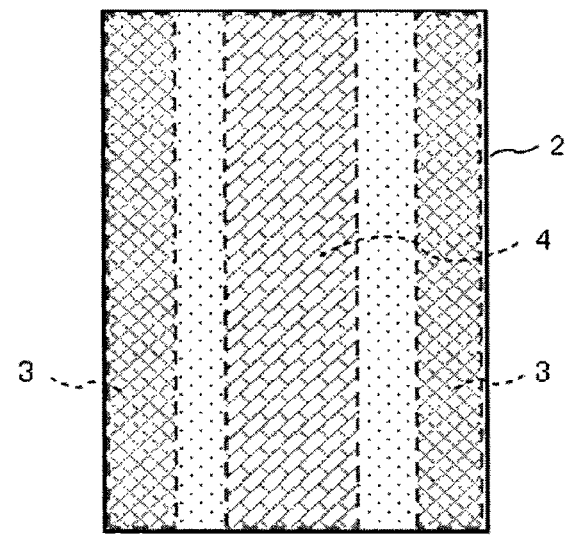
FIG. 7F is a perspective plan view illustrating another example of a layout pattern of the intermediate layers in the element illustrated in FIG. 6A.
Figure 7G:
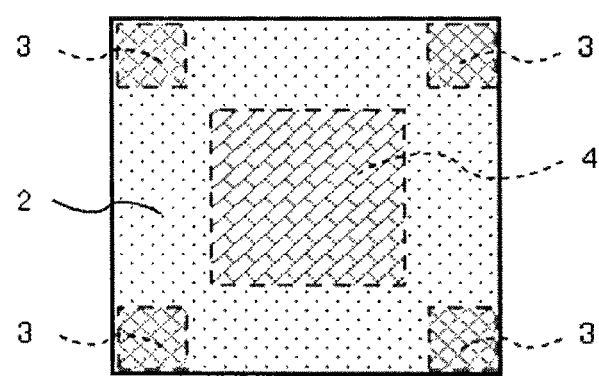
FIG. 7G is a perspective plan view illustrating another example of a layout pattern of the intermediate layers in the element illustrated in FIG. 6A.
Figure 7H:
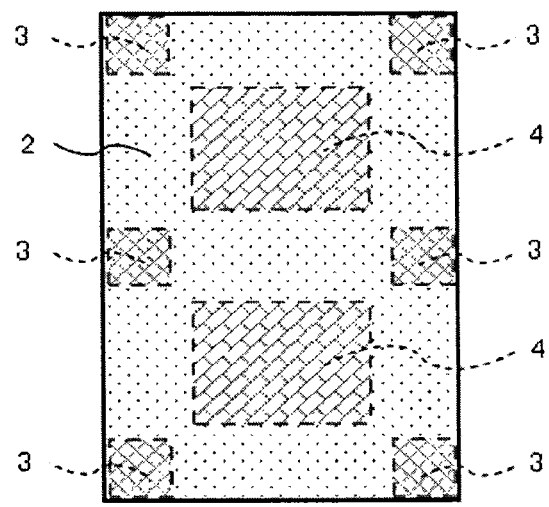
FIG. 7H is a perspective plan view illustrating another example of a layout pattern of the intermediate layers in the element illustrated in FIG. 6A.
Figure 7I:
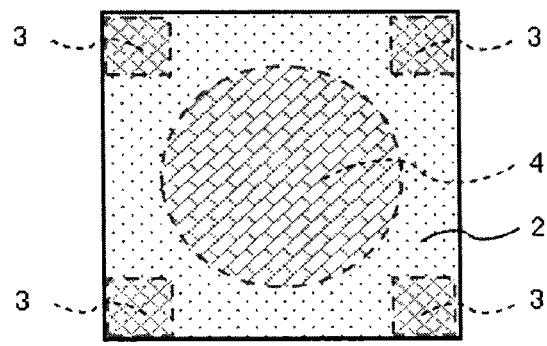
FIG. 7I is a perspective plan view illustrating another example of a layout pattern of the intermediate layers in the element illustrated in FIG. 6A.
Figure 7J:
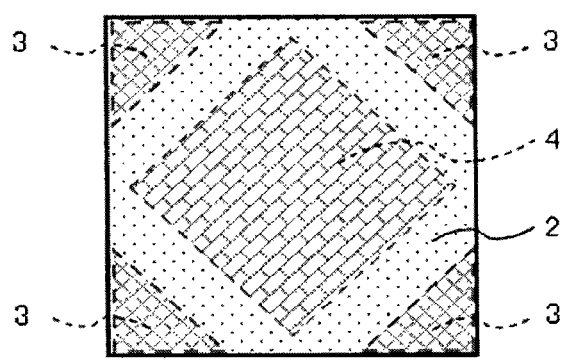
FIG. 7J is a perspective plan view illustrating another example of a layout pattern of the intermediate layers in the element illustrated in FIG. 6A.
Figure 7K:
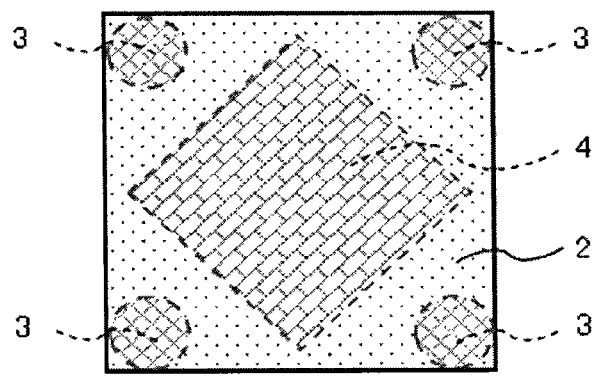
FIG. 7K is a perspective plan view illustrating another example of a layout pattern of the intermediate layers in the element illustrated in FIG. 6A.

An element illustrated in FIG. 6A was produced in the following manner. A layout pattern of intermediate layers in the element was as illustrated in FIG. 7A.

Electrode 11: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto a fluororesin sheet (Skived tape, available from CHUOH CHEMICAL INDUSTRIES, LTD., thickness: 100 µm), followed by heating for 10 minutes at 100° C. to cure the silicone rubber composition, to thereby form a circular electrode 11 having a diameter of 80 mm, and a thickness of 100 µm.

Intermediate layer 2: Silicone rubber (KE-1603, available from Shin-Etsu Chemical Co., Ltd.) was applied onto the electrode 11, followed by heating for 10 minutes at 100° C. to cure the silicone rubber, to thereby form a circular intermediate layer 2 having a diameter of 80 mm, and a thickness of 100 µm. Moreover, a corona discharge treatment (applied voltage: 100 V, cumulative energy: 60 J/cm$^2$, reaction atmosphere: air) was performed on the intermediate layer.

Electrode 12: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto the intermediate layer 2, followed by heating for 10 minutes at 100° C. to cure the silicone rubber composition, to thereby form a circular electrode 12 having a diameter of 80 mm, and a thickness of 100 µm.

Supporting member 31: Acrylic rubber (Nipol AR31, available from Zeon Corporation) was applied onto the electrode 12, followed by heating for 10 minutes at 100° C. to cure the acrylic rubber, to thereby form a circular supporting member 31 having a diameter of 80 mm, and a thickness of 50 µm.

Electrode 13: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto the supporting member 31, followed by heating for 10 minutes at 100° C. to thereby form a circular electrode 13 having a diameter of 80 mm, and a thickness of 100 µm.

Intermediate layer 3: Silicone rubber (KE-1935, available from Shin-Etsu Chemical Co., Ltd.) was applied onto the electrode 13, followed by heating for 30 minutes at 120° C. to thereby form a donut-shaped intermediate layer 3 having an outer diameter of 80 mm, an inner diameter of 60 mm, and a thickness of 100 µm. Moreover, a corona discharge treatment (applied voltage: 100 V, cumulative energy: 60 J/cm$^2$, reaction atmosphere: air) was performed on the intermediate layer.

Thereafter, the fluororesin sheet was peeled to thereby produce an integrated body of from the electrode 11 through the intermediate layer 3.

Intermediate layer 4: A silicone rubber composition containing 100 parts by mass of silicone rubber (XE14-C2042, available from Momentive Performance Materials Inc.) and 50 parts by mass of barium titanate (208108, available from Sigma-Aldrich Co.) was applied onto a polyethylene terephthalate film (S10 LUMIRROR #100, available from TORAY INDUSTRIES, INC., thickness: 100 µm), followed by heating for 30 minutes at 120° C. to thereby form a circular intermediate layer 4 having a diameter of 40 mm, and a thickness of 50 µm. Moreover, an electron beam irradiation treatment (irradiation source: line-irradiation low-energy electron beam light source available from Hamamatsu Photonics K.K., radiation dose: 1 MGy, reaction atmosphere: nitrogen, oxygen partial pressure: 5,000 ppm or less) was performed on the intermediate layer.

Thereafter, the polyethylene terephthalate film was peeled, to thereby produce an intermediate layer 4.

Supporting member 33: A circular supporting member 33 having a diameter of 80 mm and a thickness of 100 µm was cut out from a polyethylene terephthalate film (H10 LUMIRROR #100, available from TORAY INDUSTRIES, INC., thickness: 100 µm).

Electrode 21: A donut-shaped electrode 21 having an outer diameter of 80 mm, an inner diameter of 60 mm, and a thickness of 130 µm was cut out from an aluminium foil double-sided tape (No. 791, available from TERAOKA SEISAKUSHO CO., LTD., thickness: 130 µm). The electrode 21 was then bonded onto the supporting member 33.

Electrode 22: A circular electrode 22 having a diameter of 40 mm and a thickness of 130 µm was cut out from an aluminium foil double-sided tape (No. 791, available from TERAOKA SEISAKUSHO CO., LTD., thickness: 130 µm). The electrode 22 was then bonded onto the supporting member 33.

The intermediate layer 4 was bonded onto the electrode 22. Subsequently, the aforementioned integrated body of from the electrode 11 through the intermediate layer 3 was bonded onto the electrode 21.

As described above, an element of Example 3 composed of an integrated body of from the electrode 11 through the electrode 22 was produced.

—Production of Electric Generator—

Lead wires, cover materials, and an oscilloscope were attached to the obtained element in the same manner as in Example 1, to thereby produce an electric generator of Example 3.

<Evaluation of Power-Generating Performance>

A power-generating performance of the produced electric generator of Example 3 was evaluated in the same manner as in Example 1. A result is presented in Tables 1-3-1 and 1-3-2.

Example 4

Production of Element and Electric Generator

—Production of Element—

Figure 9A:
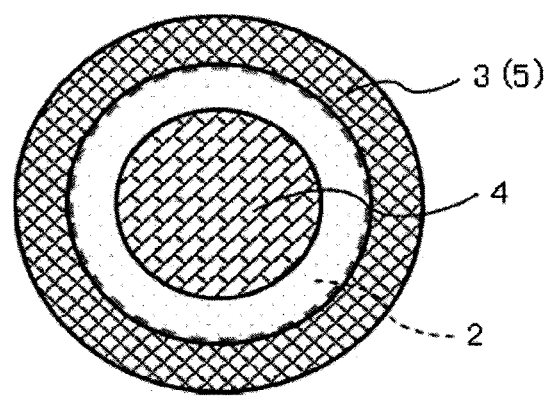
FIG. 9A is a perspective plan view illustrating one example of a layout pattern of the intermediate layers in the element illustrated in FIG. 8.
Figure 9B:
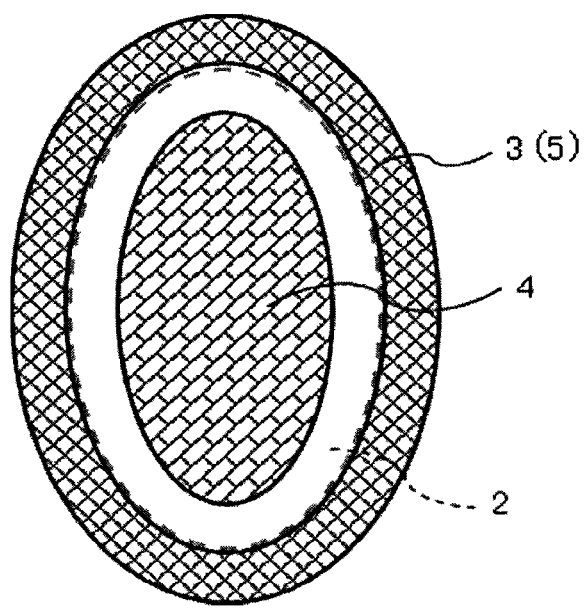
FIG. 9B is a perspective plan view illustrating another example of a layout pattern of the intermediate layers in the element illustrated in FIG. 8.
Figure 9C:
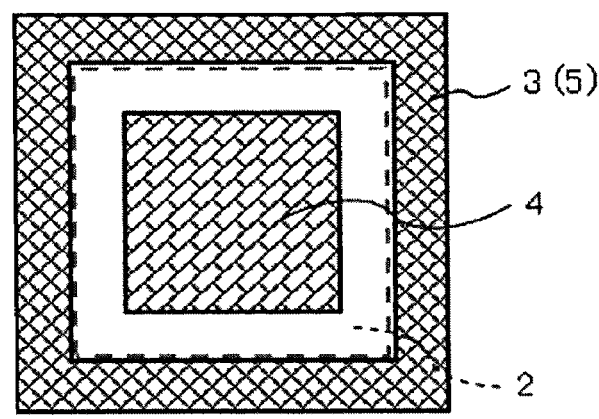
FIG. 9C is a perspective plan view illustrating another example of a layout pattern of the intermediate layers in the element illustrated in FIG. 8.
Figure 9D:
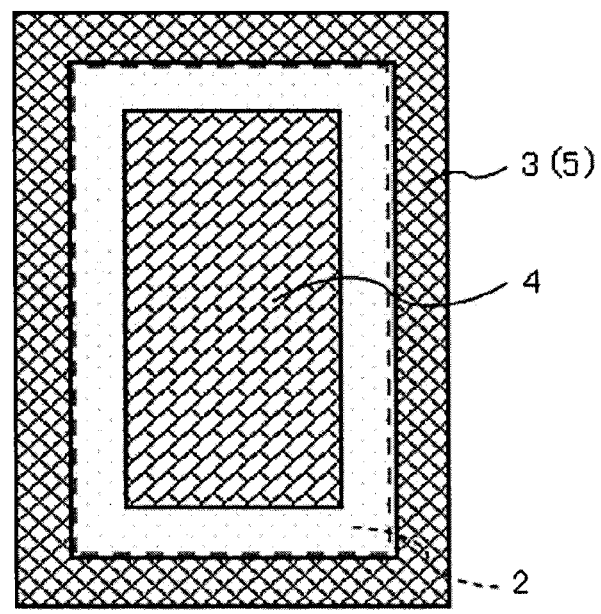
FIG. 9D is a perspective plan view illustrating another example of a layout pattern of the intermediate layers in the element illustrated in FIG. 8.
Figure 9E:
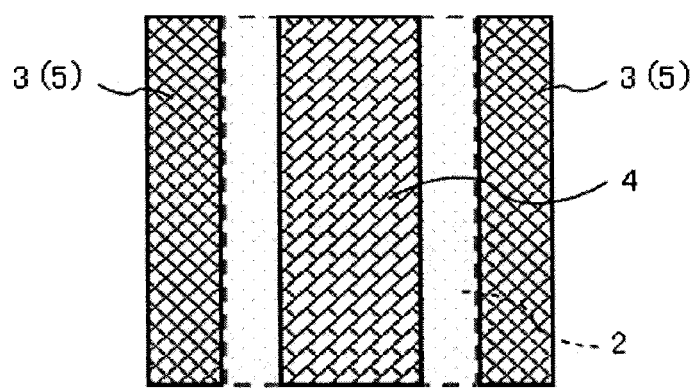
FIG. 9E is a perspective plan view illustrating another example of a layout pattern of the intermediate layers in the element illustrated in FIG. 8.
Figure 9F:
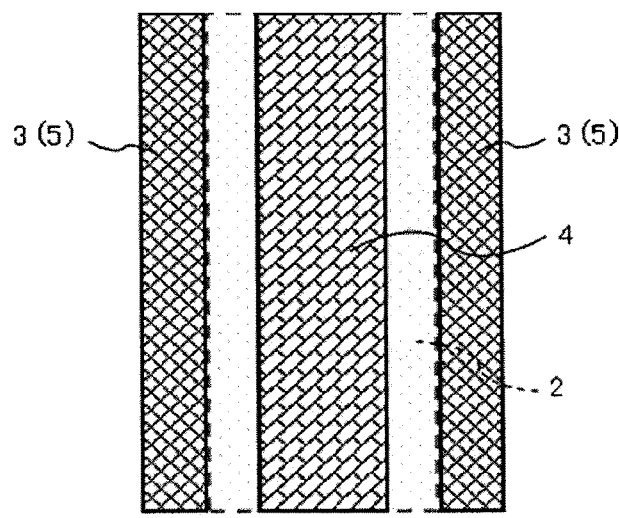
FIG. 9F is a perspective plan view illustrating another example of a layout pattern of the intermediate layers in the element illustrated in FIG. 8.

An element illustrated in FIG. 11 was produced in the following manner. A layout pattern of intermediate layers in the element was as illustrated in FIG. 9E.

Supporting Member 32: A square supporting member 32 having a size of 70 mm×70 mm and a thickness of 200 µm was cut out from ethylene propylene rubber (FH ultrathin sheet, available from Furo Rubber Co., Ltd., hardness: 20, thickness: 200 µm).

Electrode 11: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto the supporting member 32, followed by heating for 10 minutes at 100° C. to cure the silicone rubber composition, to thereby form a rectangular electrode 11 having a size of 45 mm×70 mm, and a thickness of 50 µm.

Intermediate layer 2: Silicone rubber (KE-1950-20, available from Shin-Etsu Chemical Co., Ltd.) was applied onto the electrode 11, followed by heating for 30 minutes at 120° C. to thereby form a rectangular intermediate layer 2 having a size of 45 mm×70 mm, and a thickness of 50 µm. Moreover, a plasma treatment (irradiation source: PR-500, available from Yamato Scientific Co., Ltd., output: 100 W, processing time: 3 minutes, reaction atmosphere: argon (99.999%), reaction pressure: 10 Pa) was performed on the intermediate layer.

Electrode 23: Two strips of a rectangular electrode 23 having a size of 10 mm×70 mm, and a thickness of 50 μm were cut out from a nickel-plated nonwoven fabric double-sided tape (CN4490, available from 3M, thickness: 50 μm). The two strips of the electrode 23 were bonded to both edges of the supporting member 32.

Intermediate layer 5: A silicone rubber composition containing 100 parts by mass of silicone rubber (XE14-C2042, available from Momentive Performance Materials Inc.) and 50 parts by mass of barium titanate (208108, available from Sigma-Aldrich Co.) was applied onto a polyethylene terephthalate film (S10 LUMIRROR #100, available from TORAY INDUSTRIES, INC., thickness: 100 μm), followed by heating for 30 minutes at 120° C. to thereby form two strips of a rectangular intermediate layer 5 having a size of 10 mm×70 mm, and a thickness of 200 μm. Moreover, a plasma treatment (irradiation source: PR-500, available from Yamato Scientific Co., Ltd., output: 100 W, processing time: 3 minutes, reaction atmosphere: argon (99.999%), reaction pressure: 10 Pa) was performed on the intermediate layer.

Thereafter, the polyethylene terephthalate film was peeled, and the two strips of the intermediate layer 5 were bonded onto the electrode 23.

As described above, an integrated body of from the supporting member 32 through the intermediate layer 5 was produced.

Electrode 12: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto a fluororesin sheet (Skived tape, available from CHUOH CHEMICAL INDUSTRIES, LTD., thickness: 100 μm), followed by heating for 10 minutes at 100° C. to cure the silicone rubber composition, to thereby form a square electrode 12 having a size of 70 mm×70 mm, and a thickness of 50 μm.

Supporting member 31: Acrylic rubber (Nipol AR31, available from Zeon Corporation) was applied onto the electrode 12, followed by heating for 10 minutes at 100° C. to cure the acrylic rubber, to thereby form a square supporting member 31 having a size of 70 mm×70 mm, and a thickness of 50 μm.

Electrode 13: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto the supporting member 31, followed by heating for 10 minutes at 100° C., to thereby form a square electrode 13 having a size of 70 mm×70 mm, and a thickness of 50 μm.

Intermediate layer 3: A silicone rubber composition containing 100 parts by mass of silicone rubber (XE14-C2042, available from Momentive Performance Materials Inc.) and 50 parts by mass of barium titanate (208108, available from Sigma-Aldrich Co.) was applied onto the both edges of the electrode 13, followed by heating for 30 minutes at 120° C., to thereby form two strips of a rectangular intermediate layer 3 having a size of 10 mm×70 mm, and a thickness of 200 μm. Moreover, a plasma treatment (irradiation source: PR-500, available from Yamato Scientific Co., Ltd., output: 100 W, processing time: 3 minutes, reaction atmosphere: argon (99.999%), reaction pressure: 10 Pa) was performed on the intermediate layer.

As described above, an integrated body of from the electrode 12 through the intermediate layer 3 was produced.

The intermediate layer 5 and the electrode 12 were bonded together via a nickel-plated nonwoven fabric double-sided tape (CN4490, available from 3M, thickness: 50 μm, size: 10 mm×70 mm, 2 strips).

As described above, an integrated body from the supporting member 32 through the intermediate layer 3 was produced.

Intermediate layer 4: A silicone rubber composition containing 100 parts by mass of silicone rubber (XE14-C2042, available from Momentive Performance Materials Inc.) and 50 parts by mass of barium titanate (208108, available from Sigma-Aldrich Co.) was applied onto a polyethylene terephthalate film (S10 LUMIRROR #100, available from TORAY INDUSTRIES, INC., thickness: 100 μm), followed by heating for 30 minutes at 120° C. to cure the silicone composition, to thereby form a rectangular intermediate layer 4 having a size of 30 mm×70 mm, and a thickness of 50 μm. Moreover, an electron beam irradiation treatment (irradiation source: line-irradiation low-energy electron beam light source available from Hamamatsu Photonics K.K., radiation dose: 1 MGy, reaction atmosphere: nitrogen, oxygen partial pressure: 5,000 ppm or less) was performed on the intermediate layer.

Thereafter, the polyethylene terephthalate film was peeled, to thereby produce an intermediate layer 4.

Supporting member 33: A square supporting member 33 having a size of 70 mm×70 mm, and a thickness of 100 μm was cut out from a polyethylene terephthalate film (H10 LUMIRROR #100, available from TORAY INDUSTRIES, INC., thickness: 100 μm).

Electrode 21: Two strips of a rectangular electrode 21 having a size of 10 mm×70 mm, and a thickness of 130 μm was cut out from an aluminium foil double-sided tape (No. 791, available from TERAOKA SEISAKUSHO CO., LTD., thickness: 130 μm). The two strips of the electrode were bonded to both edges of the supporting member 33.

Electrode 22: A rectangular electrode 22 having a size of 30 mm×70 mm, and a thickness of 130 μm was cut out from an aluminium foil double-sided tape (No. 791, available from TERAOKA SEISAKUSHO CO., LTD., thickness: 130 μm). The electrode 22 was bonded onto the supporting member 33.

The intermediate layer 4 was bonded onto the electrode 22. Subsequently, the integrated body of from the supporting member 32 through the intermediate layer 3 was bonded onto the electrode 21.

As described above, an element of Example 4 composed of an integrated body of from the supporting member 32 through the supporting member 33 was produced.

—Production of Electric Generator—

Lead wires, cover materials, and an oscilloscope were attached to the obtained element in the same manner as in Example 1, to thereby produce an electric generator of Example 4.

<Evaluation of Power-Generating Performance>

A power-generating performance of the produced electric generator of Example 4 was evaluated in the same manner as in Example 1. A result is presented in Tables 1-4-1 and 1-4-2.

Example 5

Production of Element and Electric Generator

—Production of Element—

An element illustrated in FIG. 13A was produced in the following manner. A layout pattern of intermediate layers in the element was as illustrated in FIG. 14A.

Electrode 12: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto a fluororesin sheet (Skived tape, available from CHUOH CHEMICAL INDUSTRIES, LTD., thickness: 100 μm), followed by heating for 10 minutes at 100° C. to cure the silicone rubber composition, to thereby form a rectangular electrode 12 having a size of 60 mm×80 mm, and a thickness of 50 μm.

Intermediate layer 2: Silicone rubber (KE-1950-20, available from Shin-Etsu Chemical Co., Ltd.) was applied onto the electrode 12, followed by heating for 10 minutes at 100° C. to cure the silicone rubber, to thereby form a rectangular intermediate layer 2 having a size of 60 mm×80 mm, and a thickness of 50 μm. Moreover, a corona discharge treatment (applied voltage: 100 V, cumulative energy: 60 J/cm$^2$, reaction atmosphere: air) was performed on the intermediate layer.

Electrode 11: A silicone rubber composition containing 100 parts by mass of silicone rubber (KE-1603, available from Shin-Etsu Chemical Co., Ltd.) and 5 parts by mass of carbon nanotubes (773840, manufactured by Sigma-Aldrich Co.) was applied onto the intermediate layer 2, followed by heating for 10 minutes at 100° C. to cure the silicone rubber composition, to thereby form a rectangular electrode 11 having a size of 60 mm×80 mm, and a thickness of 50 μm.

Intermediate layer 3: A silicone rubber composition containing 100 parts by mass of silicone rubber (KE-1950-20, available from Shin-Etsu Chemical Co., Ltd.) and 50 parts by mass of barium titanate (208108, manufactured by Sigma-Aldrich Co.) was applied onto both edges of the electrode 11, followed by heating for 30 minutes at 120° C. to cure the silicone rubber composition, to thereby form two strips of a rectangular intermediate layer 3 having a size of 10 mm×60 mm, and a thickness of 100 μm. Moreover, a corona discharge treatment (applied voltage: 100 V, cumulative energy: 60 J/cm$^2$, reaction atmosphere: air) was performed on the intermediate layer.

Thereafter, the fluororesin sheet was peeled to thereby produce an integrated body of from the intermediate layer 3 through the electrode 12.

Intermediate layer 4: A silicone rubber composition containing 100 parts by mass of silicone rubber (KE-1950-20, available from Shin-Etsu Chemical Co., Ltd.) and 50 parts by mass of barium titanate (208108, available from Sigma-Aldrich Co.) was applied onto a polyethylene terephthalate film (S10 LUMIRROR #100, available from TORAY INDUSTRIES, INC., thickness: 100 μm), followed by heating for 30 minutes at 120° C. to thereby form a rectangular intermediate layer 4 having a size of 40 mm×60 mm, and a thickness of 100 μm. Moreover, an electron beam irradiation treatment (irradiation source: line-irradiation low-energy electron beam light source available from Hamamatsu Photonics K.K., radiation dose: 1 MGy, reaction atmosphere: nitrogen, oxygen partial pressure: 5,000 ppm or less) was performed on the intermediate layer.

Thereafter, the polyethylene terephthalate film was peeled, to thereby produce an intermediate layer 4.

Electrode 25: A rectangular electrode 25 having a size of 60 mm×85 mm, and a thickness of 100 μm was cut out from a phosphor bronze plate (available from TAKACHI ELECTRONICS ENCLOSURE CO., LTD., thickness: 100 μm), followed by performing bending processing. The electrode 25 and the intermediate layer 4 were bonded together via a copper foil double-sided tape (No. 796, available from TERAOKA SEISAKUSHO CO., LTD., thickness: 50 μm, size: 40 mm×60 mm). Subsequently, the electrode 25 and the integrated body of from the intermediate layer 3 through the electrode 12 were bonded together via a copper foil double-sided tape (No. 796, available from TERAOKA SEISAKUSHO CO., LTD., thickness: 50 μm, size: 10 mm×60 mm, 2 strips). As described above, an element of Example 5 composed of an integrated body of from the electrode 25 through the electrode 12 was produced.

—Production of Electric Generator—

Lead wires, cover materials, and an oscilloscope were attached to the obtained element in the same manner as in Example 1, to thereby produce an electric generator of Example 5.

<Evaluation of Power-Generating Performance>

A power-generating performance of the produced electric generator of Example 5 was evaluated in the same manner as in Example 1. A result is presented in Tables 1-5-1 and 1-5-2.

Example 6

Production of Element and Electric Generator

—Production of Element—

Figure 9G:
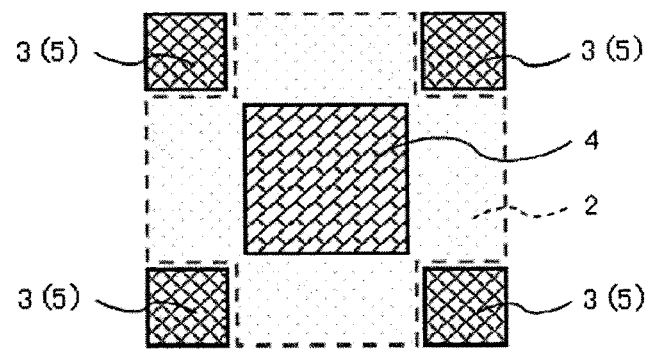
FIG. 9G is a perspective plan view illustrating another example of a layout pattern of the intermediate layers in the element illustrated in FIG. 8.
Figure 9H:
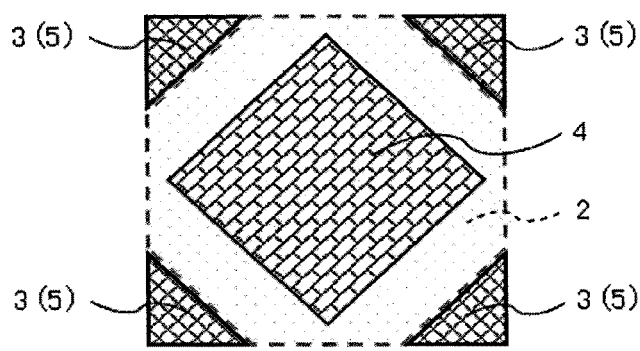
FIG. 9H is a perspective plan view illustrating another example of a layout pattern of the intermediate layers in the element illustrated in FIG. 8.
Figure 9I:
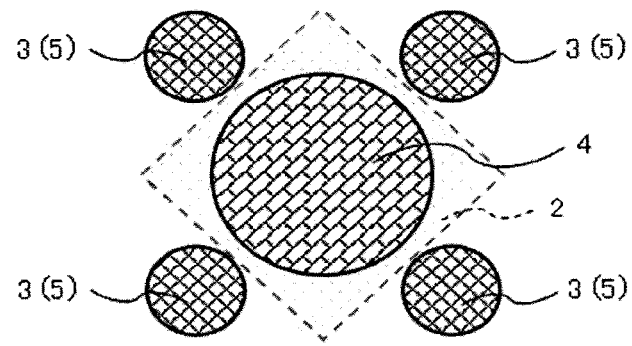
FIG. 9I is a perspective plan view illustrating another example of a layout pattern of the intermediate layers in the element illustrated in FIG. 8.

An element illustrated in FIG. 12 was produced in the following manner. A layout pattern of intermediate layers in the element was as illustrated in FIG. 9G.

Supporting member 32: A square supporting member 32 having a size of 70 mm×70 mm and a thickness of 200 μm was cut out from ethylene propylene rubber (FH ultrathin sheet, available from Furo Rubber Co., Ltd., hardness: 20, thickness: 200 μm).

Electrode 11: A silicone rubber composition containing 100 parts by mass of silicone rubber (RE-1603, available from Shin-Etsu Chemical Co., Ltd.) and 5 parts by mass of carbon nanotubes (773840, available from Sigma-Aldrich Co.) was applied onto the supporting member 32, followed by heating for 10 minutes at 100° C. to cure the silicone rubber composition, to thereby form a square electrode 11 having a size of 50 mm×50 mm, and a thickness of 50 μm.

Intermediate layer 2: A silicone rubber composition containing 100 parts by mass of silicone rubber (KE-1950-20, available from Shin-Etsu Chemical Co., Ltd.) and 1 part by mass of silsesquioxane (PPS-octaphenyl substituted product 526851, available from Sigma-Aldrich Co.) was applied onto the electrode 11, followed by heating for 30 minutes at 150° C. to cure the silicone rubber composition, to thereby form a square intermediate layer 2 having a size of 50 mm×50 mm, and a thickness of 50 μm. A surface treatment was not performed on the intermediate layer 2.

Electrode 23: Four pieces of a square electrode 23 having a size of 10 mm×10 mm, and a thickness of 50 μm were cut out from a nickel-plated nonwoven fabric double-sided tape (CN4490, available from 3M, thickness: 50 μm). The four pieces of the electrode 23 were respectively bonded onto four corners of the supporting member 32.

Intermediate layer 5: A silicone rubber composition containing 100 parts by mass of silicone rubber (XE14-C2042, available from Momentive Performance Materials Inc.), and 50 parts by mass of barium titanate (208108, available from Sigma-Aldrich Co.) was applied onto a polyethylene terephthalate film (S10 LUMIRROR #100, available from TORAY INDUSTRIES, INC., thickness: 100 μm), followed by heating for 30 minutes at 150° C. to cure the silicone resin composition, to thereby form four pieces of a square intermediate layer 5 having a size of 10 mm×10 mm, and a thickness of 200 μm. A surface treatment was not performed on the intermediate layer 5.

Thereafter, the polyethylene terephthalate film was peeled, and the intermediate layer 5 was bonded onto the electrode 23.

As described above, an integrated body of from the supporting member 32 through the intermediate layer 5 was produced. Supporting member 31: A square supporting member 31 having a size of 70 mm×70 mm, and a thickness of 2 mm was cut out from a polycarbonate resin plate (PC1600, available from Takiron Co., Ltd., thickness: 2 mm).

Electrode 12: A square electrode 12 having a size of 70 mm×70 mm, and a thickness of 70 µm was cut out from a copper foil tape (No. 8323, available from TERAOKA SEISAKUSHO CO., LTD., thickness: 70 µm). The electrode 12 was bonded onto the supporting member 31.

Electrode 13: A square electrode 13 having a size of 40 mm×40 mm, and a thickness of 85 µm was cut out from an aluminium foil tape (No. 8303, available from TERAOKA SEISAKUSHO CO., LTD., thickness: 85 µm). The electrode 13 was bonded onto the supporting member 31 (on a surface thereof to which the electrode 12 was not bonded).

As described above, an integrated body of from the electrode 12 through the electrode 13 was produced.

The integrated body of from the supporting member 32 through the intermediate layer 5 and the integrated body of from the electrode 12 through the electrode 13 were bonded together via a copper foil double-sided tape (No. 796, available from TERAOKA SEISAKUSHO CO., LTD., thickness: 50 µm, size: 10 mm×10 mm, 4 strips), to thereby produce an integrated body of from the supporting member 32 through the electrode 13.

Intermediate layer 4: A silicone rubber composition containing 100 parts by mass of silicone rubber (XE14-C2042, available from Momentive Performance Materials Inc.) and 50 parts by mass of barium titanate (208108, available from Sigma-Aldrich Co.) was applied onto a polyethylene terephthalate film (S10 LUMIRROR #100, available from TORAY INDUSTRIES, INC., thickness: 100 µm), followed by heating for 30 minutes at 150° C. to cure the silicone rubber composition, to thereby form a square intermediate layer 4 having a size of 40 mm×40 mm, and a thickness of 100 µm. A surface treatment was not performed on the intermediate layer 4.

Thereafter, the polyethylene terephthalate film was peeled, to thereby produce an intermediate layer 4.

Supporting member 33: A square supporting member 33 having a size of 70 mm×70 mm, and a thickness of 2 mm was cut out from a polycarbonate resin plate (PC1600, available from Takiron Co., Ltd., thickness: 3 mm). Moreover, 4 holes each having an outer diameter of 55 mm were respectively formed at four corners of the supporting member 33.

Electrode 22: A square electrode 22 having a size of 40 mm×40 mm, and a thickness of 130 µm was cut out from an aluminium foil double-sided tape (No. 791, available from TERAOKA SEISAKUSHO CO., LTD., thickness: 130 µm). The electrode 22 was bonded onto the supporting member 33.

The intermediate layer 4 was bonded onto the electrode 22.

As described above, an integrated body of from the intermediate layer 4 through the supporting member 33 was produced.

Coil springs 35: Four compression coil springs (AS050-008-0.7, available from Showa Spring Co., Ltd., stainless steel wire, free length: 8 mm) were respectively placed in the four holes at the four corners of the supporting member 33. The integrated body of from the supporting member 32 through the electrode 13 was disposed on the coil springs 35.

As described above, an element of Example 6 composed of an integrated body of from the supporting member 32 through the supporting member 33 was produced.

—Production of Electric Generator—

Lead wires, cover materials, and an oscilloscope were attached to the obtained element in the same manner as in Example 1, to thereby produce an electric generator of Example 6.

<Evaluation of Power Generating Performance>

A power-generating performance of the produced electric generator of Example 6 was evaluated in the same manner as in Example 1. A result is presented in Tables 1-6-1 and 1-6-2.

Example 7

Production of Element and Electric Generator

—Production of Element—

An element of Example 7 was produced in the same manner as in Example 1, except that the intermediate layer 2 was changed to acrylic rubber (Nipol AR31, available from Zeon Corporation), and a surface treatment was not performed thereon.

—Production of Electric Generator—

Lead wires, cover materials, and an oscilloscope were attached to the obtained element in the same manner as in Example 1, to thereby produce an electric generator of Example 7.

<Evaluation of Power-Generating Performance>

A power-generating performance of the produced electric generator of Example 7 was evaluated in the same manner as in Example 1. A result is presented in Tables 1-7-1 and 1-7-2.

Example 8

Production of Element and Electric Generator

—Production of Element—

An element of Example 8 was produced in the same manner as in Example 1, except that the intermediate layer 3 was changed to acrylic rubber (Nipol AR31, available from Zeon Corporation), and a surface treatment was not performed thereon.

—Production of Electric Generator—

Lead wires, cover materials, and an oscilloscope were attached to the obtained element in the same manner as in Example 1, to thereby produce an electric generator of Example 8.

<Evaluation of Power-Generating Performance>

A power-generating performance of the produced electric generator of Example 8 was evaluated in the same manner as in Example 1. A result is presented in Tables 1-8-1 and 1-8-2.

Example 9

Figure 17A:
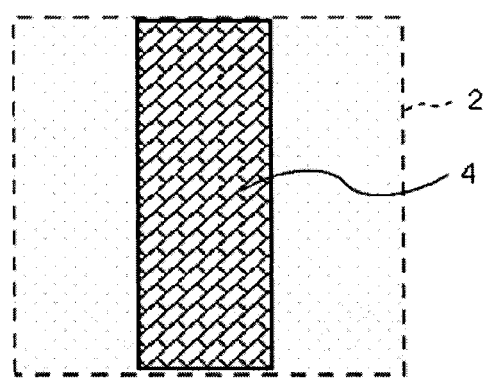
FIG. 17A is a perspective plan view illustrating one example of a layout pattern of the intermediate layers in the element illustrated in FIG. 16.
Figure 17B:
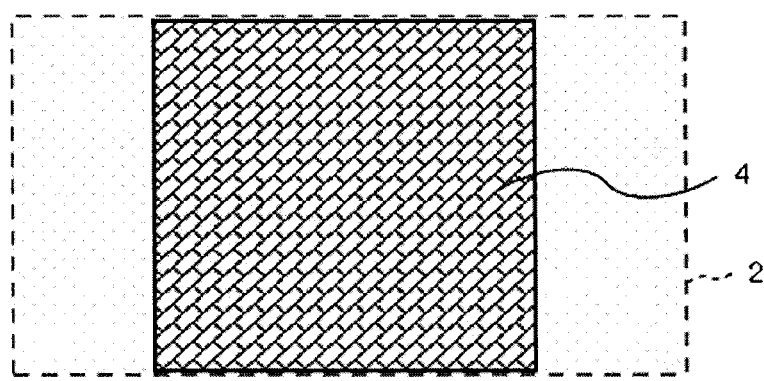
FIG. 17B is a perspective plan view illustrating another example of a layout pattern of the intermediate layers in the element illustrated in FIG. 16.

An element illustrated in FIG. 16 was produced in the following manner. A layout pattern of intermediate layers in the element was as illustrated in FIG. 17A.

Supporting member 31: Acrylic rubber (Nipol AR31, available from Zeon Corporation) was applied onto a fluororesin sheet (Skived tape, available from CHUOH CHEMICAL INDUSTRIES, LTD., thickness: 100 µm), followed by heating for 10 minutes at 100° C. to cure the acrylic rubber, to thereby form a square supporting member 31 having a size of 70 mm×70 mm, and a thickness of 50 µm.

Electrode 11: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto the supporting member 31, followed by heating for 10 minutes at 100° C., to thereby form a square electrode 11 having a size of 70 mm×70 mm, and a thickness of 100 µm.

Intermediate layer 2: Silicone rubber (KE-1603, available from Shin-Etsu Chemical Co., Ltd.) was applied onto the electrode 13, followed by heating for 30 minutes at 120° C. to cure the silicone rubber, to thereby form a square intermediate layer 2 having a size of 70 mm×70 mm, and a thickness of 100 µm. Moreover, an electron beam irradiation treatment (irradiation source: line-irradiation low-energy electron beam light source available from Hamamatsu Photonics K.K., radiation dose: 1 MGy, reaction atmosphere: nitrogen, oxygen partial pressure: 5,000 ppm or less) was performed on the intermediate layer. Thereafter, the fluororesin sheet was peeled, to thereby produce an integrated body of from the supporting member 31 through the intermediate layer 2.

Electrode 12: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto the integrated body of from the supporting member 31 through the intermediate layer 2, followed by heating for 10 minutes at 100° C., to thereby form a rectangular electrode 12 having a size of 40 mm×70 mm, and a thickness of 100 µm.

As described above, an integrated body of from the electrode 12 through the intermediate layer 2 was produced.

Intermediate layer 4: A silicone rubber composition containing 100 parts by mass of silicone rubber (XE14-C2042, available from Momentive Performance Materials Inc.) and 50 parts by mass of barium titanate (208108, available from Sigma-Aldrich Co.) was applied onto a polyethylene terephthalate film (S10 LUMIRROR #100, available from TORAY INDUSTRIES, INC., thickness: 100 µm), followed by heating for 30 minutes at 120° C. to cure the silicone rubber composition, to thereby form a rectangular intermediate layer 4 having a size of 40 mm×70 mm, and a thickness of 100 µm. Moreover, an electron beam irradiation treatment (irradiation source: line-irradiation low-energy electron beam light source available from Hamamatsu Photonics K.K., radiation dose: 1 MGy, reaction atmosphere: nitrogen, oxygen partial pressure: 5,000 ppm or less) was performed on the intermediate layer.

Thereafter, the polyethylene terephthalate film was peeled, to thereby produce an intermediate layer 4.

Electrode 25: A rectangular electrode 25 having a size of 70 mm×75 mm, and a thickness of 100 µm was cut out from a phosphor bronze plate (available from TAKACHI ELECTRONICS ENCLOSURE CO., LTD., thickness: 100 µm), followed by performing bending processing. The electrode 25 and the intermediate layer 4 were bonded together via a copper foil double-sided tape (No. 796, available from TERAOKA SEISAKUSHO CO., LTD., thickness: 50 µm, size: 40 mm×70 mm). Subsequently, the electrode 25 and the integrated body of from the electrode 12 through the intermediate layer 2 were bonded together via a copper foil double-sided tape (No. 796, available from TERAOKA SEISAKUSHO CO., LTD., thickness: 50 µm, size: 5 mm×70 mm, two strips), to thereby produce an integrated body of from the electrode 25 through the intermediate layer 2.

Electrode 26: A rectangular electrode 26 having a size of 70 mm×75 mm, and a thickness of 100 µm was cut out from a phosphor bronze plate (available from TAKACHI ELECTRONICS ENCLOSURE CO., LTD., thickness: 100 µm), followed by performing bending processing. Subsequently, the electrode 26 and the integrated body of from the electrode 25 through the intermediate layer 2 were bonded together with a copper foil double-sided tape (No. 796, available from TERAOKA SEISAKUSHO CO., LTD., thickness: 50 µm, size: 5 mm×70 mm, 2 strips).

As described above, an element of Example 9 composed of an integrated body of from the electrode 25 through the electrode 26 was produced.

—Production of Electric Generator—

Lead wires, cover materials, and an oscilloscope were attached to the obtained element in the same manner as in Example 1, to thereby produce an electric generator of Example 9.

<Evaluation of Power-Generating Performance>

A power-generating performance of the produced electric generator of Example 9 was evaluated in the same manner as in Example 1. A result is presented in Tables 1-9-1 and 1-9-2.

Comparative Example 1

Production of Element and Electric Generator

—Production of Element—

Figure 26:
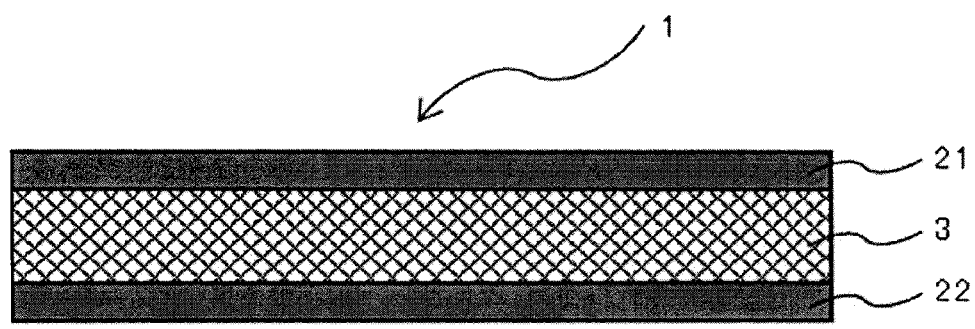
FIG. 26 is a schematic cross-sectional view illustrating one example of an element of Comparative Example.

An element illustrated in FIG. 26 was produced in the following manner.

A square piece having a size of 70 mm×70 mm was cut out from a polyvinylidene fluoride (PVDF) piezo film (available from Tokyo Sensor Co., Ltd., thickness of PVDF: 110 µm, thickness of silver electrode: 6 µm), and was used as an element of Comparative Example 1.

—Production of Electric Generator—

Lead wires, cover materials, and an oscilloscope were attached to the obtained element in the same manner as in Example 1, to thereby produce an electric generator of Comparative Example 1.

<Evaluation of Power-Generating Performance>

A power-generating performance of the produced electric generator of Comparative Example 1 was evaluated in the same manner as in Example 1. A result is presented in Tables 1-10-1 and 1-10-2.

Comparative Example 2

Production of Element and Electric Generator

—Production of Element—

An element illustrated in FIG. 26 was produced in the following manner.

Electrode 21: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto a fluororesin sheet (Skived tape, available from CHUOH CHEMICAL INDUSTRIES, LTD., thickness: 100 µm), followed by heating for 10 minutes at 100° C. to cure the silicone resin composition, to thereby form a square electrode 21 having a size of 70 mm×70 mm, and a thickness of 100 µm.

Intermediate layer 3: Silicone rubber (IVS4312, available from Momentive Performance Materials Inc.) was applied onto the electrode 21, followed by heating for 10 minutes at 100° C. to cure the silicone rubber, to thereby form a square intermediate layer 3 having a size of 70 mm×70 mm, and a thickness of 200 μm. A surface treatment was not performed on the intermediate layer 3.

Electrode 22: A silicone rubber composition containing 100 parts by mass of silicone rubber (KE-1603, available from Shin-Etsu Chemical Co., Ltd.) and 5 parts by mass of carbon nanotubes (773840, available from Sigma-Aldrich Co.) was applied onto the intermediate layer 3, followed by heating for 30 minutes at 120° C. to cure the silicone rubber composition, to thereby form a square electrode 22 having a size of 70 mm×70 mm, and a thickness of 100 μm.

Thereafter, the fluororesin sheet was peeled.

As described above, an element of Comparative Example 2 composed of an integrated body of from the electrode 21 through the electrode 22 was produced.

—Production of Electric Generator—

Lead wires, cover materials, and an oscilloscope were attached to the obtained element in the same manner as in Example 1, to thereby produce an electric generator of Comparative Example 2.

<Evaluation of Power-Generating Performance>

A power-generating performance of the produced electric generator of Comparative Example 2 was evaluated in the same manner as in Example 1. A result is presented in Tables 1-11-1 and 1-11-2.

TABLE 1-1-1

| | Element | | Constitutional members | | | |
|---|---|---|---|---|---|---|
| | Structure | Layout | Member | Material | Thickness | Surface modification treatment |
| Ex. 1 | FIG. 1A | FIG. 2A | Electrode 11 | Carbon nanotube-containing silicone rubber | 100 μm | NA |
| | | | Electrode 12 | Carbon nanotube-containing silicone rubber | 50 μm | NA |
| | | | Electrode 21 | Carbon nanotube-containing silicone rubber | 100 μm | NA |
| | | | Intermediate layer 2 | Silicone rubber | 100 μm | Corona discharge |
| | | | Intermediate layer 3 | Silicone rubber | 200 μm | Corona discharge |

TABLE 1-1-2

| | Electric generator | | Power-generating performance | | |
|---|---|---|---|---|---|
| | | | Voltage magnification | | |
| | Structure | Wiring | 1st | 500th | Rank |
| Ex. 1 | FIG. 19 | FIG. 22B | 12 | 9 | C |

TABLE 1-2-1

| | Element | | Constitutional members | | | |
|---|---|---|---|---|---|---|
| | Structure | Layout | Member | Material | Thickness | Surface modification treatment |
| Ex. 2 | FIG. 3A | FIG. 4A | Electrode 11 | Carbon nanotube-containing silicone rubber | 100 μm | NA |
| | | | Electrode 12 | Carbon nanotube-containing silicone rubber | 100 μm | NA |
| | | | Electrode 21 | Carbon nanotube-containing silicone rubber | 100 μm | NA |
| | | | Intermediate layer 2 | Silicone rubber | 100 μm | Corona discharge |
| | | | Intermediate layer 3 | Silicone rubber | 100 μm | Corona discharge |

TABLE 1-2-2

| | | Power-generating performance | | |
|---|---|---|---|---|
| Electric generator | | Voltage magnification | | |
| Structure | Wiring | 1st | 500th | Rank |
| Ex. 2 FIG. 19 | FIG. 22B | 12 | 11 | B |

TABLE 1-3-1

| Element | | Constitutional members | | | |
|---|---|---|---|---|---|
| Structure | Layout | Member | Material | Thickness | Surface modification treatment |
| Ex. 3 FIG. 6A | FIG. 7A | Electrode 11 | Carbon nanotube-containing silicone rubber | 100 μm | NA |
| | | Electrode 12 | Carbon nanotube-containing silicone rubber | 100 μm | NA |
| | | Electrode 13 | Carbon nanotube-containing silicone rubber | 100 μm | NA |
| | | Electrode 21 | Aluminium | 130 μm | NA |
| | | Electrode 22 | Aluminium | 130 μm | NA |
| | | Intermediate layer 2 | Silicone rubber | 100 μm | Corona discharge |
| | | Intermediate layer 3 | Silicone rubber | 100 μm | Corona discharge |
| | | Intermediate layer 4 | Barium titanate-containing silicone rubber | 50 μm | Electron beam irradiation |
| | | Supporting member 31 | Acrylic rubber | 50 μm | NA |
| | | Supporting member 33 | PET film | 100 μm | NA |

TABLE 1-3-2

| | | Power-generating performance | | |
|---|---|---|---|---|
| Electric generator | | Voltage magnification | | |
| Structure | Wiring | 1st | 500th | Rank |
| Ex. 3 FIG. 19 | FIG. 22B | 16 | 15 | A |

TABLE 1-4-1

| Element | | Constitutional members | | | |
|---|---|---|---|---|---|
| Structure | Layout | Member | Material | Thickness | Surface modification treatment |
| Ex. 4 FIG. 11 | FIG. 9E | Electrode 11 | Carbon nanotube-containing silicone rubber | 50 μm | NA |
| | | Electrode 12 | Carbon nanotube-containing silicone rubber (nickel) | 50 μm (50 μm) | NA |
| | | Electrode 13 | Carbon nanotube-containing silicone rubber | 50 μm | NA |
| | | Electrode 21 | Aluminium | 130 μm | NA |
| | | Electrode 22 | Aluminium | 130 μm | NA |

TABLE 1-4-1-continued

| Structure | Layout | Member | Material | Thickness | Surface modification treatment |
|---|---|---|---|---|---|
| | | Electrode 23 | Nickel | 50 μm | NA |
| | | Intermediate layer 2 | Silicone rubber | 50 μm | Plasma |
| | | Intermediate layer 3 | Barium titanate-containing silicone rubber | 200 μm | Plasma |
| | | Intermediate layer 4 | Barium titanate-containing silicone rubber | 50 μm | Electron beam irradiation |
| | | Intermediate layer 5 | Barium titanate-containing silicone rubber | 200 μm | Plasma |
| | | Supporting member 31 | Acrylic rubber | 50 μm | NA |
| | | Supporting member 32 | EPDAM rubber | 200 μm | NA |
| | | Supporting member 33 | PET film | 100 μm | NA |

TABLE 1-4-2

| Electric generator | | Power-generating performance | | |
|---|---|---|---|---|
| | | Voltage magnification | | |
| Structure | Wiring | 1st | 500th | Rank |
| Ex. 4 | FIG. 19 | FIG. 22B | 18 | 17 | A |

TABLE 1-5-1

| Structure | Layout | Member | Material | Thickness | Surface modification treatment |
|---|---|---|---|---|---|
| Ex. 5 | FIG. 13A | FIG. 14A | Electrode 11 | Carbon nanotube-containing silicone rubber | 50 μm | NA |
| | | Electrode 12 | Carbon nanotube-containing silicone rubber | 50 μm | NA |
| | | Electrode 25 | Phosphor bronze (copper) | 100 μm (50 μm) | NA |
| | | Intermediate layer 2 | Silicone rubber | 50 μm | Corona discharge |
| | | Intermediate layer 3 | Barium titanate-containing silicone rubber | 100 μm | Corona discharge |
| | | Intermediate layer 4 | Barium titanate-containing silicone rubber | 100 μm | Electron beam irradiation |

TABLE 1-5-2

| Electric generator | | Power-generating performance | | |
|---|---|---|---|---|
| | | Voltage magnification | | |
| Structure | Wiring | 1st | 500th | Rank |
| Ex. 5 | FIG. 19 | FIG. 22B | 14 | 12 | B |

TABLE 1-6-1

| | Element | | Constitutional members | | | Surface modification treatment |
|---|---|---|---|---|---|---|
| | Structure | Layout | Member | Material | Thickness | |
| Ex. 6 | FIG. 12 | FIG. 9G | Electrode 11 | Carbon nanotube-containing silicone rubber | 50 μm | NA |
| | | | Electrode 12 | Copper | 70 μm (50 μm) | NA |
| | | | Electrode 13 | Aluminium | 85 μm | NA |
| | | | Electrode 22 | Aluminium | 130 μm | NA |
| | | | Electrode 23 | Nickel | 50 μm | NA |
| | | | Intermediate layer 2 | Silsesquioxane-containing silicone rubber | 50 μm | No treatment |
| | | | Intermediate layer 4 | Barium titanate-containing silicone rubber | 100 μm | No treatment |
| | | | Intermediate layer 5 | Barium titanate-containing silicone rubber | 200 μm | No treatment |
| | | | Supporting member 31 | Polycarbonate | 2 mm | NA |
| | | | Supporting member 32 | EPDAM rubber | 200 μm | NA |
| | | | Supporting member 33 | Polycarbonate | 3 mm | NA |
| | | | Coil spring 35 | Stainless steel | 8 mm | NA |

TABLE 1-6-2

| | Electric generator | | Power-generating performance | | |
|---|---|---|---|---|---|
| | | | Voltage magnification | | |
| | Structure | Wiring | 1st | 500th | Rank |
| Ex. 6 | FIG. 19 | FIG. 22B | 10 | 9 | C |

TABLE 1-7-1

| | Element | | Constitutional members | | | Surface modification treatment |
|---|---|---|---|---|---|---|
| | Structure | Layout | Member | Material | Thickness | |
| Ex. 7 | FIG. 1A | FIG. 2A | Electrode 11 | Carbon nanotube-containing silicone rubber | 100 μm | NA |
| | | | Electrode 12 | Carbon nanotube-containing silicone rubber | 50 μm | NA |
| | | | Electrode 21 | Carbon nanotube-containing silicone rubber | 100 μm | NA |
| | | | Intermediate layer 2 | Acrylic rubber | 100 μm | No treatment |
| | | | Intermediate layer 3 | Silicone rubber | 200 μm | Corona discharge |

TABLE 1-7-2

| | Electric generator | | Power-generating performance | | |
|---|---|---|---|---|---|
| | | | Voltage magnification | | |
| | Structure | Wiring | 1st | 500th | Rank |
| Ex. 7 | FIG. 19 | FIG. 22B | 5 | 3 | D |

TABLE 1-8-1

| | Element | | Constitutional members | | | |
|---|---|---|---|---|---|---|
| | Structure | Layout | Member | Material | Thickness | Surface modification treatment |
| Ex. 8 | FIG. 1A | FIG. 2A | Electrode 11 | Carbon nanotube-containing silicone rubber | 100 μm | NA |
| | | | Electrode 12 | Carbon nanotube-containing silicone rubber | 50 μm | NA |
| | | | Electrode 21 | Carbon nanotube-containing silicone rubber | 100 μm | NA |
| | | | Intermediate layer 2 | Silicone rubber | 100 μm | Corona discharge |
| | | | Intermediate layer 3 | Acrylic rubber | 200 μm | No treatment |

TABLE 1-8-2

| | Electric generator | | Power-generating performance | | |
|---|---|---|---|---|---|
| | | | Voltage magnification | | |
| | Structure | Wiring | 1st | 500th | Rank |
| Ex. 8 | FIG. 19 | FIG. 22B | 5 | 3 | D |

TABLE 1-9-1

| | Element | | Constitutional members | | | |
|---|---|---|---|---|---|---|
| | Structure | Layout | Member | Material | Thickness | Surface modification treatment |
| Ex. 9 | FIG. 16 | FIG. 17A | Electrode 11 | Carbon nanotube-containing silicone rubber | 100 μm | NA |
| | | | Electrode 12 | Carbon nanotube-containing silicone rubber | 100 μm | NA |
| | | | Electrode 25 | Phosphor bronze (copper) | 100 μm (50 μm) | NA |
| | | | Electrode 26 | Phosphor bronze (copper) | 100 μm (50 μm) | NA |
| | | | Intermediate layer 2 | Silicone rubber | 100 μm | Electron beam irradiation |
| | | | Intermediate layer 4 | Barium titanate-containing silicone rubber | 100 μm | Electron beam irradiation |
| | | | Supporting member 31 | Acrylic rubber | 50 μm | NA |

TABLE 1-9-2

| Electric generator | | Power-generating performance | | |
|---|---|---|---|---|
| | | Voltage magnification | | |
| Structure | Wiring | 1st | 500th | Rank |
| Ex. 9 FIG. 19 | FIG. 22B | 16 | 16 | A |

TABLE 1-10-1

| Element | | Constitutional members | | | |
|---|---|---|---|---|---|
| Structure | Layout | Member | Material | Thickness | Surface modification treatment |
| Comp. Ex. 1 FIG. 26 | NA | Electrode 21 | Silver | 6 μm | NA |
| | | Electrode 22 | Silver | 6 μm | NA |
| | | Intermediate layer 3 | PVDF piezo film | 110 μm | NA |

TABLE 1-10-2

| Electric generator | | Power-generating performance | | |
|---|---|---|---|---|
| | | Voltage magnification | | |
| Structure | Wiring | 1st | 500th | Rank |
| Comp. Ex. 1 FIG. 19 | FIG. 22B | 1 | 0.5 | Standard |

TABLE 1-11-1

| Element | | Constitutional members | | | |
|---|---|---|---|---|---|
| Structure | Layout | Member | Material | Thickness | Surface modification treatment |
| Comp. Ex. 2 FIG. 26 | NA | Electrode 21 | Carbon nanotube-containing silicone rubber | 100 μm | NA |
| | | Electrode 22 | Carbon nanotube-containing silicone rubber | 100 μm | NA |
| | | Intermediate layer 3 | Silicone rubber | 200 μm | No treatment |

TABLE 1-11-2

| Electric generator | | Power-generating performance | | |
|---|---|---|---|---|
| | | Voltage magnification | | |
| Structure | Wiring | 1st | 500th | Rank |
| Comp. Ex. 2 FIG. 19 | FIG. 22B | 1.5 | 1.5 | E |

It was found from the results depicted in Tables 1-1-1 to 1-11-2 that the elements and electric generators of Examples 1 to 6 and Example 9 had high power-generating performances and excellent stability to repetitive use, compared to the elements and electric generators of Comparative Examples 1 and 2.

In Examples 7 and 8, the rank of the power-generating performance was D, but the magnification factor of the voltage for the first time was 5 times, and the magnification factor of the voltage for the 500$^{th}$ time was 3 times. Therefore, it was found that the elements and electric generators of Examples 7 and 8 had excellent power-generating performances and excellent stability to repetitive use, compared to the elements and electric generators of Comparative Examples 1 and 2.

Figure 27:
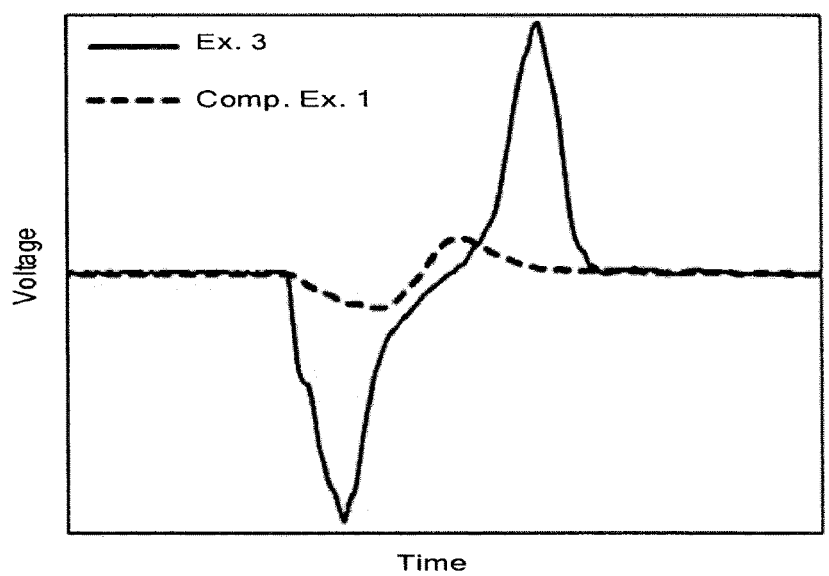
FIG. 27 is a graph depicting generated voltage of the electric generator of the present invention and generated voltage of an electric generator of Comparative Example.

Moreover, FIG. 27 depicts wave shapes of generated voltage of the electric generators of Example 3 and Comparative Example 1. It was found from the results depicted in FIG. 27 that the element and electric generator of Example 3 had the longer duration of power generation, and had high power-generating performances, compared to the element and electric generator of Comparative Example 1.

Aspects of the present invention are, for example, as follows.

<1> An element including:

a plurality of electrodes; and a plurality of intermediate layers, each of the plurality of intermediate layers being sandwiched between any pair of the plurality of electrodes, wherein the intermediate layers include at least two selected from the group consisting of:

(i) an intermediate layer that can be elongated and deformed in a direction that is not parallel to a direction in which an external force is applied, when the external force is applied to the intermediate layer;

(ii) an intermediate layer that can be compressed and deformed in a direction that is parallel to a direction in which an external force is applied, when the external force is applied to the intermediate layer; and (iii) an intermediate layer that can be elongated and deformed in a direction that is not parallel to a direction in which an external force is applied, and can be compressed and deformed in a direction that is parallel to the direction in which the external force is applied, when the external force is applied to the intermediate layer.

<2> The element according to <1>, wherein each of the plurality of intermediate layers has elasticity.

<3> The element according to <1> or <2>, wherein at least one of the intermediate layer of the (i) and the intermediate layer of the (iii) can be elongated and deformed in an oblique direction relative to the direction in which the external force is applied.

<4> The element according to <3>, wherein the intermediate layer that can be elongated and deformed in the oblique direction forms an angle with the direction in which the external force is applied, where the angle is 2 degrees or greater but smaller than 88 degrees, or 92 degrees or greater but 178 degrees or smaller.

<5> The element according to <4>, wherein the intermediate layer that can be elongated and deformed in the oblique direction forms an angle with the direction in which the external force is applied, where the angle is 5 degrees or greater but 85 degrees or smaller, or 95 degrees or greater but 175 degrees or smaller.

<6> The element according to <1> or <2>, wherein at least one of the intermediate layer of the (i) and the intermediate layer of the (iii) can be elongated and deformed in a vertical direction relative to the direction in which the external force is applied.

<7> The element according to <6>, wherein the intermediate layer that can be elongated and deformed in the vertical direction forms an angle with the direction in which the external force is applied, where the angle is 88 degrees or greater but smaller than 92 degrees.

<8> The element according to <1> or <2>, wherein the intermediate layer that can be compressed and deformed can be compressed and deformed in a direction that forms an angle of 0 degrees or greater but smaller than 2 degrees with the direction in which the external force is applied.

<9> The element according to any one of <1> to <8>, wherein the direction in which the external force is applied to the intermediate layer is a vertical direction relative to a surface of the intermediate layer.

<10> The element according to any one of <1> to <9>, wherein each of the plurality of intermediate layers includes a silicone composition containing silicone rubber.

<11> The element according to <10>, wherein the silicone rubber composition contains filler.

<12> The element according to any one of <1> to <10>, wherein each of the plurality of intermediate layers is subjected to a surface modification treatment.

<13> The element according to <12>, wherein the surface modification treatment is a plasma treatment, a corona discharge treatment, or an electron beam irradiation treatment.

<14> The element according to any one of <1> to <13>, wherein at least one of the plurality of electrodes has flexibility.

<15> The element according to <14>, wherein each of the plurality of electrodes includes a conductive rubber composition.

<16> The element according to <14> or <15>, wherein each of the plurality of electrodes includes a carbon nanotube-containing silicone rubber composition.

<17> The element according to any one of <1> to <16>, wherein a space is disposed between each of the plurality of intermediate layers and at least one of the pair of the electrodes sandwiching the intermediate layer.

<18> The element according to any one of <1> to <17>, further including a supporting member.

<19> The element according to <18>, wherein the supporting member has flexibility.

<20> An electric generator including the element according to any one of <1> to <19>.

<21> The electric generator according to <20>, wherein the electric generator is used for at least one of footwear, flooring materials, and wearing products.

The element according to any one of <1> to <19> and the electric generator according to <20> or <21> solve the aforementioned various problems in the art, and achieve the object of the present invention.

What is claimed is:

1. An element, comprising:
   a plurality of electrodes; and
   a plurality of intermediate layers, each of the plurality of intermediate layers being sandwiched between any pair of the plurality of electrodes,
   wherein the plurality of intermediate layers comprise at least two selected from the group consisting of:
   (i) a first intermediate layer that can be elongated and deformed in a direction that is not parallel to a direction in which an external force is applied, when the external force is applied to the first intermediate layer;
   (ii) a second intermediate layer that can be compressed and deformed in a direction that is parallel to a direction in which an external force is applied, when the external force is applied to the second intermediate layer; and
   (iii) a third intermediate layer that can be elongated and deformed in a direction that is not parallel to a direction in which an external force is applied, and can be compressed and deformed in a direction that is parallel to the direction in which the external force is applied, when the external force is applied to the third intermediate layer.

2. The element according to claim 1, wherein each of the plurality of intermediate layers has elasticity.

3. The element according to claim 1, wherein at least one of the first intermediate layer and the third intermediate layer can be elongated and deformed in an oblique direction relative to the direction in which the external force is applied.

4. The element according to claim 1, wherein at least one of the first intermediate layer and the third intermediate layer can be elongated and deformed in a vertical direction relative to the direction in which the external force is applied.

5. The element according to claim 1, wherein each of the plurality of the intermediate layers comprises a silicone rubber composition containing silicone rubber.

6. The element according to claim 1, wherein each of the plurality of intermediate layers is subjected to a surface modification treatment.

7. The element according to claim 1, wherein at least one of the plurality of electrodes has flexibility.

8. The element according to claim 1, wherein a space is disposed between each of the plurality of intermediate layers and at least one of the pair of the electrodes sandwiching the plurality intermediate layers.

9. The element according to claim 1, further comprising:
a supporting member.

10. An electric generator, comprising an element, which comprises:
a plurality of electrodes; and
a plurality of intermediate layers, each of the plurality of intermediate layers being sandwiched between any pair of the plurality of electrodes,
wherein the plurality of intermediate layers comprise at least two selected from the group consisting of:
(i) a first intermediate layer that can be elongated and deformed in a direction that is not parallel to a direction in which an external force is applied, when the external force is applied to the first intermediate layer;
(ii) a second intermediate layer that can be compressed and deformed in a direction that is parallel to a direction in which an external force is applied, when the external force is applied to the second intermediate layer; and
(iii) a third intermediate layer that can be elongated and deformed in a direction that is not parallel to a direction in which an external force is applied, and can be compressed and deformed in a direction that is parallel to the direction in which the external force is applied, when the external force is applied to the third intermediate layer.

11. The electric generator according to claim 10, wherein the electric generator is adapted to function as an electric generator for at least one of footwear, a flooring material and a wearing product.

\* \* \* \* \*